United States Patent [19]

Kinoshita et al.

[11] Patent Number: 5,534,073
[45] Date of Patent: Jul. 9, 1996

[54] SEMICONDUCTOR PRODUCING APPARATUS COMPRISING WAFER VACUUM CHUCKING DEVICE

[75] Inventors: Yoshimi Kinoshita; Tomoyuki Kanda; Katsuhisa Kitano; Kazuo Yoshida; Hiroshi Ohnishi; Kenichiro Yamanishi, all of Amagasaki; Shigeo Sasaki; Hideki Komori, both of Tokyo; Taizo Eshima, Fukuoka; Kouichirou Tsutahara, Itami; Toshihiko Noguchi, Fukuoka; Toru Takahama, Amagasaki; Yoshihiko Kusakabe, Amagasaki; Takeshi Iwamoto, Amagasaki; Nobuyuki Kosaka, Amagasaki, all of Japan

[73] Assignee: Mitsubishi Denki Kabushiki Kaisha, Tokyo, Japan

[21] Appl. No.: 116,968

[22] Filed: Sep. 7, 1993

[30] Foreign Application Priority Data

Sep. 7, 1992 [JP] Japan .................................. 4-238313
Dec. 25, 1992 [JP] Japan .................................. 4-346456
Aug. 9, 1993 [JP] Japan .................................. 5-197561

[51] Int. Cl.$^6$ .......................... C23C 16/00; B25B 11/00; B23B 5/22; B23B 31/30
[52] U.S. Cl. .......................... 118/728; 118/725; 118/732; 269/21; 279/3
[58] Field of Search .......................... 269/21; 118/725, 118/728, 732; 250/453.11; 279/3

[56] References Cited

U.S. PATENT DOCUMENTS

| 4,131,267 | 12/1978 | Ono et al. ........................... 269/21 |
| 4,183,545 | 1/1980 | Daly ................................. 269/21 |
| 4,403,567 | 9/1983 | daCosta et al. ..................... 118/732 |
| 4,542,298 | 9/1985 | Holden . |
| 4,869,481 | 9/1989 | Yabu et al. ......................... 269/21 |
| 5,180,000 | 1/1993 | Wagner et al. ..................... 118/725 |
| 5,191,218 | 3/1993 | Mori et al. ......................... 279/3 |
| 5,324,012 | 6/1994 | Aoyama et al. .................... 269/21 |

FOREIGN PATENT DOCUMENTS

| 60-127935 | 7/1985 | Japan ................................. 269/21 |
| 63-213672 | 9/1988 | Japan . |
| 3-38029 | 2/1991 | Japan . |
| 5-3161 | 1/1993 | Japan . |

Primary Examiner—George Fourson
Assistant Examiner—Brian K. Dutton
Attorney, Agent, or Firm—Oblon, Spivak, McClelland, Maier & Neustadt

[57] ABSTRACT

It is an object of the present invention to obtain a vacuum chucking which can vacuum suck a wafer even if dusts attach thereon. The main body of vacuum chuck (101) has a plurality of block grooves (125) on the surface on which the wafer (1) is sucked and fixed, in which vacuum evacuation paths (105) each for vacuum evacuating each block groove (125) are provided for each block groove (125). When the wafer(1) is sucked and fixed under low pressure, even if the degree of vacuum in one of the block grooves (125) decreases due to attachment of dusts on part of the suction surface, or the like, the wafer (1) can surely be sucked and held.

9 Claims, 41 Drawing Sheets

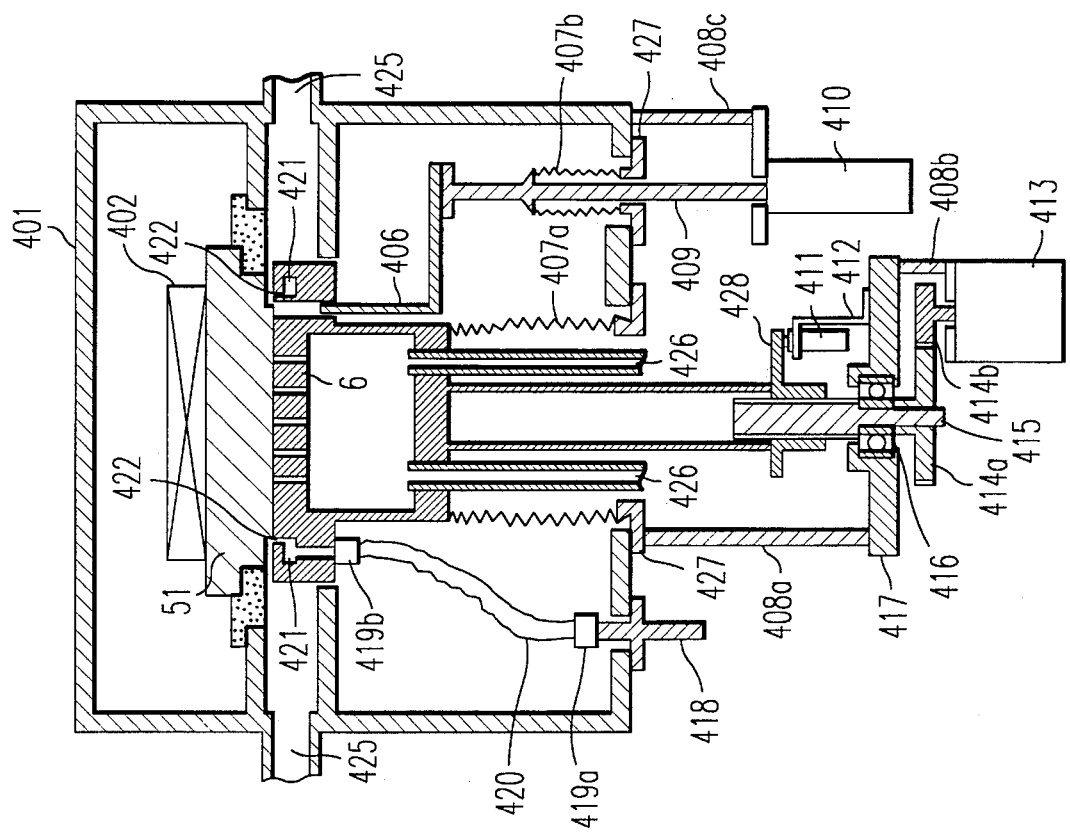
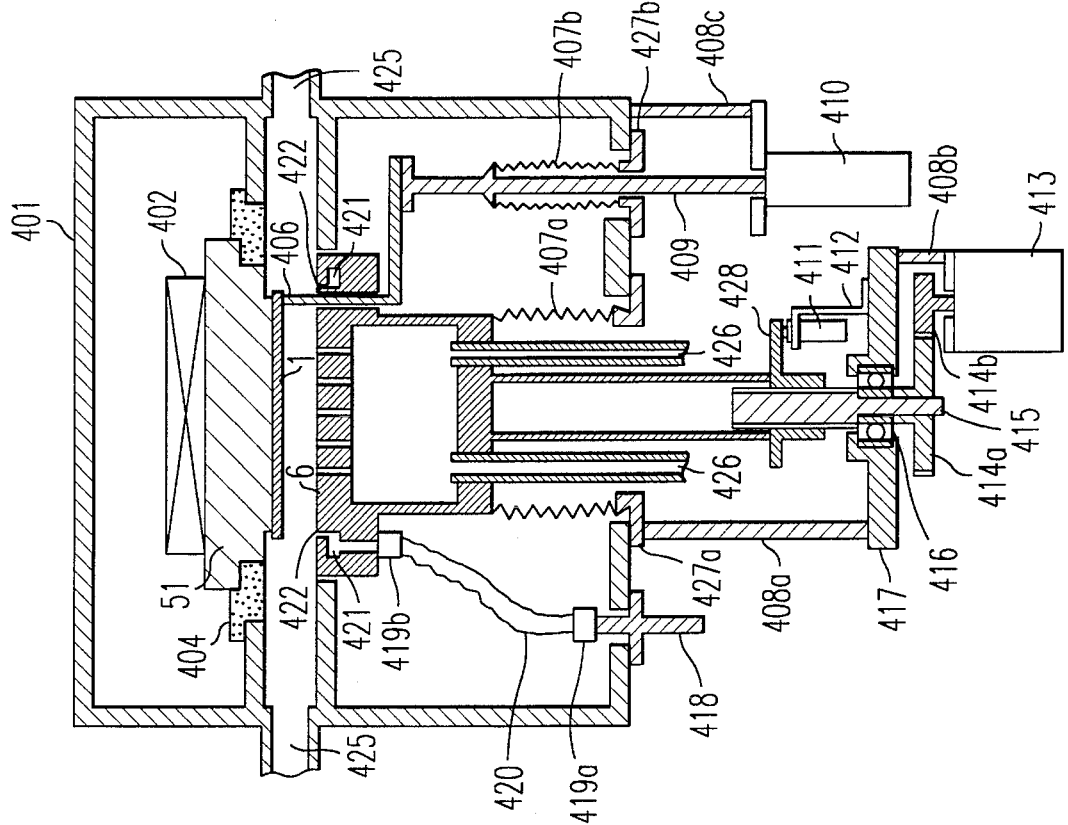

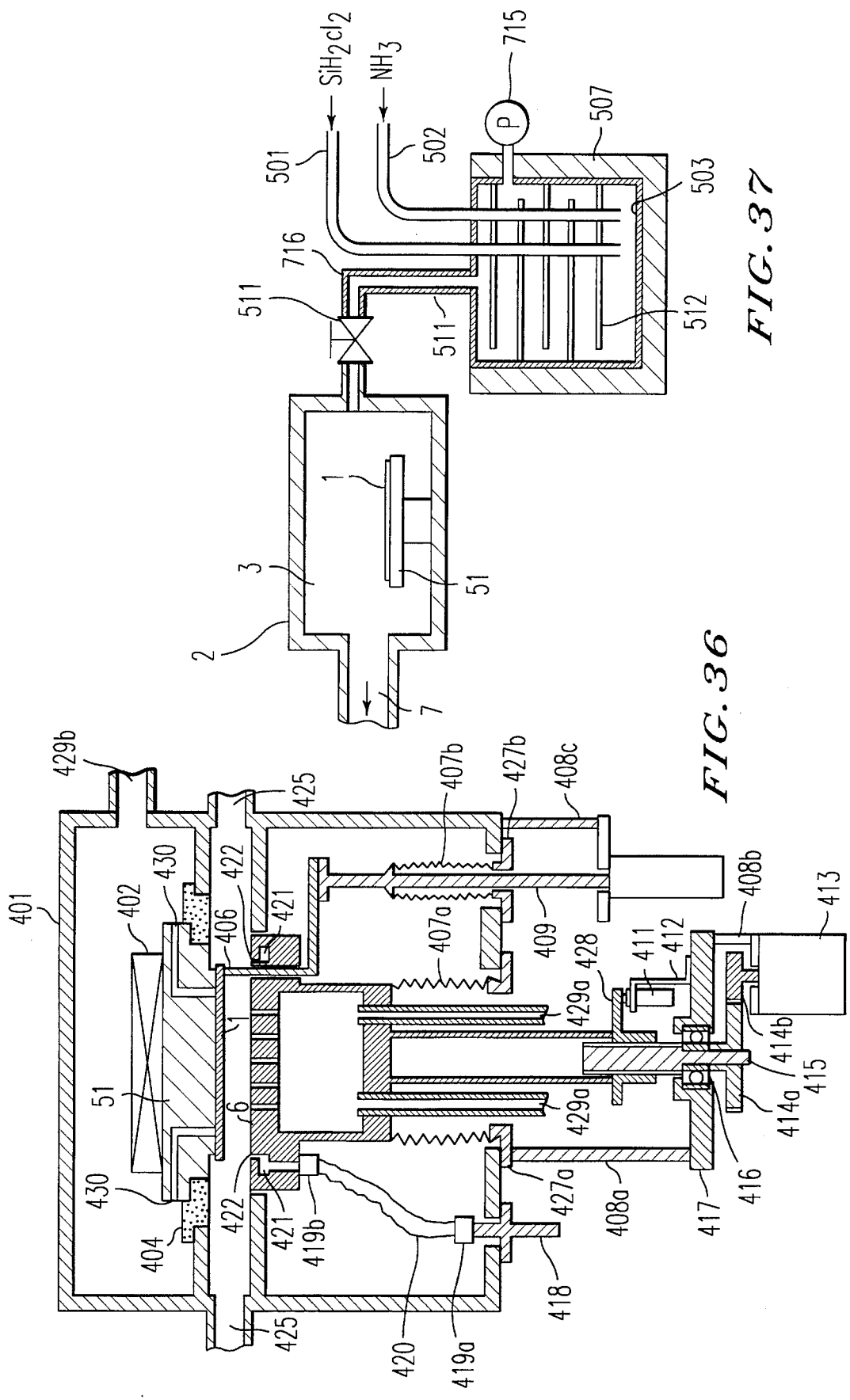

RELATION BETWEEN SATURATED VAPOR PRESSURE
AND TEMPERATURE OF $NH_4Cl$ 5,534,073

SEMICONDUCTOR PRODUCING APPARATUS COMPRISING WAFER VACUUM CHUCKING DEVICE

BACKGROUND OF THE INVENTION

1. Field of the Invention

The present invention relates to a semiconductor producing apparatus for forming thin films on wafer surfaces using reaction gasses, and also to a wafer vacuum chucking device, a gas cleaning method or a method of forming various kinds of nitride films in such semiconductor producing apparatus. The semiconductor producing apparatus of the present invention is most effectively used with the Low Pressure CVD (Chemical Vapor Deposition) devices, but also can be used with other types of semiconductor producing devices for forming thin films, processings and the like.

2. Description of the Background Art

A conventional semiconductor producing apparatus, and a wafer vacuum chucking device, a gas cleaning method and a nitride film forming method in the semiconductor producing apparatus will be respectively described below.

First, FIG. 54 is a top view showing the structure of a conventional wafer vacuum chucking device described in Japanese Patent Laying-Open No. 2-67745, for example, and FIG. 55 is a sectional view taken along the VI—VI line in FIG. 54. In FIG. 54, 101 denote a vacuum chuck main body, 1 denotes a wafer to be sucked and fixed (hereinafter, the term "wafer" implies a semiconductor wafer except extra notation), and 103 denotes a vacuum suction groove formed on a wafer suction surface and communicating as one groove in the suction surface, 104 denotes a vacuum evacuation hole formed at the center of the suction surface, and 105 denotes a vacuum evacuation path opening to the vacuum evacuation hold 104 and passing through the chuck main body 101, which is connected to a vacuum pump not shown through a vacuum pipe 106.

In such a conventional wafer vacuum chucking device formed as described above, the wafer 1 is provided on the suction surface of the chuck main body 101 and evacuation in the vacuum evacuation groove 103 is started through the vacuum pipe 106, the vacuum evacuation path 105 and the vacuum evacuation hole 104, then a differential pressure is caused between the pressure inside the vacuum evacuation groove 103 and the external pressure, and the wafer 1 is sucked and fixed on the suction surface with the differential pressure.

Next, FIGS. 56 and 57 are diagrams showing a semiconductor producing apparatus (so called, the batch processing type) implementing the method of forming silicon nitride films described in Japanese Patent Publication No. 60-10108, for example. In FIGS. 56 and 57, 2 denotes a tube-shaped reaction chamber, 4 denotes a wafer heating source, and 501 and 502 denote reaction gas supplying lines.

In the thin film forming method using the apparatus, a plurality of wafers 1 to be processed are arranged and held in the tube-shaped reaction chamber 2, and dichlorosilane ($SiH_2Cl_2$) and ammonia ($NH_3$) are caused to flow from the reaction gas supplying lines 501 and 502 under low pressure to deposit silicon nitride films, where the deposition temperature used is in the range of 650°–800° C.

In the above-described method, in order to surely keep the uniformity of film thickness of the plurality of wafers 1, the temperature distribution in the tube-shaped reaction chamber 2 is controlled so that the temperature of the wafers 1 increases from the upper stream to the lower stream of the gas to compensate for a decrease in the deposition rate due to consumption of the reaction gas. Also, in order to surely keep the uniformity of film thickness in the surface of wafer 1, the pressure in the reaction chamber 2 is kept low, that is, about 0.5 Torr.

Next, FIG. 59 shows a semiconductor producing apparatus described in the Japanese Patent Laying-Open No. 54-160172, the Japanese Patent Laying-Open No. 3-291381 and the like, for example. In FIG. 59, 701 denotes a reaction container providing a cylindrical inner tube 702 therein, which forms a reaction space 3 inside thereof. 704 denotes a wafer holding board arranged in the reaction space 3, which has structure for holding a large number of semiconductor wafers 1. Heater 4 is a wafer heating source for heating the semiconductor wafers 1, which is provided around the peripheral wall of the reaction container 701.

501 denotes a reaction gas line for introducing dichlorosilane which is a material gas into the reaction space 3, and 502 is a material gas supplying line for introducing ammonia which is another reaction gas into the reaction space 3. These reaction gas supplying lines 501 and 502 are provided passing through the reaction container 701, respectively, having the upstream side where the gas flows from connected to material gas supplying sources (not shown) and the downstream side to which the gas flows opening to the lower part of the reaction chamber 2.

7 denotes a reaction exhuast pass for exhausting the gas in the reaction container 701. The reaction exhaust pass 7 has its one end opening to a space formed on the outer peripheral side of the inner tube 702 inside the reaction container 701 and the other end connected to an exhaust device not shown in the figure. The pressure in the reaction container 701 is generally reduced by exhausting the internal gas through the reaction exhaust pass 7.

In the semiconductor producing apparatus having such structure, first, the semiconductor wafers 1 are heated through the peripheral wall of the reaction container 701 by the heater 4. The temperature at this time is approximately 700° C. Subsequently, dichlorosilane and ammonia are introduced in the reaction space 3 from the separated reaction gas supplying lines 501 and 502. The two kinds of reaction gasses supplied into the reaction space 3 in this way are thermally decomposed in the vapor phase in contact with the heated semiconductor wafers 1. Then, the product produced by this reaction is deposited on the semiconductor wafers 705 to form silicon nitride films.

Next, FIG. 60 is a sectional diagram showing an outline of a conventional semiconductor device (so called the single wafer processing type) described in the Japanese Patent Laying-Open No. 3-184327, for example. In FIG. 60, 1 denotes a wafer, 2 denotes a reaction chamber for accommodating the wafer 1, 5 denotes a vacuum chuck on which the wafer 1 is provided, 204 denotes a vacuum drawing hole opening to the vacuum chuck 5, 4 denotes a wafer heating source provided in the vacuum chuck 5 for heating the wafer 1, 6 denotes a gas nozzle for supplying reaction gas into the reaction chamber 2, 3 denotes a reaction space in which the reaction is caused, and 7 denotes a reaction gas exhaust path for exhausting the gas in the reaction chamber 2 after the reaction.

For forming a thin film in such a structure, first the wafer 1 is conveyed by a conveying device (not shown) and provided on the vacuum chuck 5. Next, vacuum exhaust is performed from the vacuum drawing hole 204 opening to the vacuum chuck 5 to suck the wafer 1. The reaction gas is supplied into the reaction chamber 2 from the gas nozzle 6. At this time the wafer 1 is heated through the vacuum chuck 5 by the wafer heating source 4, so that the reaction gas is caused to react on the wafer 1 to form a thin film on the wafer 1.

Now, in such processes, the wafer 1 must be heated to a high temperature such as 600°–800° C. Also, since the quality and the growth rate of the reaction product film depend on the temperature of the wafer 1, the wafer 1 must be uniformly heated to a predetermined temperature in order to form the reaction product film with uniform quality and thickness. Furthermore, contamination to the wafer 1 and the thin film formed on the surface of the wafer 1 must be avoided.

Next, FIG. 61 is a sectional diagram showing structure of a gas seal portion of a reaction chamber in the conventional semiconductor producing apparatus (low pressure CVD apparatus) referred in the Japanese Patent Laying-Open No. 2-143526, for example. In FIG. 61, 305 denotes an o-ring, 317 denotes a process tube, 318 denotes a cap, 319 denotes a manifold, 320 denotes an inactive gas supplying hole for introducing inactive gas ($N_2$) into the gap portion between the cap 318 and the manifold 319 and the gap porion between the process tube 317, the cap 318 and the manifold 319, and 306 denotes a water cooling portion formed in the manifold 319.

In the above-described structure, the temperature in the process tube 317 is kept high, and thermal chemical reaction of the introduced reaction gas is caused on the wafer (not shown) in the process tube 317 to form thin films. At this time the o-rings 305 serve as gas seals from outside, and water is passed to the water cooling portions 306 to cool and protect the o-rings 305 to prevent degradation of the sealing function and damage due to heat. As a result, the temperature in the vicinity of the o-ring 305 decreases, but invasion of the reactive gas into the vicinity of the o-ring 305 is prevented by introducing the inactive gas into the gap portion to prevent adhesion of reaction by-product.

Next, the conventional gas cleaning method will be described referring to FIG. 62. Generally, in a semiconductor producing apparatus, thin film material deposits or attach not only on the wafers but also on wall surfaces of the apparatus and members such as a susceptor exposed in the reaction chamber, so that these are removed by causing etching gas to flow into the reaction chamber as shown in the Japanese Patent Laying-Open No. 3-41199. FIG. 62 shows the processing temperature for removing surplus deposition substances without producing undesirable effects on the carbon material forming the susceptor and the like in this gas cleaning method, where it is indicated that the temperature of 200°–300° C. is suitable.

Next, referring to FIG. 63, the structure of supplying reaction gas in the conventional semiconductor producing apparatus will be described. Conventionally, when forming a thin film for semiconductor with the single wafer processing type low pressure CVD, as shown in the Japanese Patent Laying-Open No. 3-287770, for example, a nozzle head with structure simply having a large number of through holes has been used to make the flow of reaction gas uniform to form a thin film having uniform thickness.

For example, the case in which two kinds of reaction gases are lead to a heated wafer and decomposition reaction is caused to form a film is shown in FIG. 63. In FIG. 63, 51 denotes a susceptor, 604 denotes first reaction gas, 605 denotes second reaction gas, 606 denotes a mixture gas transfer path, 6 denotes a gas nozzle, 3 denotes a reaction space and 7 denotes a reaction gas exhaust path.

In this apparatus, for example, the first reaction gas 604 and the second reaction gas 605 are led to the mixed gas transfer path 606 by means of separated pipings and sprayed toward the wafer 1 through the large number of through holes of the gas nozzle 6. The wafer 1 is provided on the susceptor 5 heated by the wafer heating source 4 and the supplied reactive gases are subjected to the decomposition reaction above the wafer 1 and then exhausted from the reaction gas exhaust path 7 and processed. The gas nozzle 6 may be provided so that the through holes face perpendicularly to the wafer 1, or may be provided inclining by 20°–45° with respect to the wafer 1 as shown in FIG. 63.

The wafer vacuum chucking device shown in FIGS. 54 and 55 utilizes the differential pressure as described above, in which it is assumed to be used under the normal atmospheric pressure, and chucking under low pressure is not considered in which the differential pressure is difficult to be obtained. Accordingly, when sucking to fix a wafer under low pressure with its processed surface being faced downwards, the degree of vacuum in the entire vacuum suction groove 103 which communicates as one in the entire suction surface decreases if the airtight condition in the vicinity of the wafer is broken due to adhesion of dust on the suction surface, cuts on the suction surface, curves of the wafers and the like, and, furthermore, since the pressure in the exterior is reduced, sufficient differential pressure can not be obtained, resulting in a problem that the wafer may drop or may not be sucked at the first stage.

Next, in the nitride film forming method using the conventional batch processing semiconductor producing apparatus described referring to FIGS. 56 and 57, or FIG. 59, there has been a problem as will be described below.

First the by-products (mainly ammonium chloride) produced in the reaction of dichlorosilane and ammonia may cause dust, resulting in a problem that the productivity of the semiconductor chips is considerably decreased.

Also, the low pressure atmosphere must have been realized with pressure lower than 1.0 Torr in the reaction chamber 2 to suppress production of the ammonium chloride, and dichlorosilane and ammonia must have been mixed in that atmosphere. Futhermore, the wall of the reaction chamber 2 must have been maintained at a high temperature (not less than 200° C.) to prevent adhesion of the ammonium chloride. That is to say, the process in forming films is limited, which causes a problem that films can not be formed with appropriate device structure under optimum process conditions.

Also, in forming capacitor films for semiconductor or the like where the capacitor capacitance is secured in a small area, the film thickness is extremely small and it is required to form films having complicated cubic shapes with uniform film thickness because the surface area of the capacitor must be secured. Futhermore, to obtain a larger number of semiconductors from a single wafer to decrease cost of the semiconductor, the diameter of the wafer is on an increase. When processing wafers with large diameter by the method described in the Japanese Patent Publication No. 60-10108 with FIGS. 56, 57 and the like, however, there is a problem that the variation in the film thickness distribution in wafer increases.

Also, in order to realize film thickness with good reproducibility, the balance between the wafer temperature and the amount of reaction gas must be controlled. In the method shown in the Japanese Patent Publication No. 60-10108 with FIGS. 56, 57, i.e., in the method using the batch processing CVD apparatus, although the temperature distribution in the tube-shaped reaction chamber 2 is controlled so that the wafer temperature increases from the upstream side to the downstream side of the gas to suppress variation of film thickness of a plurality of wafers 1, where the accuracy has a limitation. So, the number of wafers 1 processed at the same time is decreased and wafers 1 called dummy wafers are provided instead in the actual process, but it results in a problem of incurring a decrease of yield, that is, an increase in cost.

Furthermore, the properties of the underlying part in formation of the capacitor film must be accurately controlled to form extremely thin films with good reproducibility, but the method described in the Japanese Patent Publication No. 60-10108 (so called batch processing method) in which a plurality of wafers 1 are collectively processed at the same time had a problem that such control can not be made.

On the basis of such background, the CVD apparatus called the single wafer processing type (such as one described in the Japanese Patent Laying-Open No. 3-184327) described before referring to FIG. 60 has been developed there years. When using the single wafer processing CVD apparatus, however, there has been a problem that the pressure in the reaction chamber 2 must be increased to several Torr—several tens Torr from the conventional value 0.5 Torr to secure the productivity similar to the case using the conventional batch processing CVD apparatus.

The ammonium chloride produced when dichlorosilane or titanium tetrachloride and ammonia are used as reaction gases has such saturated vapor pressure characteristics as shown in FIG. 58, that the ammonium chloride is solidified and attached unless the temperature of the wall of the reaction chamber is maintained at the high temperature as described above. The temperature of the wall of about 150° C. was satisfactory with the low pressure in the reaction chamber being 0.5 Torr. However, there have been problems such as that the wall temperature must be increased to 250° C. to inhibit the solidification of ammonium chloride if the pressure in the reaction chamber is increased to value from several Torr to several tens Torr, with the result that a vacuum seal member (o-ring) made of rubber generally used to maintain the vacuum state can not be used, and that the films can not be formed under the most suitable precess conditions.

Also, since the structure of the single wafer processing CVD apparatus is more complicated than that of the batch processing CVD apparatus, it is much in need to use metal materials such as SUS. However, the metal materials generally corrode more possibly due to chlorine at high temperature, causing a problem that it is limited to expensive metal materials with high corrosion resistance such as Inconel and glass materials such as quartz.

Also, in the conventional single wafer processing semiconductor producing apparatus shown in FIG. 60, since the high temperature portion of the vacuum chuck 5 is exposed to the reaction gas, a film is attached to the high temperature portion to cause occurrence of dust. If the reaction gas is corrosive gas, the wafer heating source 4 with high temperature corrodes to cause a problem. Furthermore, since the high temperature portion heated by the wafer heating source 4 and the reaction space 3 in which the wafer 1 is provided and reaction is executed are the same, there has been a problem that the wafer 1 and the thin film formed on the wafer surface may be contaminated from the wafer heating source 4 and the high temperature portion in the vicinity thereof.

Also, the wafer holding mechanism is the vacuum chuck 5, so that a vacuum layer is formed in the space between the wafer 1 and the wafer holding mechanism to considerably increase the thermal resistance between both, with the result that the temperature of the wafer heating source 4 must be increased to heat the wafer 1 to a high temperature (600° to 800° C., for example) when forming a film. Furthermore, there has been a problem that the temperature distribution on the wafer 1 could not be made uniform if there were variations in the distribution of generation of heat by the wafer heating source 4.

Next, in the conventional semiconductor producing apparatus having the gas seal portion shown in FIG. 61, the effect of diffusion of reactive gas is large under low pressure such as several Torr as shown in the Japanese Patent Laying-Open No. 2-143526, therefore a large amount of inactive gas must be introduced to inhibit the diffusion and prevent invasion of reactive gas. Furthermore, there has been a problem that the inactive gas is introduced into the reaction chamber through a narrow gap portion in that structure, so that it will be jetted out into the reaction chamber even if a small amount of reaction by-products is attached.

Next, the conventional gas cleaning method described referring to FIG. 62 has a problem that even a surface of the susceptor on which the surplus depositions are not attached may be etched. The temperature of the susceptor generally increases to the second highest in the semiconductor producing apparatus, where that of the heater which is a heating source is the highest, and carbon coated with SiC is often used as material of the susceptor. The temperature in the apparatus is increased in cleaning to decrease the cleaning time, and it is a matter of course that the temperature of the susceptor also increases in this case. However the susceptor has some surface on which no surplus deposition is attached because they are in contact with the wafer and also has some part on which a large amount of surplus depositions are attached right in the vicinity thereof. Accordingly, there has been a problem that the surface having no surplus depositions attached thereon may be etched if the temperature is increased to 200°–300° C. or higher as described before to reduce the cleaning time.

Next, the structure of supplying reaction gas shown in FIG. 63 has a problem that, when a silicon nitride film is formed using $SiH_2Cl_2$ and $NH_3$ as reaction gases, these reaction gases produce the by-product $NH_4Cl$ (white solid substance) even if they are mixed at room temperature, with a result that a portion in which the two kinds of reactive gases are mixed, especially the outlet portion of the piping for $SiH_2Cl_2$ connected to the mixture transfer path 606 may be clogged and that foreign substances may attach on the wafer 1.

Also, if the two kinds of reaction gases are mixed and the reaction gas is supplied onto the wafer 1 through the gas nozzle 6 to form a thin film, there has been a problem in the uniformity of film thickness. For example, the data example of the film thickness distribution in 6-inch wafer surface formed with the above-described apparatus is shown in FIG. 64. In the film forming conditions, the total pressure was 30 Torr, the $SiH_2Cl_2$ flow rate/$NH_3$ flow rate diluted with $N_2$ flow were respectively 10 sccm/40 sccm diluted with 550 sccm, and the wafer surface temperature was 700° C. The data shows pattern of the film thickness distribution inclining on one side, where the film thickness on the side closer to the piping for $SiH_2Cl_2$ is especially large. This indicates a problem that the reaction gases $SiH_2Cl_2$ and $NH_3$ are not mixed uniformly enough.

SUMMARY OF THE INVENTION

In a vacuum chucking device in a semiconductor producing apparatus according to the present invention, a groove for wafer vacuum suction is provided in a block manner on a surface on which a semiconductor wafer is sucked and fixed.

According to this invention, since the grooves for wafer vacuum suction are provided in a block manner, even if the airtight state in part of the grooves is broken due to curve of the wafer, for example, a decrease in the degree of vacuum in other grooves can be suppressed and the suction state of the wafer can be maintained.

Accordingly, it has an effect that such defectiveness is prevented as dropping of the wafer.

In a vacuum chucking device in a semiconductor producing apparatus according to another aspect of the present invention, grooves for wafer vacuum suction are provided in a block manner on a surface on which a semiconductor wafer is sucked and fixed, and exhaust resistance in each groove differs.

According to this invention, since the grooves for wafer vacuum suction are provided in a block manner and exhaust resistance in each groove differs, even if the airtight state in part of the grooves is broken due to curve of the wafer, for example, a decrease of the degree of vacuum in other grooves can be suppressed by making small the exhaust resistance in a groove in which the airtight state is especially likely to be broken, and the suction state of the wafer can be maintained.

Accordingly, it has an effect that such defectiveness as dropping of the wafer can be prevented.

In a vacuum chucking device in a semiconductor producing apparatus according to another aspect of the present invention, grooves for wafer vacuum suction are provided in a block manner on a surface on which a semiconductor wafer is sucked and fixed, and one of exhaust resistance of an inner groove and exhaust resistance of an outer groove is larger than the other one.

According to this invention, since the grooves for wafer vacuum suction are provided in a block manner and one of the exhaust resistance of the inner groove and the exhaust resistance of the outer groove is larger than the other one, even if the airtight state in part of the grooves is broken due to curve of the wafer, for example, a decrease in the degree of vacuum in other grooves can be suppressed by making small the exhaust resistance in a groove in which the airtight state is especially likely to be broken, and the suction state of the wafer can be maintained.

Accordingly, it has an effect that such defectiveness as dropping of the wafer can be prevented.

Preferably, in the vacuum chucking device in the semiconductor producing apparatus according to the present invention, the groove formed in a block manner is a circumference-like groove.

According to this invention, since the grooves for wafer vacuum suction are formed in a block manner, even if the airtight state in part of grooves is broken due to curve of the wafer, for example, a decrease of the degree of vacuum in other grooves can be suppressed and the suction state of the wafer can be maintained.

Accordingly, it has an effect that such defectiveness as dropping of the wafer can be prevented.

In a vacuum chucking device in a semiconductor producing apparatus according to another aspect of the present invention, an outer groove for wafer outer portion vacuum suction and an inner groove for wafer inner portion vacuum suction are provided on a surface on which the semiconductor wafer is sucked and fixed. A first vacuum evacuation path for vacuum exhausting the outer groove, a second vacuum evacuation path for vacuum exhausting the inner groove, and a piping for exhausting the first and second vacuum evacuation paths are provided. An exhaust resistance determined by the second vacuum evacuation path and the piping and exhaust resistance determined by the first vacuum evacuation path and the piping is larger than the other one.

According to this invention, since the outer groove and the inner groove for wafer vacuum suction are independently provided and the exhaust resistances thereof are different, even if the airtight state in part of the grooves is broken due to curve of the wafer, for example, a decrease of the degree of vacuum in other grooves can be suppressed and the suction state of the wafer can be maintained by making the exhaust resistance in a groove in which the airtight state is especially likely to be broken.

Accordingly, it has an effect that such defectiveness as dropping of the wafer can be prevented.

Preferably, in the vacuum chucking device in the semiconductor producing apparatus according to the present invention, each block of the grooves are independently exhausted by separated pumps.

According to this invention, since the grooves for wafer vacuum suction are independently provided and independently exhausted, even if the airtight state in part of grooves is broken due to curve of the wafer, for example, the degree of vacuum in other grooves can be maintained and the suction state of the wafer can be surely maintained.

Accordingly, it has an effect that such defectiveness as dropping of the wafer can be prevented.

Preferably, in the vacuum chucking device in the semiconductor producing apparatus according to the present invention, each block of the grooves are exhausted in common by a single pump.

According to this invention, since the respective grooves formed independently are exhausted by a common pump, a single vacuum pump, which is expensive, is enough.

Accordingly, it has effects that such defectiveness as dropping of the wafer is prevented and that the cost of the apparatus can be decreased.

In a vacuum chucking device in a semiconductor producing apparatus according to another aspect of the present invention, vacuum evacuation holes of a vacuum chuck are provided corresponding to holes of a gas nozzle provided at a position making a pair with the vacuum chuck.

According to this invention, since the vacuum evacuation holes of the vacuum chuck are provided corresponding to the holes of the gas nozzle, the property that the film thickness in the vicinity of the hole of the gas nozzle is relatively small and the property that the film thickness in the vicinity of the vacuum evacuation hole is relatively large in the semiconductor wafer compensate for each other to improve the uniformity in the film thickness formed on the wafer.

Accordingly, it has an effect that the yield and quality of the produced semiconductors are improved.

In a semiconductor producing apparatus comprising a wafer holding mechanism for holding a semiconductor wafer in a reaction chamber and a wafer heating source for heating the semiconductor wafer, a reaction gas is supplied into the reaction chamber to form a thin film on the semiconductor wafer, and a partition member is provided for separating a heat source chamber having the wafer heating source and a reaction space in the reaction chamber.

According to this invention, since the partition member is provided between the reaction space and the heat source chamber having a high temperature portion such as the wafer heating source, diffusion of the reaction gas into the heat source chamber and metal contamination from the heat source chamber can be prevented.

Accordingly, it has an effect that the yield and quality of the produced semiconductors are improved.

Preferably, in the semiconductor producing apparatus according to the present invention, gas species can be individually changed in the heat source chamber.

According to the present invention, in the semiconductor producing apparatus, since the partition member is provided between the reaction space and the heat source chamber having a high temperature portion such as the wafer heating source, diffusion of the reaction gas into the heat source chamber and metal contamination from the heat source chamber can be prevented. Also, the kind of gas in the heat source chamber can be adjusted, so that the heat conducting effect of the gas between the wafer heating source and the partition member can be increased and decreased.

Accordingly, it has the effect that, with improvement of purity of film material and uniformity of the temperature distribution of the wafer (uniformity of the film thickness), the yield and quality of semiconductors can be improved and such disadvantage as corrosion of the heat source due to the reaction gas can be prevented.

In another aspect of the present invention, in a semiconductor producing apparatus comprising a wafer holding mechanism for holding a semiconductor wafer in a reaction chamber and a wafer heating source for heating the semiconductor wafer, a reaction gas is supplied into the reaction chamber to form a thin film on the semiconductor wafer, a partition member is provided for separating a heat source chamber having the wafer heating source and a reaction space in the reaction chamber, and an area where pressure is lower than the heat source chamber and the reaction space is provided in the partition member.

According to this invention, since a partition member is provided between the reaction space and the heat source chamber having a high temperature portion such as the wafer heating source, and besides the space where pressure is lower than both of the spaces exists, diffusion of the reaction gas into the heat source chamber and metal contamination from the high temperature portion can be prevented.

Accordingly, it has the effect that, with improvement in purity of film material, the yield and quality of semiconductors can be improved and such a disadvantage as corrosion of the heat source due to the reaction gas can be prevented.

Preferably, in the semiconductor producing apparatus according to the present invention, the pressure of the heat source chamber is variable.

According to this invention, since the partition member is provided between the reaction space and the heat source chamber having a high temperature portion such as the wafer heating source, and the space where pressure is lower than both of the spaces exists in the partition member, diffusion of the reaction gas into the heat source chamber and metal contamination from the high temperature portion can be prevented. Futhermore, since the pressure of gas in the heat source chamber can be adjusted, the thermal conductivity effect of the gas between the wafer heating source and the partition member can be increased and decreased.

Accordingly, it has the effects that, with improvement in purity of film material and uniformity of the temperature distribution of the wafers (uniformity of the film thickness), the yield and quality of semiconductors can be improved and such disadvantage as corrosion of the heat source due to the reaction gas can be prevented.

Preferably, in the semiconductor producing apparatus according to the present invention, the wafer holding mechanism is of the vacuum chuck system and exhaust of the vacuum chuck is done in common with exhaust of the low pressure area of the partition member.

According to this invention, since the partition member is provided between the reaction space and the heat source chamber having the high temperature portion such as the wafer heating source, and the space where pressure is lower than both of the spaces exists in the partition member, diffusion of the reaction gas into the heat source chamber and metal contamination from the high temperature portion can be prevented. Furthermore, since the wafer holding mechanism is of the vacuum chuck system, the wafer can be held by performing in common vacuum exhuast of the vacuum chuck system and vacuum exhaust of the space with pressure lower than the heat source chamber and the reaction space.

Accordingly, it has the effect that, with improvement in purity of film material, the yield and quality of semiconductors can be improved and the production cost of semiconductors can be reduced with simple structure of apparatus.

Preferably, in the semiconductor producing apparatus according to the present invention, the wafer holding mechanism is of the vacuum chuck system and the partition member also serves as a vacuum chuck plate.

According to this invention, since the partition member is made of the vacuum chuck plate, common use of the members can be accomplished.

Accordingly, it has an effect that the structure of the apparatus can be simple to decrease production cost of semiconductors.

Preferably, in the semiconductor producing apparatus according to the present invention, the wafer holding mechanism is of the vacuum chuck system and pressure between the vacuum chuck plate wafer surface side and the wafer is lower than in the reaction space and variable.

According to this invention, since the wafer holding mechanism is of the vacuum chuck system and the thermal conductivity effect of gas between the vacuum chuck plate and the wafer can be increased by changing the pressure between the vacuum chuck plate and the wafer, the wafer heating source can be prevented from becoming too high temperature.

Accordingly, the consumption power for heating can be reduced and the life time of the heating source can be increased.

Preferably, in the semiconductor producing apparatus according to the present invention, the partition member is made of material having high thermal conductivity.

According to this invention, since the partition member is made of material having high thermal conductivity, the uniformity in the temperature distribution in the surface of the partition member is enhanced to enhance the uniformity in the temperature distribution in the wafer surface.

Accordingly, it has an effect that semiconductors having excellent quality and uniform film thickness can be obtained.

Preferably, in the semiconductor producing apparatus according to the present invention, the partition member is made of an infrared ray transmitting material.

According to this invention, since the wafer can be directly heated with the infrared ray emitted from the wafer heating source, quick heating to a high temperature can be accomplished.

Accordingly, it has an effect that the processing time can be reduced to increase the productivity of semiconductors.

Preferably, in the semiconductor producing apparatus according to the present invention, a concave and a convex surfaces are provided in the partition member.

According to this invention, since the thermal resistance in the partition member surface can be adjusted, the uniformity in the temperature distribution in the partition member is improved to improve the uniformity in the temperature distribution in the wafer surface.

Accordingly, it has an effect that semiconductors having uniform film thickness and excellent quality can be obtained.

Preferably, in the semiconductor producing apparatus according to the present invention, the wafer heating source is a heater and the distance between the heater and the partition member is variable.

According to this invention, since the thermal resistance in the plane between the partition member and the heater which is the wafer heating source can be adjusted, and, by capturing the infrared ray emitted from the side surface of the heater, the uniformity in the temperature distribution of the partition member is improved to enhance the uniformity in the temperature distribution in the wafer surface.

Accordingly, it has an effect that semiconductors having uniform film thickness and excellent quality can be obtained.

Preferably, in the semiconductor producing apparatus according to the present invention, the partition member includes at least two separated members.

According to this invention, since the partition member includes at least two members, the uniformity in the temperature distribution in the surface of the partition member is improved to improve the uniformity in the temperature distribution in the wafer surface.

Accordingly, it has an effect that semiconductors having uniform film thickness and excellent quality can be obtained.

In a semiconductor producing apparatus according to another aspect of the present invention comprising a wafer holding mechanism for holding a semiconductor wafer in a reaction chamber and a wafer heating source for heating the semiconductor wafer, a reaction gas is supplied into the reaction chamber to form a thin film on the semiconductor wafer, a partition member is provided for separating a heat source chamber having the wafer heating source and a reaction space in the reaction chamber and at least one of the partition member or the wafer heating source can be rotatably driven.

According to this invention, the unevenness in the heat generating distribution in the circumference direction of the wafer heating source is corrected by rotating at least one of the wafer heating source and the partition member to improve the uniformity in the temperature distribution of the partition member, resulting in improvement in the uniformity of the temperature distribution in the wafer surface.

Accordingly, it has an effect that semiconductors having uniform film thickness and excellent quality can be obtained.

In a semiconductor producing apparatus according to another aspect of the present invention for forming a thin film using a reaction gas on a semiconductor wafer provided in a reaction chamber, a groove is provided over an entire inner periphery of a gas seal portion of the reaction chamber and the groove is vacuum exhausted.

According to the present invention, in the semiconductor producing apparatus, since the groove in the inner part of the gas seal portion is exhausted, the pressure in the gap portion in the upper and lower flange surfaces from the gas seal portion to the reaction chamber can be made equal to or lower than the saturated vapor pressure of the reaction by-products at the temperature which has been decreased to cool the o-ring, so that the reaction by-products can be discharged without attaching as solid substances.

Accordingly, it has an effect that such disadvantage as clogging of the gas seal porion due to the reaction by-product can be avoided.

In a semiconductor producing apparatus according to another aspect of the present invention for forming a thin film using a reaction gas on a semiconductor wafer provided in a reaction chamber, double grooves are provided over an entire inner periphery of a gas seal portion of the reaction chamber, a first one of the grooves closer to the gas seal portion is vacuum exhausted, and at the same time, and an inactive gas is introduced into the other second groove.

According to this invention, since the groove closer to the gas seal portion inside the gas seal portion is vacuum exhausted and an inactive gas is introduced into the other groove, the pressure in the gap portion in the upper and lower flange surfaces from the gas seal portion to the reaction chamber can be made equal to or lower than the saturated vapor pressure of the reaction by-products at the temperature which has been decreased to cool the o-ring and also the reaction by-products can be discharged without attaching as solid substances while suppressing the flow amount of the reaction gas flowing from the reaction chamber.

Accordingly, it has an effect that such disadvantage as clogging of the gas seal portion with the reaction by-product can be avoided with higher reliability.

Preferably, in the semiconductor producing apparatus according to the present invention, a gas readily which produces by-product is used as the reaction gas.

According to this invention, since a gas readily produces by-product such as chloric gas and ammonia gas, for example, is used as the reaction gas, the effect of discharging the reaction by-products without adhesion as solid substance is especially considerable.

Accordingly, the effect of avoiding clogging is especially considerable.

Preferably, in the semiconductor producing apparatus according to the present invention, a pump for vacuum exhausting the groove is shared as a pump for the vacuum chuck.

According to this invention, since a pump for vacuum exhausting the groove inside the gas seal portion is shared as a pump for the vacuum chuck, it has a function of discharging the reaction by-product without allowing it to attach as solid substance and the structure can be simple.

Accordingly, it has effects of avoiding clogging and simplifying the structure.

In a gas cleaning method according to the present invention in a semiconductor producing apparatus comprising a wafer holding mechanism for holding a semiconductor wafer in a reaction chamber and a gas nozzle for supplying a reaction gas into the reaction chamber, a thin film is formed on the semiconductor wafer, and a cleaning gas is flowed with a wafer contact surface of the wafer holding mechanism on which no surplus deposition is attached being covered.

According to this invention, the covering prevents contact of the cleaning gas onto the surface of the susceptor in contact with the wafer on which no surplus deposition attaches.

Accordingly, it has an effect that corrosion of susceptor in cleaning can be prevented to lengthen the life time of the apparatus.

In a gas cleaning method according to another aspect of the present invention in a semiconductor producing apparatus comprising a wafer holding mechanism for holding a semiconductor wafer in a reaction chamber and a gas nozzle for supplying a reaction gas into the reaction chamber in which a thin film is formed on the semiconductor wafer, a cleaning gas is flowed with a wafer contacting surface of the wafer holding mechanism on which surplus deposition is not attached being covered with the gas nozzle.

According to this invention, the cleaning gas is prevented from contacting the surface of the susceptor in contact with the wafer on which no surplus deposition is attached.

Accordingly, it has an effect that corrosion of the susceptor due to cleaning can be prevented to lengthen the life time of the apparatus.

Preferably, in the gas cleaning method in the semiconductor producing apparatus according to the present invention, the cleaning gas is flowed while flowing an inactive gas from at least one of the gas nozzle and the wafer holding mechanism.

According to this invention, the inactive gas can be supplied to the wafer contact surface of the susceptor on which the surplus deposition is not attached to decrease the cleaning gas concentration on the wafer contact surface of the susceptor.

Accordingly, it has an effect that corrosion of the susceptor due to cleaning can be prevented with higher reliability to lengthen the life time of the apparatus.

In a nitride film forming method according to the present invention for forming a nitride film using a reaction gas on a semiconductor wafer provided in a reaction chamber, a reaction gas containing constituent element (M) other than the nitrogen, nitrogen and hydrogen (M—N—H gas) and ammonia are used to form a nitride film.

According to this invention, the reaction gas (M—N—H gas) free of chlorine and ammonia are used. Accordingly, the temperature of the wall of the reaction chamber dose not have to be set high to suppress solidification and adhesion of the by-product such as ammonium chloride, and inexpensive metal material which is easy to be processed can be used as the material of the reaction chamber.

Accordingly, it has effects of improving quality of semiconductors and decreasing production cost.

In a nitride film forming method for forming a nitride film using a reaction gas on a semiconductor wafer provided in a reaction chamber according to another aspect of the present invention, donor gas containing chlorine (such as ligand and ammonia) are mixed in advance in a mixing chamber provided preceding the reaction chamber to produce new reaction gas (gas constituted as $MN_xH_y$) and the reaction gas is transferred to the reaction chamber, and by-product such as ammonium chloride is trapped in the mixing chamber to be prevented from being transferred to the reaction chamber.

According to this invention, the donor gas including chlorine reacts on ammonia in advance in the mixing chamber to trap the by-product in the mixing chamber, and reaction gas (gas constituted as $MN_xH_y$) is produced to be transferred into the reaction chamber. Therefore, the partial pressure of the by-product in the reaction chamber is suppressed extremely low, so that the temperature of the wall of the reaction chamber dose not have to be set high to suppress solidification and adhesion of the by-product, and inexpensive metal material which is easy to be processed can be used as the material of the reaction chamber.

Accordingly, it has effects of improving quality of semiconductors and decreasing production cost.

Preferably, in the nitride film forming method according to the present invention, temperature in the mixing chamber is set to a predetermined temperature T1 not lower than 30° C. and not higher than 180° C.

According to this invention, since the temperatures in the mixing chamber and the reaction chamber are set to a predetermined temperature T1 not lower than 30° C. and not higher than 180° C., Si—N—H compound which is stable in the form of gas is produced in the mixing chamber, and the reproducibility of the film thickness of the formed film is improved.

Accordingly, it has an effect that further improvement in the quality of semiconductors can be accomplished.

Preferably, in the nitride film forming method according to the present invention, when pressure P2 in the reaction chamber is at 20 Torr or lower, pressure P1 in the mixing chamber is set to P1>20 Torr regardless of the pressure P2 in the reaction chamber.

According to this invention, since a pressure adjusting valve is provided between the mixing chamber and the reaction chamber to independently control the pressure in the mixing chamber and the reaction chamber, and, when pressure in the reaction chamber P2 is at 20 Torr or lower, pressure P1 in the mixing chamber is set to P1>20 Torr regardless of the pressure P2 in the reaction chamber, even if the processing pressure P2 in the reaction chamber 2 is low, a lot of gas collision can be caused in the mixing chamber to enable sufficient production of Si—N—H compound. Accordingly, if the pressure in the reaction chamber is relatively low, SiN film formation can be accomplished with stable film thickness and the like.

Accordingly, it has an effect that further improvement in the quality of semiconductors can be accomplished.

Preferably, in the nitride film forming method according to the present invention, the temperature in the mixing chamber is set to the T1, and a wall surface in contact with gas from the mixing chamber to a trap chamber is maintained at a temperature not lower than the T1.

According to this invention, since the trap chamber having the gas contact wall surface in which the temperature is adjusted to 30° C. or lower is provided following the reaction chamber, the temperature in the mixing chamber is set to the T1, and the wall surface in contact with gas from the mixing chamber to the trap chamber is maintained at a temperature not lower than the T1, by-products which were not trapped in the mixing chamber do not solidify in the reaction chamber and are collected in the trap chamber provide in the rear of the reaction chamber.

Accordingly, it has an effect of further improving the quality of the formed thin films resulting in further quality improvement of the semiconductors.

Preferably, in the nitride film forming method according to the present invention, the mixing chamber includes two chambers and a temperature in one of the two chambers on the gas introducing side set to a temperature T3 which is 200° C. or higher.

According to this invention, since the mixing chamber includes two chambers and a temperature on the gas introducing side is set to a temperature T3 which is 200° C. or higher, new reaction gas is sufficiently produced in one chamber on the gas introduction side of the mixing chamber to be transferred into the reaction chamber, and the by-product is collected in the two chambers of the mixing chamber.

Accordingly, it has an effect of further improving the quality of the formed thin films resulting in further quality improvement of the semiconductors.

Preferably, in the nitride film forming method according to the present invention, dichlorosilane ($SiH_2Cl_2$) and ammonia are used as the reaction gases.

According to this invention, since dichlorosilane ($SiH_2Cl_2$) and ammonia are used as the reaction gases, by-product is especially likely to be produced.

Accordingly, it has an effect that the effect of quality improvement of semiconductors becomes further considerable.

Preferably, in the nitride film forming method according to the present invention, titanium tetrachloride ($TiCl_4$), ammonia ($NH_3$) and hydrogen ($H_2$) are used as the reaction gases.

According to this invention, since titanium tetrachloride ($TiCl_4$), ammonia ($NH_3$) and hydrogen ($H_2$) are used as the reaction gases, by-product is especially likely to be produced.

Accordingly, it has an effect that the effect of improving quality of semiconductors becomes further considerable.

In a semiconductor producing apparatus for forming a thin film supplying plural kinds of reaction gases through a gas nozzle into a reaction chamber, a semiconductor water is provided according to the present invention, and a twist-like flow path for mixing the reaction gases is provided preceding the gas nozzle.

According to this invention, a shearing force is exerted by rapidly changing the flow vector and the liner flow velocity of the reaction gas to produce turbulence to facilitate mixing of the reaction gases, and the flow path can be accommodated in a compact volume. Accordingly, sufficient mixing of a plural kinds of reaction gases is realized in a small space preceding the gas nozzle, enabling formation of thin films having uniform film thickness distribution.

Accordingly, it has an effect that it can contribute to the quality improvement of semiconductors and maintaining the production cost low.

In a semiconductor producing apparatus for forming a thin film supplying plural kinds of reaction gases through a gas nozzle into a reaction chamber in which a semiconductor wafer is provided according to another aspect of the present invention, a first reaction gas flow path having an enlarged portion and a narrow portion and a spray outlet for introducing second reaction gas from a direction intersecting the first reaction gas flow path are provided preceding the gas nozzle.

According to this invention, a shearing force is exerted by rapidly changing the flow vector and the liner flow velocity of the reaction gas to produce turbulence to facilitate mixing of the reaction gases, and the flow path can be accommodated in a compact volume. Accordingly, sufficient mixing of a plural kinds of reaction gases is realized in a small space preceding the gas nozzle, enabling formation of thin films having a uniform film thickness distribution.

Accordingly, it has an effect that it can contribute to the quality improvement of semiconductors and maintaining the production cost low.

Preferably, the second reaction gas with a flow rate smaller than the first reaction gas flowing in the first reaction gas path from a direction intersecting therewith are provided preceding the gas nozzle.

According to this invention, particularly, since a reaction gas having small flow rate is introduced into a flow of a reaction gas with a large flow rate, both reaction gases can be stably supplied into the reaction space.

Accordingly, it has an effect that it can contribute to the further quality improvement of semiconductors maintaining the production cost low.

Preferably, in the semiconductor producing apparatus according to the present invention, the flow path preceding the gas nozzle is heated to 100° C. or higher and 600° C. or lower.

According to this invention, production of the by-product in mixing reaction gases can be prevented.

Accordingly, it has effects that it can contribute to the quality improvement of semiconductors maintaining the production cost low and that the maintenance work such as removing of the by-products can be facilitated.

Accordingly, it is an object of the present invention to obtain a wafer vacuum chucking device which can suck and fix semiconductor wafers under low pressure with the sucked and fixed surface facing downwards.

It is another object of the present invention to present a semiconductor producing apparatus in which contaminations of wafers and thin films formed on the wafer surfaces and attachment of dusts on a high temperature portion are prevented, and if the wafer holding mechanism is of the vacuum chuck system, the temperature difference between the wafer and the wafer holding mechanism is made small to uniformly heat the water even if there is unevenness of distribution of heat generation by the wafer heating source.

It is still another object of the present invention to provide a semiconductor producing apparatus in which dust contamination is not serious because reaction by-product does not adhere even if reaction gas is diffused into a gas seal surface and maintenance work is simple.

It is another object of the present invention to obtain a gas cleaning method capable of cleaning, protecting a contact surface of a semiconductor wafer and a susceptor on which no surplus deposition is attached from cleaning gas.

It is still another object of the present invention to provide a semiconductor producing apparatus or a thin film forming method in which production of by-product (dust) in a reaction chamber is suppressed to improve the productivity and the process conditions and the like can be optimized.

It is another object of the present invention to provide a semiconductor producing apparatus in which thin films for a semiconductor having uniform film thickness distribution are obtained by sufficiently mixing reaction gases, and production of reaction by-product which causes production of dust and clogging in a reaction gas flow path can be prevented by thermally controlling the nozzle system.

These and other objects, features, aspects and advantages of the present invention will become more apparent from the following detailed description of the present invention when taken in conjunction with the accompanying drawings.

BRIEF DESCRIPTION OF THE DRAWINGS

FIG. 34 is a sectional view showing a twenty-seventh preferred embodiment according to the present invention.

FIG. 35 is a sectional view showing a twenty-eighth preferred embodiment according to the present invention.

FIG. 36 is a sectional view showing a twenty-ninth preferred embodiment according to the present invention.

FIG. 37 is a sectional view showing a thirtieth preferred embodiment according to the present invention.

DESCRIPTION OF THE PREFERRED EMBODIMENT

Preferred embodiments of the present invention will be described below. The same or corresponding parts to the conventional semiconductor producing apparatus are designated with the same characters.

Figure 1:
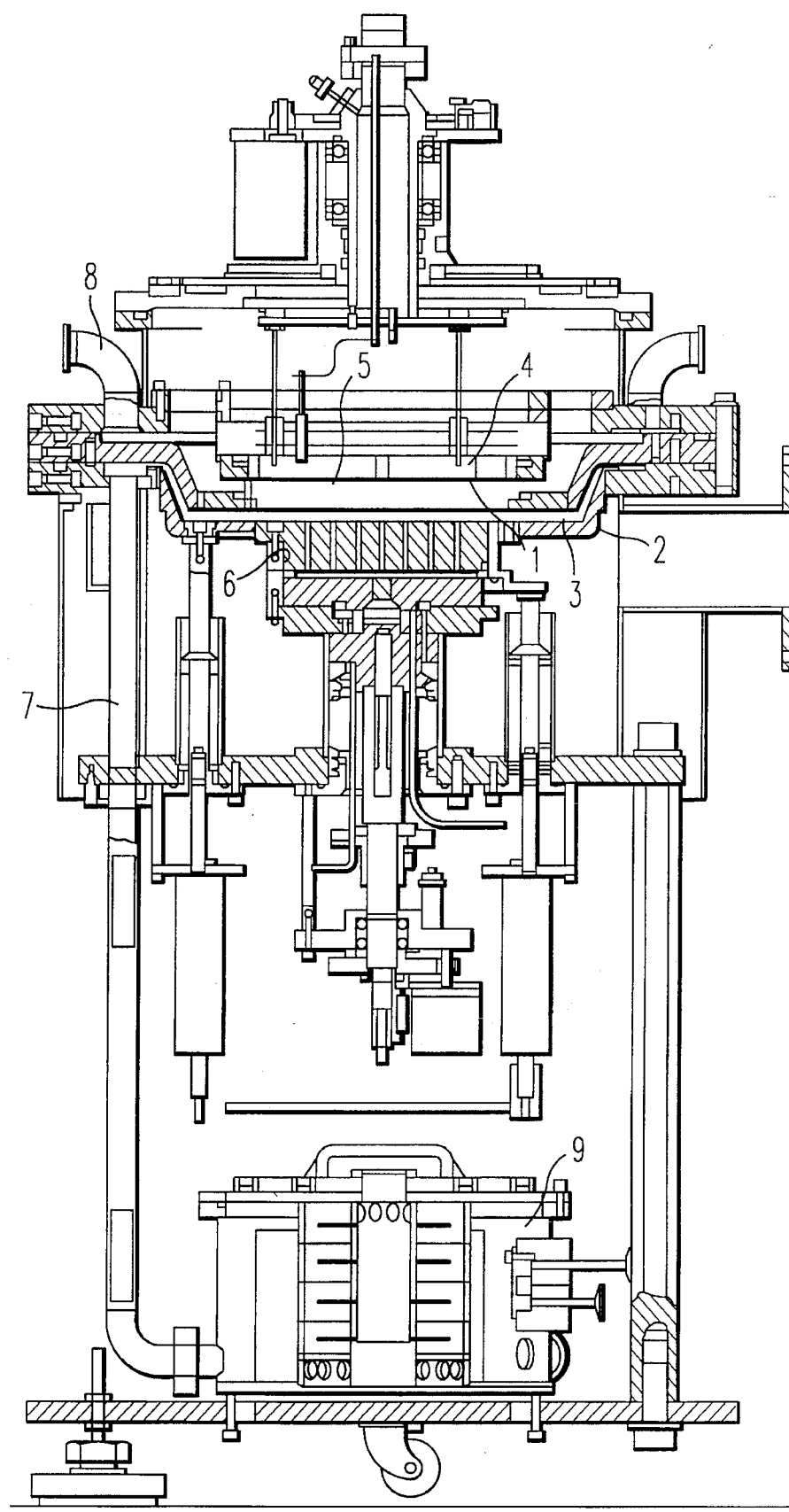
FIG. 1 is a diagram showing a schematic structure of the entirety of a semiconductor apparatus including each embodiment of the present invention.

First, the schematic structure and operation of the entire semiconductor apparatus including respective preferred embodiments will be described referring to FIG. 1. FIG. 1 is a sectional view of a semiconductor producing apparatus according to the present invention. In the figure, 1 denotes a wafer, 2 denotes a reaction chamber for accommodating the wafer 1, 3 denotes a reaction space, 4 denotes a wafer heating source for heating the wafer 1, 5 denotes a vacuum chuck on which the wafer 1 is provided, 6 denotes a gas nozzle for supplying reaction gas to the reaction chamber 2, 7 denotes a reaction gas exhaust path, 8 denotes a vacuum chuck exhaust path, and 9 denotes a rear stage trap for removing reaction by-product from gas after reaction which has passed through the reaction gas exhaust path 7.

Next, the operation will be described. The wafer 1 is provided on the vacuum chuck 5 and the vacuum chuck 5 is vacuum exhausted from the vacuum chuck exhaust path 8 opening to the vacuum chuck 5, so that the wafer 1 is sucked and fixed by means of the differential pressure from the reaction space 3. Furthermore, the wafer 1 is heated to a high temperature through the vacuum chuck 5 by the wafer heating source 4. Subsequently, reaction gas is supplied into the reaction chamber 2 from the gas nozzle 6 to form a thin film on the surface of the wafer 1 at high temperature by means of the thermal chemical reaction. On the other hand, the gas after the reaction arrives at the rear stage trap 9 via the reaction gas exhaust path 7, where it is exhausted with the reaction by-product removed.

First Preferred Embodiment

Figure 2:
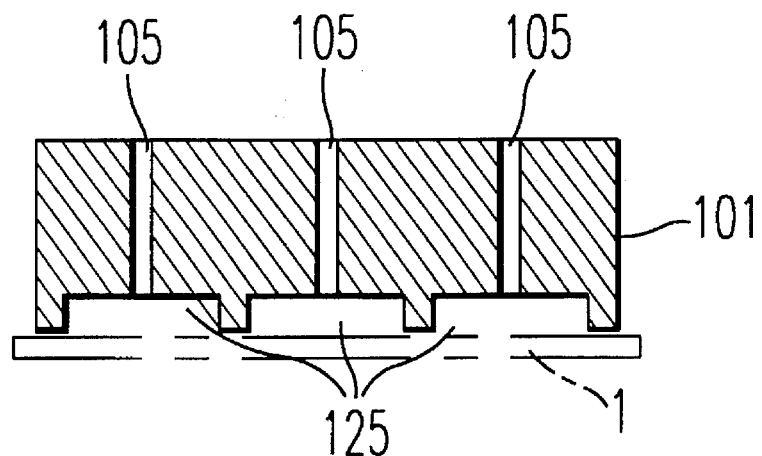
FIG. 2 is a sectional view showing a first preferred embodiment according to the present invention.
Figure 3:
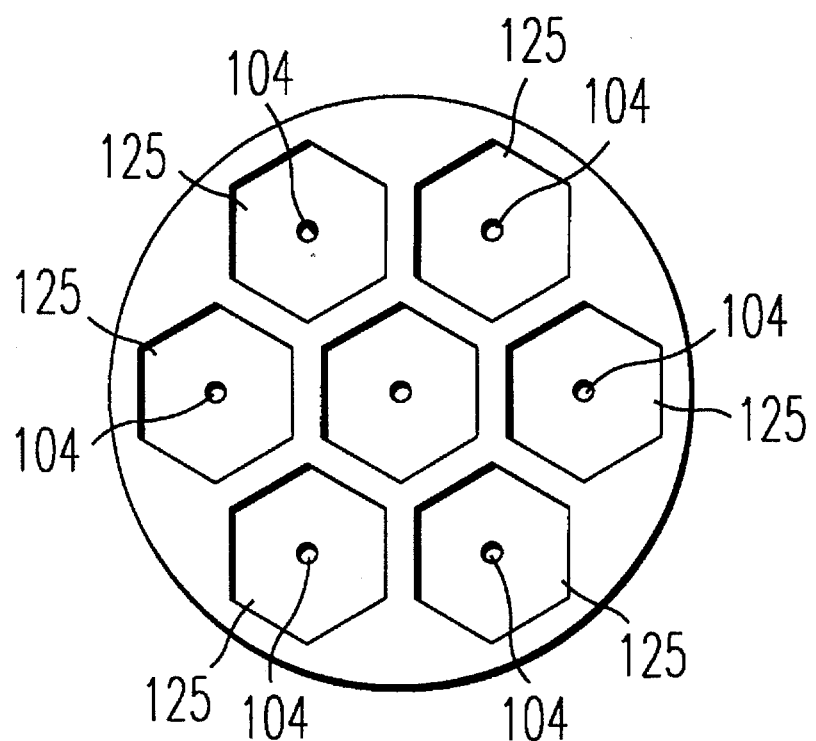
FIG. 3 is a bottom view showing the first preferred embodiment according to the present invention.

FIG. 2 is a sectional view of a wafer vacuum chucking device in the first preferred embodiment of the present invention, and FIG. 3 is a bottom view of the wafer chucking device in FIG. 2. In FIGS. 2 and 3, 101 denotes a vacuum chuck main body, in which a plurality of block grooves 125 are provided on the surface for sucking and fixing the wafer 1 which is comprised of semiconductor, and vacuum evacuation paths 105 is provided for vacuum exhausting each of the block grooves 125. Reference numeral 104 denotes vacuum evacuation holes.

In the wafer vacuum chuck device structured as described above, when sucking and fixing the wafer 1 with its suction surface facing downwards under low pressure, even if the airtight condition in the vicinity of the wafer 1 is broken due to attachment of dusts onto the suction surface, cuts on the suction surface, curves of the wafer 1 and the like to reduce the degree of vacuum in the block groove 125 in that part, the wafer 1 can surely be sucked and held.

That is to say, each block groove 125 is an independent space and has a vacuum evacuation path 105 provided independently in each block so that the degree of vacuum can be prevented in blocks other than the block groove in which the vacuum condition is broken due to attachment of dust or the like. Accordingly, satisfactory differential pressure can be obtained in the entire suction surface even under low pressure so that the wafer 1 can be surely sucked to be held. Although the shape of the block groove 125 is hexagonal in this preferred embodiment, it is satisfactory if a suction surface is divided into a plurality of spaces (grooves), where other shapes such as circle can also be used. In this preferred embodiment, block groove 125 and vacuum evacuation holes 104 can be formed unitarily from a pass continuing in a uniform size.

Second Preferred Embodiment

Figure 4:
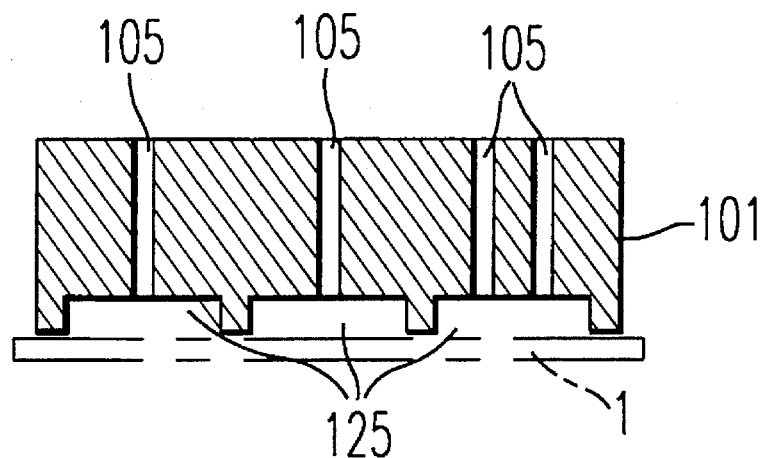
FIG. 4 is a sectional view showing a second preferred embodiment according to the present invention.
Figure 5:
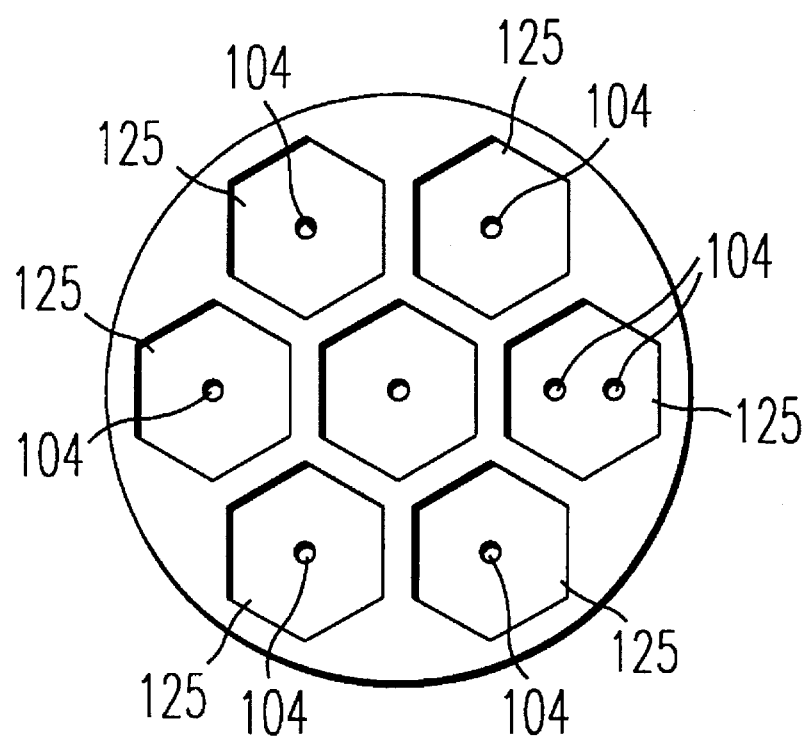
FIG. 5 is a bottom view showing the second preferred embodiment according to the present invention.

FIG. 4 is a sectional view of a wafer vacuum chucking device in the second preferred embodiment, and FIG. 5 is a bottom view of the wafer vacuum chucking device in FIG. 4. In FIGS. 4 and 5, the vacuum chuck main body 101 and the block grooves 125, and the vacuum evacuation paths 105 are the same as the above-described first preferred embodiment, but the number of the vacuum evacuation paths 105 is different from that in the first preferred embodiment. That is, the exhaust resistance differs in respective block grooves 125 by varying the number of the vacuum evacuation paths 105.

In the wafer vacuum chucking device constituted as described above, since the exhaust resistance can be different in each block, the decrease in the degree of vacuum can be prevented even if the air tight condition is broken by making small the exhaust resistance of a block groove in which the airtight condition is especially likely to be broken. Accordingly, satisfactory differential pressure can be obtained in the entire suction surface even under low pressure to surely suck and hold the wafer 1.

Third Preferred Embodiment

Figure 6:
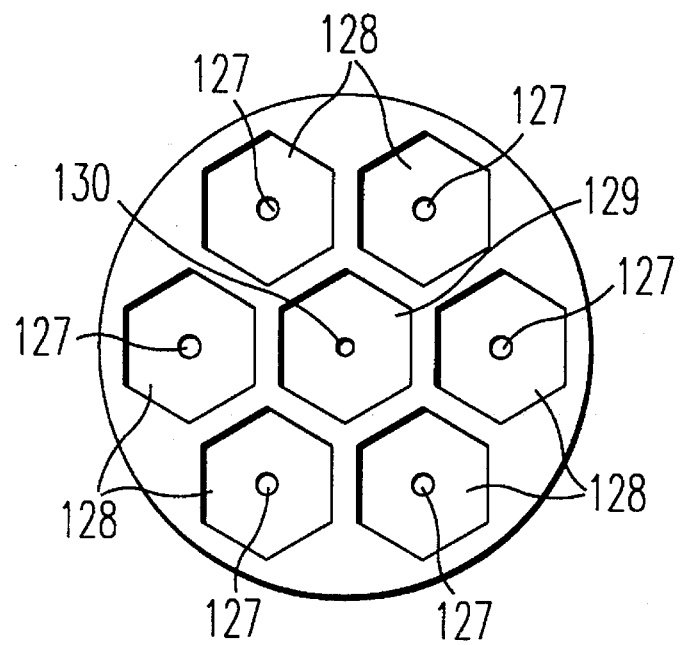
FIG. 6 is a bottom view showing a third preferred embodiment according to the present invention.

FIG. 6 is a bottom view of a wafer vacuum chucking device in the third preferred embodiment. The suction surface includes outer block grooves 128 arranged on its outer peripheral part and an inner block groove 129 arranged in its inner side, where outer vacuum evacuation holes 127 communicating with the outer block grooves 128 and an inner vacuum evacuation path 130 communicating with the inner block groove 129 are provided. The diameter of the outer vacuum evacuation hole 127 is larger than that of the inner vacuum evacuation hole 130.

In the wafer vacuum chucking device constituted as described above, when the semiconductor wafer 1 is sucked to be fixed with its suction fixed surface facing downward under reduced pressure, even if the airtight condition in the vicinity of the wafer 1 is broken due to attachment of dusts on the suction surface, cuts of the suction surface, curves of the wafer 1 and the like to reduce the degree of vacuum in the outer block grooves 128, most of gas flowing from outside is exhausted in the outer block grooves 128 not to decrease the degree of vacuum in the inner block groove 129 because the diameter of the outer vacuum evacuation hole 127 is larger than that of the inner vacuum evacuation hole 130. Accordingly, sufficient differential pressure is obtained by the degree of vacuum in the inner block groove 129 even under low pressure to certainly suck and hold the wafer.

Fourth Preferred Embodiment

Figure 7:
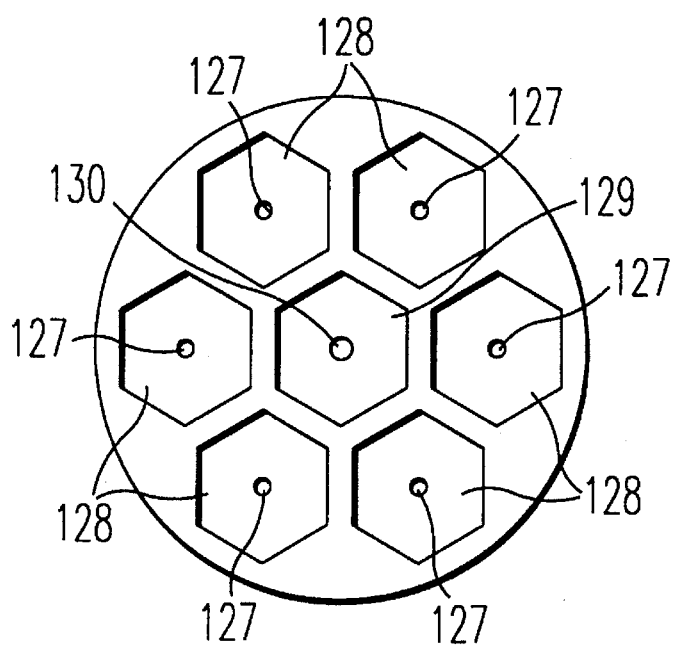
FIG. 7 is a bottom view showing a fourth preferred embodiment according to the present invention.

FIG. 7 is a bottom view of a wafer vacuum chucking device in the fourth preferred embodiment. On the contrary to the third preferred embodiment, the diameter of the outer vacuum evacuation hole 127 is smaller than that of the inner vacuum evacuation hole 130.

In the wafer vacuum chucking device constituted as described above, since the diameter of the outer vacuum evacuation hole 127 is smaller than that of the inner vacuum evacuation hole 130, even if the airtight condition is broken in the outer block groove 128, the degree of vacuum is not decreased because the exhaust amount from the inner vacuum evacuation hole 130 is larger, with the result that satisfactory differential pressure can be obtained to certainly suck and hold the wafer 1.

Fifth Preferred Embodiment

Figure 8:
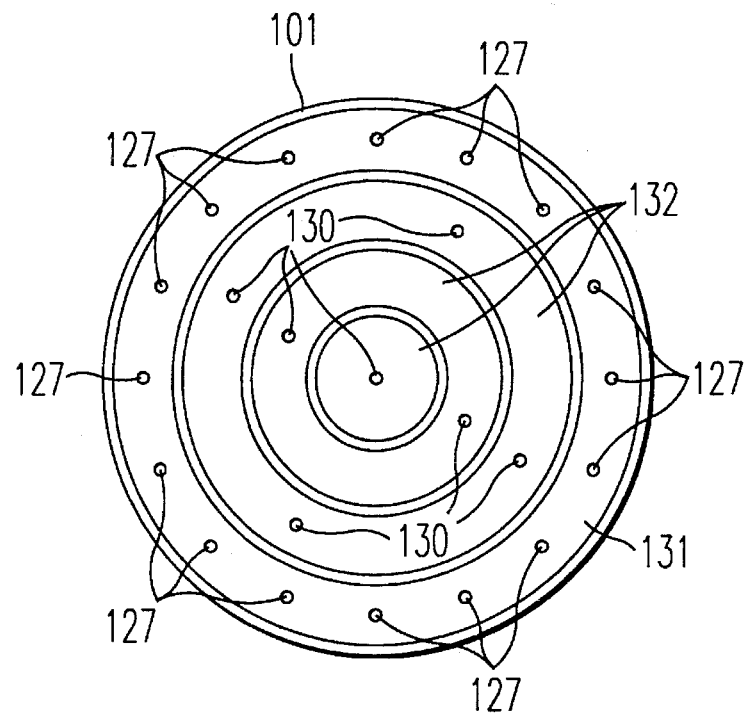
FIG. 8 is a bottom view showing a fifth preferred embodiment according to the present invention.

FIG. 8 is a bottom view of a wafer vacuum chucking device in the fifth preferred embodiment. The groove which is in the block form in the first embodiment is now particularly in the form of circumference, that is, concentric circles. That is, in FIG. 8, 101 denotes a vacuum chuck main body where a plurality of circumference-shaped block grooves 131 and 132 are provided on the surface on which the wafer 1 is sucked and fixed, and vacuum evacuation paths 127 and 130 for vacuum exhausting respective block grooves are provided for respective block grooves 131 and 132.

In the wafer vacuum chucking device constituted as described above, the wafer can also be surely sucked to be fixed.

Sixth Preferred Embodiment

Figure 9:
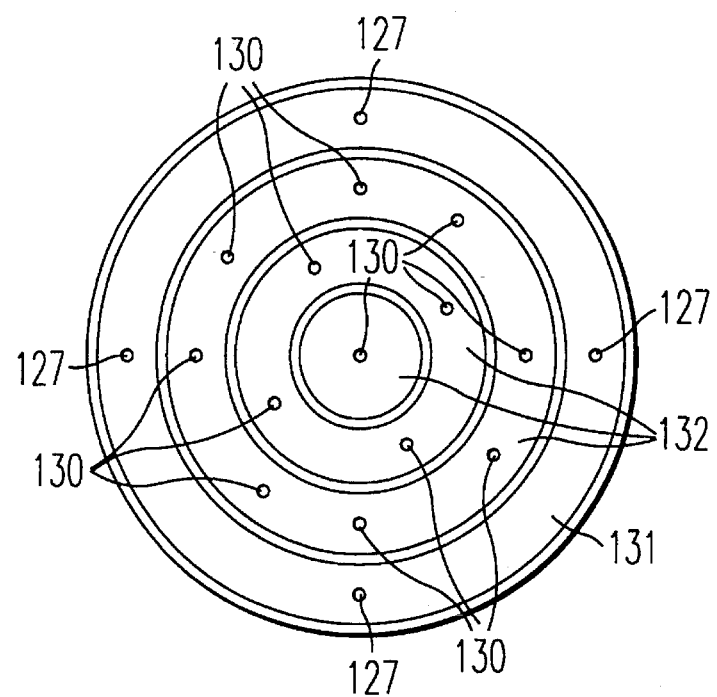
FIG. 9 is a bottom view showing a sixth preferred embodiment according to the present invention.

FIG. 9 is a bottom view of a wafer vacuum chucking device in the sixth preferred embodiment. The number of the inner circumference-like vacuum evacuation hole 130 is larger than the fifth preferred embodiment.

In the wafer vacuum chucking device constituted as described above, the wafer can also be surely sucked and held similarly to the fourth preferred embodiment.

Seventh Preferred Embodiment

Figure 10:
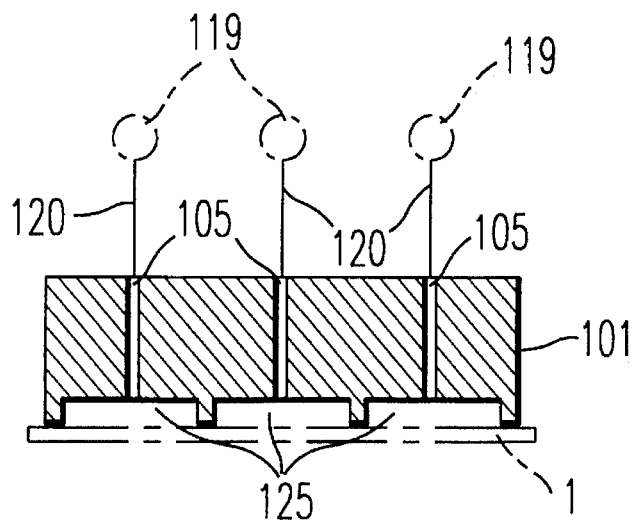
FIG. 10 is a sectional view showing a seventh preferred embodiment according to the present invention.

FIG. 10 is a sectional view of a wafer vacuum chucking device in the seventh preferred embodiment. In FIG. 10, 119 denotes a pump for independently exhausting each block groove 125, and 120 denotes a piping communicating with the vacuum evacuating path 105 communicated with each block groove 125.

In the wafer vacuum chucking device constituted as described above, when the wafer 1 is sucked and fixed with its suction surface facing downwards under low pressure, even if the airtight condition in the outer block groove is broken due to attachment of dusts on the suction surface, cuts on the suction surface, bending of the wafer 1 and the like to decrease the degree of vacuum in the outer block groove, it does not affect other pipings 120 since each block groove is independently evacuated, and the decrease in the degree of vacuum in other block grooves can surely be prevented. Accordingly, sufficient differential pressure can be obtained by means of the degree of vacuum of other block grooves 125 under low pressure to surely stick and hold the wafer.

Eighth Preferred Embodiment

Figure 11:
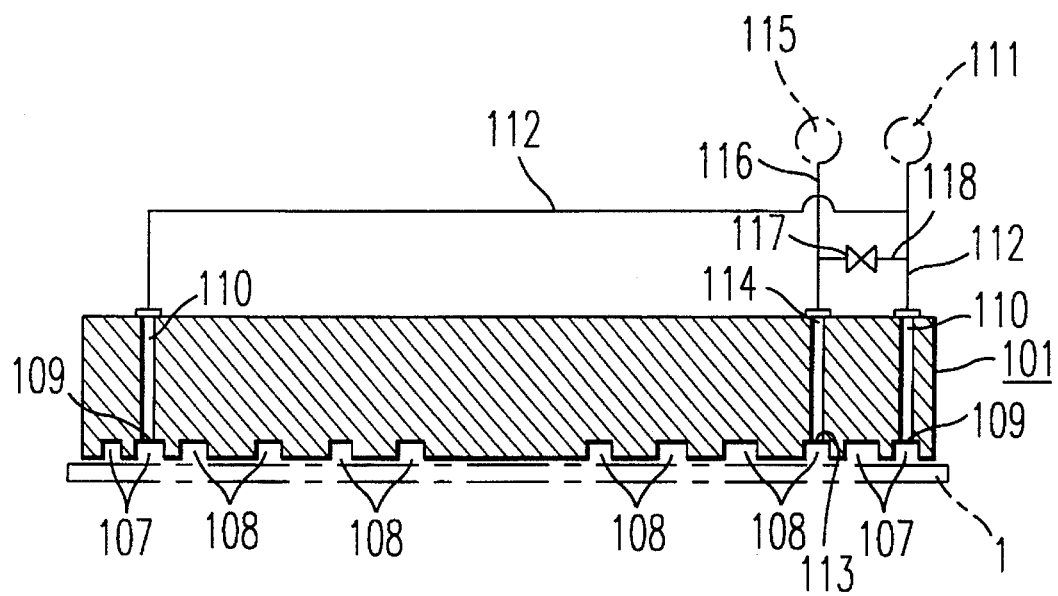
FIG. 11 is a sectional view showing an eighth preferred embodiment according to the present invention.
Figure 12:
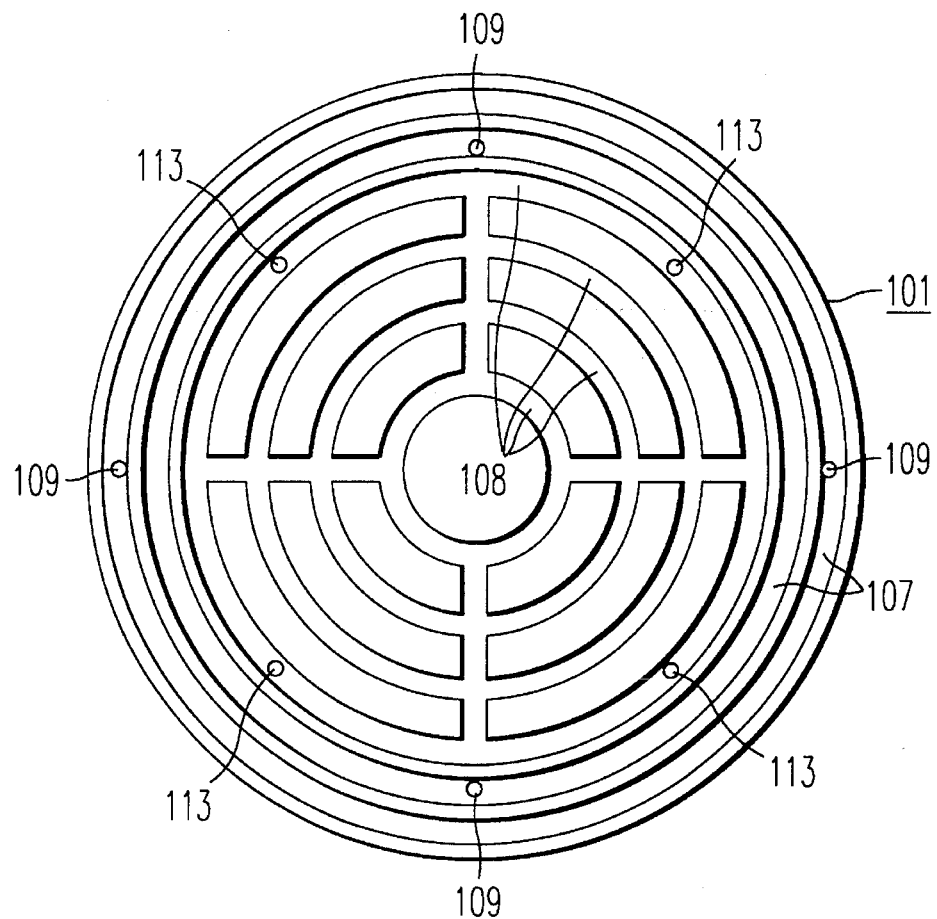
FIG. 12 is a bottom view showing the eighth preferred embodiment according to the present invention.

FIG. 11 is a sectional view of a wafer vacuum chucking device in the eighth preferred embodiment of this invention and FIG. 12 is a bottom view of the wafer vacuum chucking device in FIG. 11. In FIGS. 11 and 12, 101 denotes a vacuum chuck main body having outer grooves 107 for outer part vacuum sucking and an inner groove 108 for inner part vacuum sucking provided on the surface for sucking the wafer 1 to fix. The outer grooves 107 include a plurality of grooves with coaxial circular shape.

Vacuum evacuation holes 109 are arranged in the outer grooves 107, and vacuum evacuation paths 110 passing through the chuck main body 101 from the vacuum evacuation holes 109 and a piping 112 connecting the first vacuum evacuation paths 110 and a vacuum pump 111 are further provided, where the outer grooves 107 can be independently vacuum evacuated.

Also, vacuum evacuating holes 113 are arranged in the inner groove 108, and a piping 116 connecting a second vacuum evacuating path 114 passing through the chuck main body 101 from the vacuum evacuating holes 113 and a vacuum pump 115 is further provided, where the inner groove 108 can be independently vacuum evacuated.

The pipings 112 and 116 are communicated by a piping 118 in which a valve 117 is interposed. The valve 117 is a by-pass valve for connecting the pipings 112 and 116 to make the pressure uniform in the outer grooves 107 and the inner groove 108 when the wafer 1 is taken out of the suction surface of the vacuum chuck main body 101.

In the wafer vacuum chucking device constituted as described above, when the wafer 1 is sucked and fixed with its suction surface facing downwards under low pressure, if the airtight condition in the vicinity of the wafer 1 is broken due to attachment of dusts on the suction surface, cuts on the suction surface, bending of the wafer 1 and the like to decrease the degree of vacuum in the outer groove 107, the degree of vacuum in the piping 112 for outer groove also decreases, but it does not affect the piping 116 independently vacuum evacuating the inner groove 108 since the valve 117 is closed at this time, and the decrease in the degree of vacuum in the inner groove 108 can be prevented. Accordingly, sufficient differential pressure can be obtained by means of the degree of vacuum in the inner groove 108 under low pressure to surely suck and hold the wafer 1. For reference, in the experiment with the structure of the eighth preferred embodiment, desirable suction and holding was possible under low pressure of 0.18 Torr in the case of 8-inch silicon wafer.

Ninth Preferred Embodiment

Figure 13:
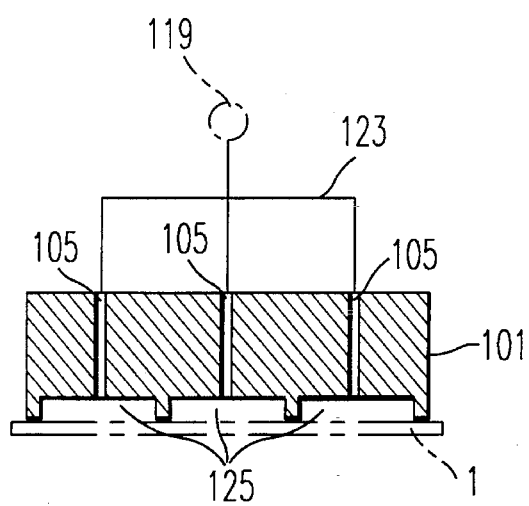
FIG. 13 is a sectional view showing a ninth preferred embodiment according to the present invention.

FIG. 13 is a sectional view of a wafer vacuum chucking device in the ninth preferred embodiment. In FIG. 13, 119 denotes a vacuum pump for evacuating each block groove 125, and 123 denotes a piping communicating with the vacuum evacuation paths 105 communicating with each block groove 125. This preferred embodiment is different from the above-described seventh preferred embodiment in that the piping 123 is branched and respective block grooves 125 are evacuated using the single vacuum pump 119.

In such a wafer vacuum chucking device constituted as described above, only a single pump 119 is included which is expensive, so that a wafer vacuum chucking device with low cost can be presented.

Tenth Preferred Embodiment

Figure 14:
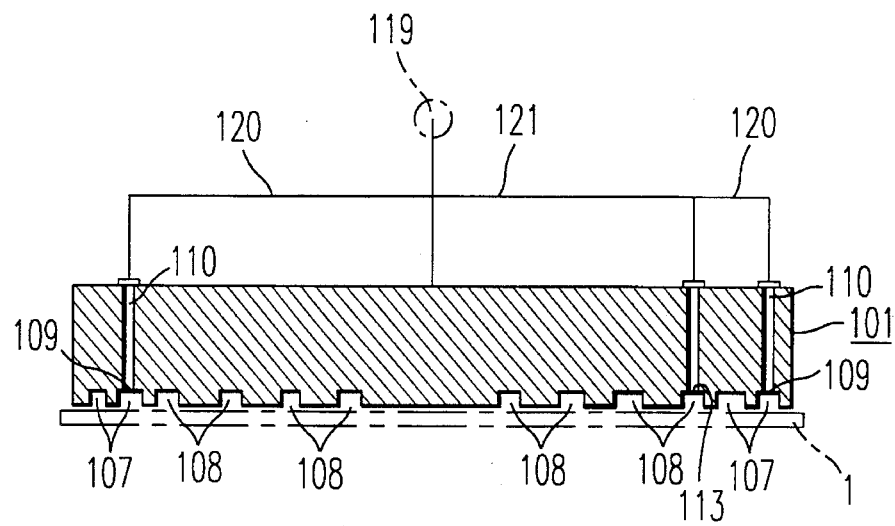
FIG. 14 is a sectional view showing a tenth preferred embodiment according to the present invention.
Figure 15:
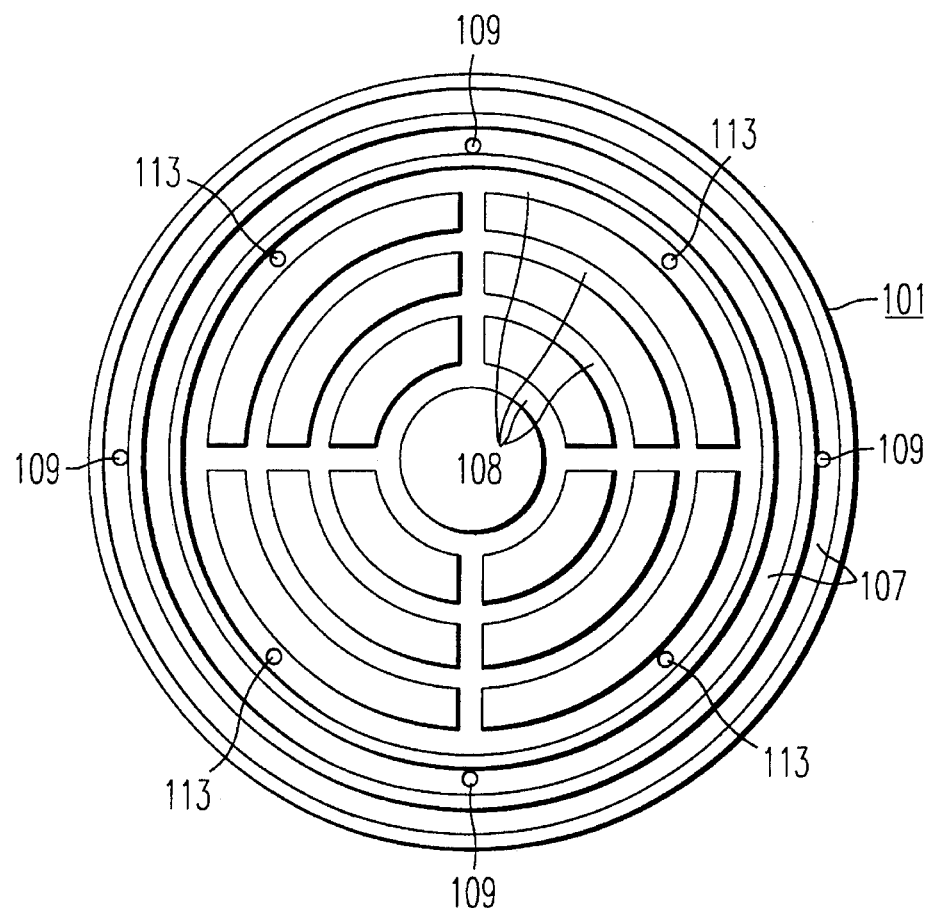
FIG. 15 is a bottom view showing the tenth preferred embodiment according to the present invention.

FIG. 14 is a sectional view of a wafer vacuum chucking device in the tenth preferred embodiment and FIG. 15 is a bottom view of the wafer vacuum chucking device in FIG. 14. In FIGS. 14 and 15, the vacuum chuck main body 101, the outer grooves 107, the inner groove 108, the first vacuum evacuation paths 110 and the second vacuum evacuation paths 114 are the same as the above-described eighth preferred embodiment, but the piping structure for connecting each vacuum evacuation path 110, 114 to the vacuum pump 119 is different. That is to say, in this preferred embodiment, the piping has structure in which the outer groove 107 and the inner groove 108 can be vacuum exhausted by a single vacuum pump 119 through each piping 120, 121, and the diameter of the piping 121 connecting the vacuum evacuation path 114 and the vacuum pump 119 is large so that the exhaust resistance determined on the basis of the second vacuum evacuation path 114 and the piping 121 is smaller than the exhaust resistance determined on the basis of the above-described first vacuum evacuation path 110 and the piping 120.

In the wafer vacuum chucking device constituted as described above, when the wafer 1 is sucked and fixed with its suction surface facing downwards under low pressure, if the airtight condition is broken in the outer groove 107 side due to attachment of dusts on the suction surface, cuts on the suction surface, bending of the wafer 1 and the like to decrease the degree of vacuum, since the exhaust resistance on the inner groove 108 side is smaller than the exhaust resistance on the outer groove 107 side, the degree of vacuum is not decreased because the exhausted amount from the vacuum evacuation path 114 is large, where sufficient differential pressure can be obtained to surely suck and hold the wafer 1.

For reference, in the experiment with the structure of the tenth preferred embodiment, desirable suction and holding was possible under low pressure of 0.18 Torr in the case an 8-inch silicon wafer.

Eleventh Preferred Embodiment

In the tenth preferred embodiment, the exhaust resistance on the inner groove 108 side is smaller than the exhaust resistance on the outer groove 107 side by making large the diameter of the piping 121 connecting the second vacuum evacuation path 114 and the vacuum pump 119. However, the same effect can be obtained as the tenth preferred embodiment by interposing an exhaust amount adjusting valve in the piping 120 connecting the first vacuum evacuation path 110 and the vacuum pump 119, or by making the diameter of the vacuum evacuation path 114 larger or increasing the number thereof, or by making the piping 120 longer than the piping 121 connecting the second vacuum evacuation path 114 and the vacuum pump 119.

Twelfth Preferred Embodiment

Figure 16:
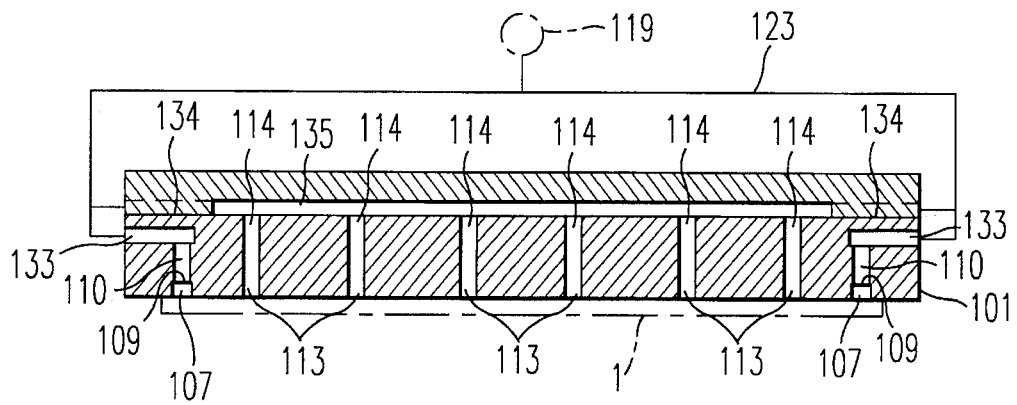
FIG. 16 is a sectional view showing a twelfth preferred embodiment according to the present invention.
Figure 17:
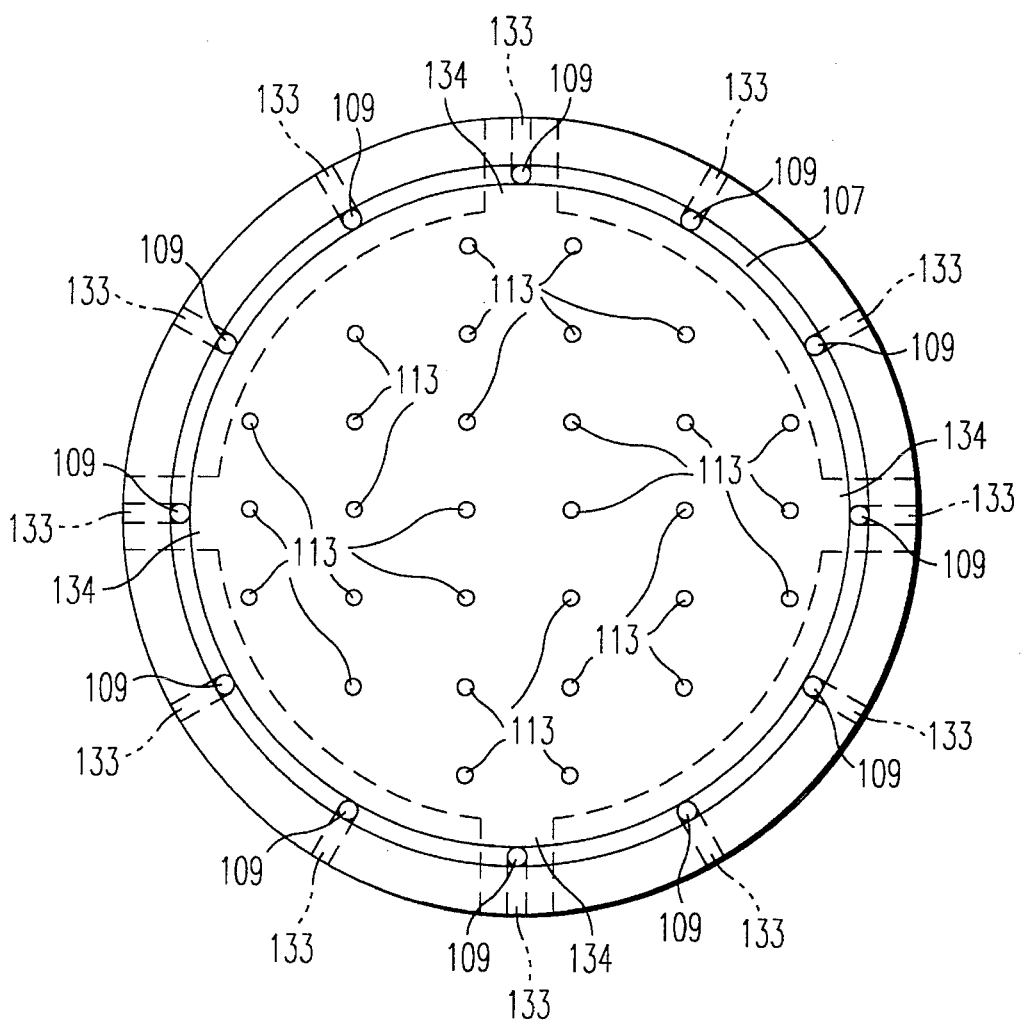
FIG. 17 is a bottom view showing the twelfth preferred embodiment according to the present invention.

FIG. 16 is a sectional view of a water vacuum chucking device in the twelfth preferred embodiment, and FIG. 17 is a bottom view of the wafer vacuum chucking device in FIG. 16. The twelfth embodiment is similar to the tenth embodiment in that the outer peripheral groove 107 with circumferential shape, the vacuum evacuation holes 109 and the first vacuum evacuation paths 110 are provided on the wafer vacuum suction surface. However, the twelfth embodiment is different from the tenth embodiment in that outer peripheral transverse exhaust paths 133 which make the first vacuum evacuation paths 110 connected not with the upper part of the vacuum chuck main body but in the transverse direction, and that a plurality of vacuum evacuation holes 113 are provided on the inner peripheral part instead of the inner grooves 108. The vacuum evacuation hole 113 communicates with a thin and cylindrical inner peripheral exhaust chamber 135 provided in the vacuum chuck main body 101 through the second vacuum evacuation path 114, and the inner peripheral transverse exhaust path 134 is connected to the side surface of the vacuum chuck main body 101 from the periphery of the inner peripheral exhaust chamber 135, and the inner peripheral transverse exhaust path 134 and the outer peripheral transverse exhaust path 133 communicate with the piping 123 and are connected to the vacuum pump 119.

In such a wafer vacuum chucking device configured as described above, a large number of vacuum evacuation holes 113 can be formed to extend the width of the above-mentioned exhaust resistance design. Also, by communicating each of the exhaust paths 133, 134 to the side of the vacuum chuck main body 101, a free space can surely be made in the upper part of the vacuum chuck main body 101 to produce an effect that a wafer heating source such as a heater for heating the wafer 1 can be provided therein.

Thirteenth Preferred Embodiment

Figure 18:
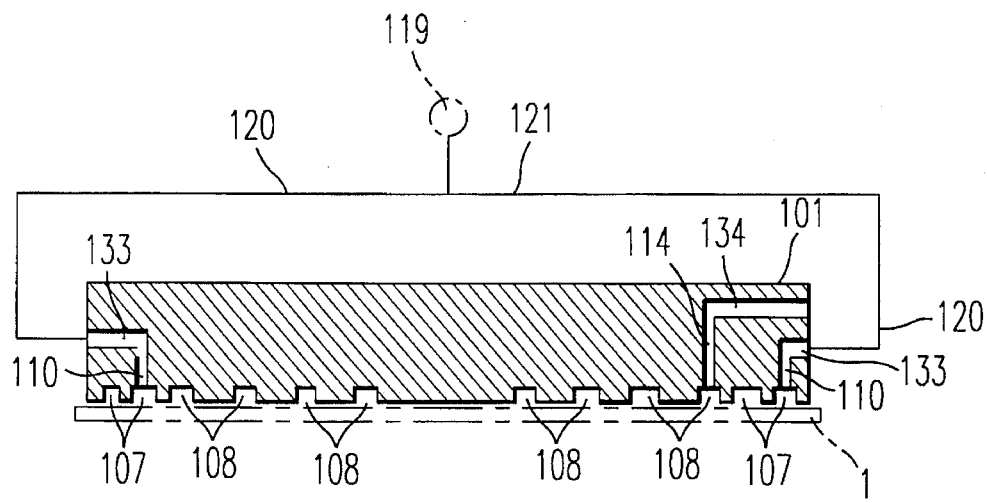
FIG. 18 is a sectional view showing a thirteenth preferred embodiment according to the present invention.
Figure 19:
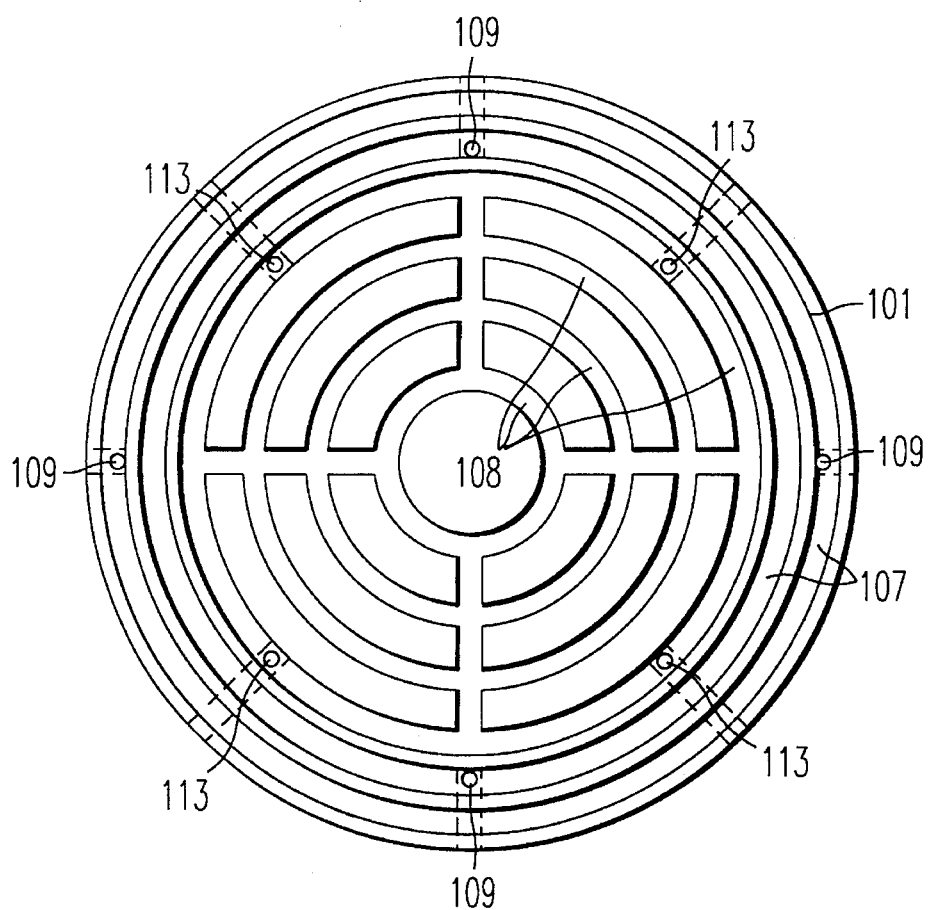
FIG. 19 is a bottom view showing the thirteenth preferred embodiment according to the present invention.

FIG. 18 is a sectional view of a wafer vacuum chucking device in the thirteenth preferred embodiment and FIG. 19 is a bottom view of the wafer vacuum chucking device in FIG. 18. In the thirteenth preferred embodiment, each exhaust path passes through the side of the vacuum chuck main body 101 as in the twelfth preferred embodiment in the tenth preferred embodiment, where a free space is surely made in the upper part of the vacuum chuck main body 101 so that it has a particular effect that a wafer heating source such as a heater for heating the wafer 1 can be provided therein.

Fourteenth Preferred Embodiment

Figure 20:
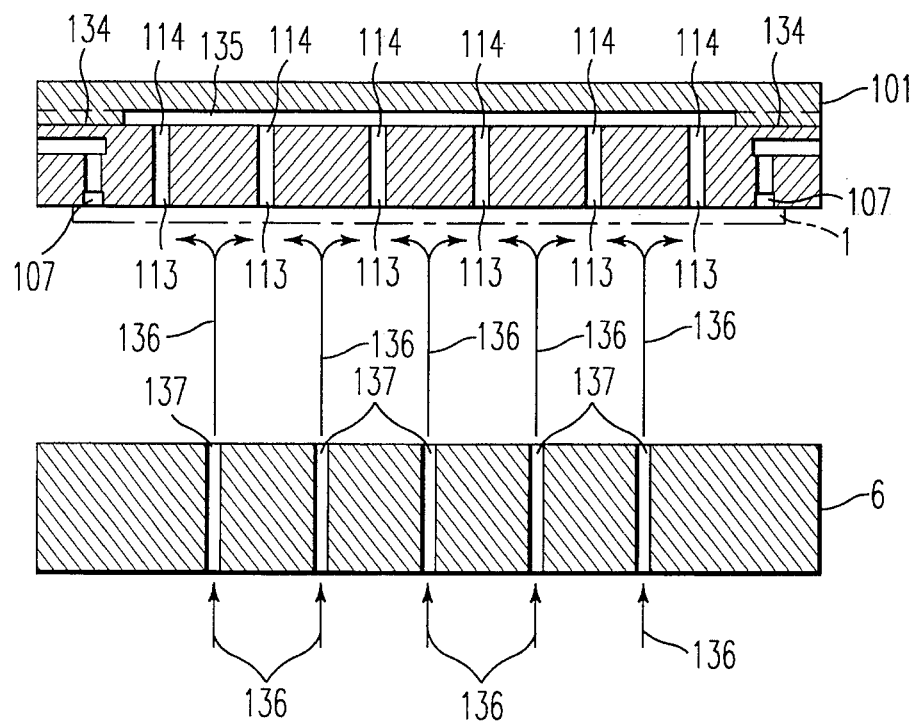
FIG. 20 is a sectional view showing a fourteenth preferred embodiment according to the present invention.
Figure 21:
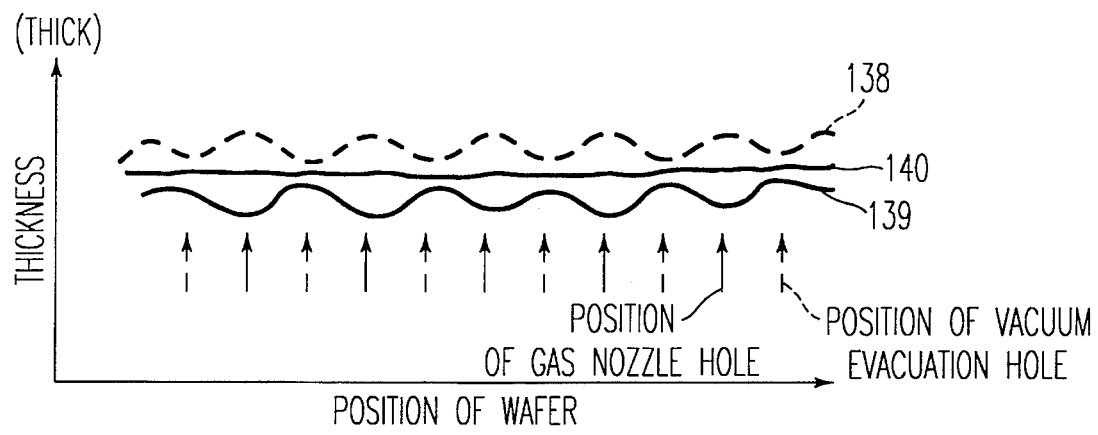
FIG. 21 is a diagram for illustrating effects of the fourteenth preferred embodiment according to the present invention.

FIG. 20 is a sectional view of a wafer vacuum chucking device and a gas nozzle in the fourteenth preferred embodiment and FIG. 21 is a diagram for illustrating effects of the vacuum chucking device of the fourteenth preferred embodiment. In FIG. 20, a gas nozzle 6 is provided below the vacuum chuck main body 101 of this preferred embodiment, and reaction gas 136 is sprayed to the wafer 1 from gas nozzle holes 137. The wafer 1 is heated through the vacuum chuck main body 101 by a wafer heating source not shown. In the fourteenth preferred embodiment, the arrangement of each vacuum evacuation hole 113 is made so that it is at the middle with respect to the position of each gas nozzle hole 137.

In the wafer vacuum chucking device configured as described above, a uniform film can be obtained as shown by the character 140 in FIG. 21. If considering only effects of the vacuum evacuation holes 113, the heat is not readily transmitted to the wafer 1 in the vicinity of the vacuum evacuation holes 113 because the existence of the vacuum evacuation holes 113, so that the wafer temperature at that part decreases to make the film thin as shown by the curve 138 in FIG. 21. Also, if only the effects of the gas nozzle holes 137 are considered, as shown by the curve 139 in FIG. 21, the film thickness is smaller at the portion corresponding to the part over the gas nozzle holes 137 because temperature of the reaction gas is low. Accordingly, uniform films can be obtained as shown by the curve 140 in FIG. 21 by making the structure in which the arrangement of the vacuum evacuation holes 113 is located at the middle with respect to the positions of the gas nozzle holes 137.

Although the arrangement of the vacuum evacuation holes 113 is made at the middle with respect to the positions of the gas nozzle hole 137 in this preferred embodiment, it may be better to make a structure in which arrangement of the vacuum evacuation holes 113 is located at the same position with respect to the positions of the gas nozzle holes 137 depending on the reaction conditions.

Fifteenth Preferred Embodiment

Figure 22:
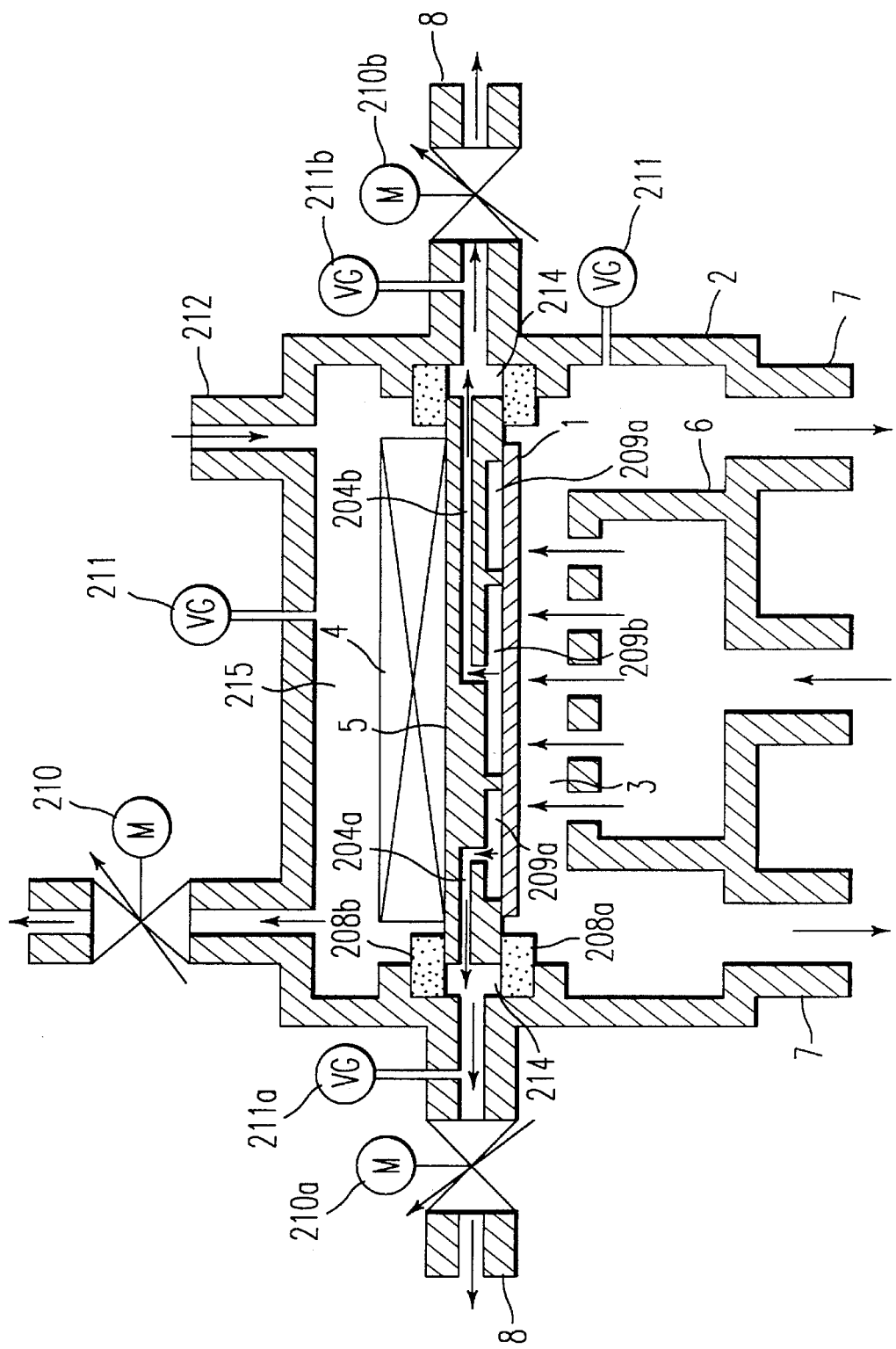
FIG. 22 is a sectional view showing a fifteenth preferred embodiment according to the present invention.

FIG. 22 is a sectional view showing a semiconductor producing apparatus of this preferred embodiment. In this preferred embodiment, the wafer holding mechanism is of the vacuum chuck system, where a vacuum chuck 5 also serves as a partition member for separating a heat source chamber 215 and a reaction space 3. 4 denotes a wafer heating source, which is a heater in this case. The wafer heating source 4 is provided adjacent to or in contact with the vacuum chuck 5. 208a, 208b denote a ring-like space separating plate provided for separating the space of the heat chamber 215 of the vacuum chuck 5 and a reaction space 3, 210 denotes a pressure controller, 211 denotes a pressure measuring device, 212 denotes a gas supplying portion, 214 denotes a space separated by the ring-like space separating plate 208a, 208b and the vacuum chuck 5.

A gas nozzle 6 is provided facing right upwards at the almost center portion in the reaction chamber 2. A wafer 1 is placed in parallel with its processed surface facing to the gas nozzle 6 between the gas nozzle 6 and the vacuum chuck 5, and the wafer 1 is sucked in a vacuum manner by the vacuum chuck 5. The vacuum chuck 5 is held in closer contact with the ring-like space separating plates 208a and 208b. The ring-like space separating plate 208a, 208b is made of material with low heat conductivity such as quarts glass, which is held in contact with the reaction chamber 2.

The chuck groove of the vacuum chuck 5 is divided into two independent spaces 209a and 209b, and vacuum exhaust holes 204a and 204b are provided for independently exhausting each of them. Pressure controllers 210a and 210b and pressure measuring devices 211a and 211b are respectively provided for the vacuum exhaust holes 204a and 204b, where pressures of the two spaces 209a and 209b are individually controlled. The space 214 is evacuated by the pressure controllers 219a and 210b.

The vacuum chuck 5 is made of material with high thermal conductivity such as silicon nitride, silicon carbide, aluminum nitride, carbon graphite, carbon graphite coated with silicon carbide film, and the like.

Provided in the heat source chamber 215 are the pressure controller 210, the pressure measuring device 211 and the gas supplying portion 212, where species of gas and pressure in the heat source chamber 215 can be adjusted.

Operation of such semiconductor producing apparatus configured as described above will be described. First, the wafer 1 is conveyed by a conveying device (not shown) to be placed on the vacuum chuck 5, and sucked by vacuum exhausting with the pressure controllers 210a and 210b. At this time, the degree of vacuum in the space 214 is set higher than the reaction space 3 and the heat source chamber 215. Subsequently, a reaction gas is jetted from the gas nozzle 6 facing to the processed surface of the wafer 1. At this time, since the wafer 1 is heated through the vacuum chuck 5 by the wafer heating source 4, thermal chemical reaction of the reaction gas is caused on the wafer 1 to form a thin film.

Since the heat source chamber 215 and the reaction space 3 are partitioned by the vacuum chuck 5 and the ring-like space separating plates 208a and 208b and the pressure of the space 214 is set lower than the pressure in the reaction space 3 and the heat source chamber 215, the reaction gas does not diffuse into the heat source chamber 215 so that adhesion on the heater 4 and corrosion of the heater 4 and the high temperature member with corrosive gas used as the reaction gas can be prevented. Also, contamination of the wafer 1 and the thin film formed on the surface of the wafer 1 due to the wafer heating source 4 can be prevented.

Furthermore, species of gas in the heat source chamber 215 can be adjusted and the pressure of gas in the heat source chamber 215 can also be adjusted, so that the thermal conduction effect of gas between the wafer heating source 4 and the vacuum chuck 5 can be increased and decreased. Also, since there is gas thermal conduction effects because gas is introduced into the spaces 209a and 209 and the vacuum chuck 5 is made of material with high thermal conductivity, the thermal resistance between the vacuum chuck 5 and the wafer 1 can be made small. Accordingly, the wafer heating source 4 can be prevented from going to a high temperature, and also the temperature distribution uniformity in the surface of the vacuum chuck 5 is improved to improve the temperature distribution uniformity in the surface of the wafer 1, resulting in improvement in the uniformity of the film thickness.

In addition, in the apparatus of this preferred embodiment, since the vacuum chuck 5 also serves as a partition member, and exhaust for vacuum evacuation and exhaust for the space in the partition member are accomplished in the same system, the size and cost of the apparatus can be decreased.

Sixteenth Preferred Embodiment

Figure 23:
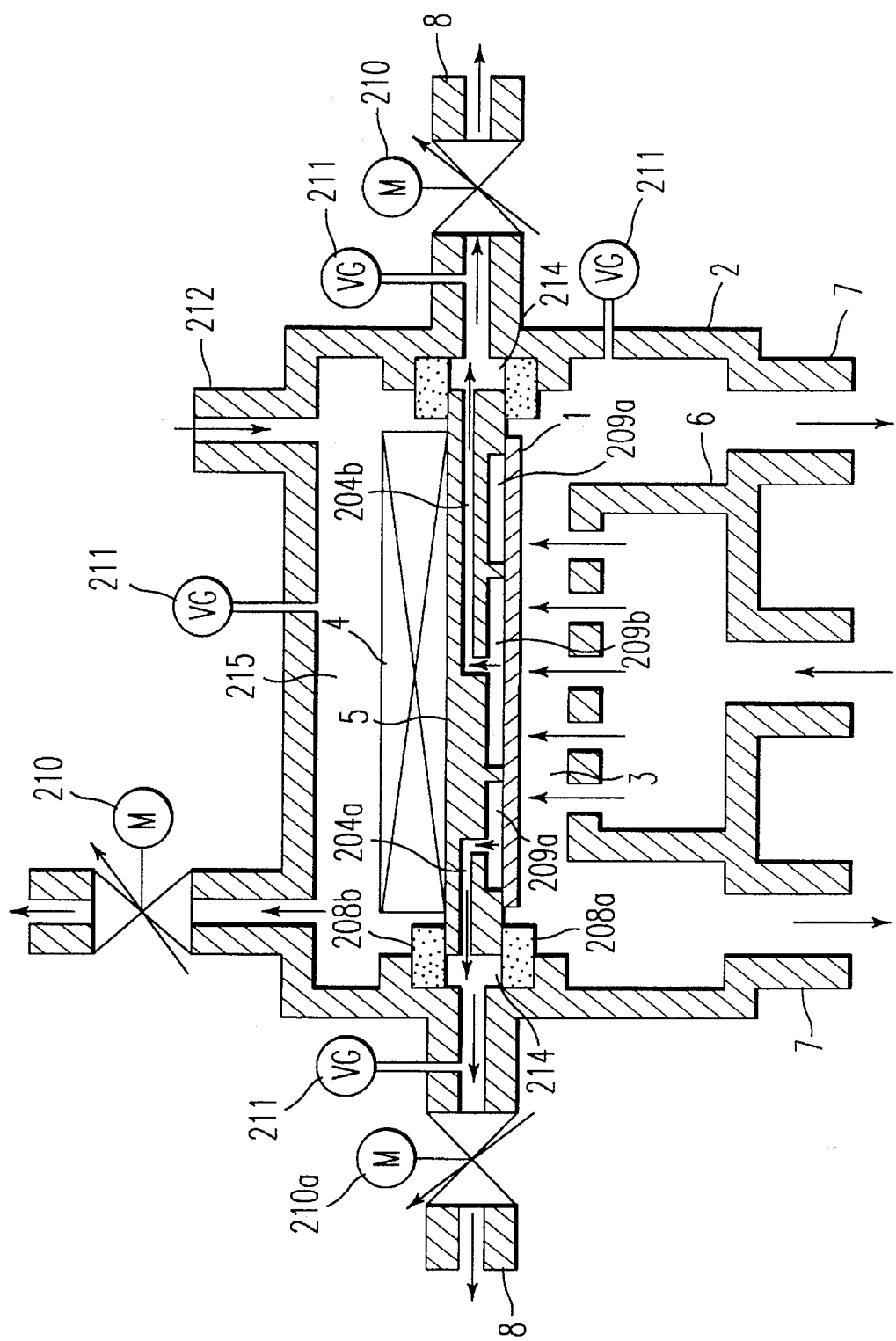
FIG. 23 is a sectional view showing a sixteenth preferred embodiment according to the present invention.

FIG. 23 is a sectional view showing a semiconductor producing apparatus of this preferred embodiment where the vacuum chuck 5 is made of infrared ray transmitting member such as transparent quarts glass, single crystal sapphire and the like.

In the semiconductor producing apparatus of this preferred embodiment, the wafer 1 can be directly heated by the infrared ray emitted from the wafer heating source 4, so that the quick and high temperature heating is possible.

Seventeenth Preferred Embodiment

Figure 24:
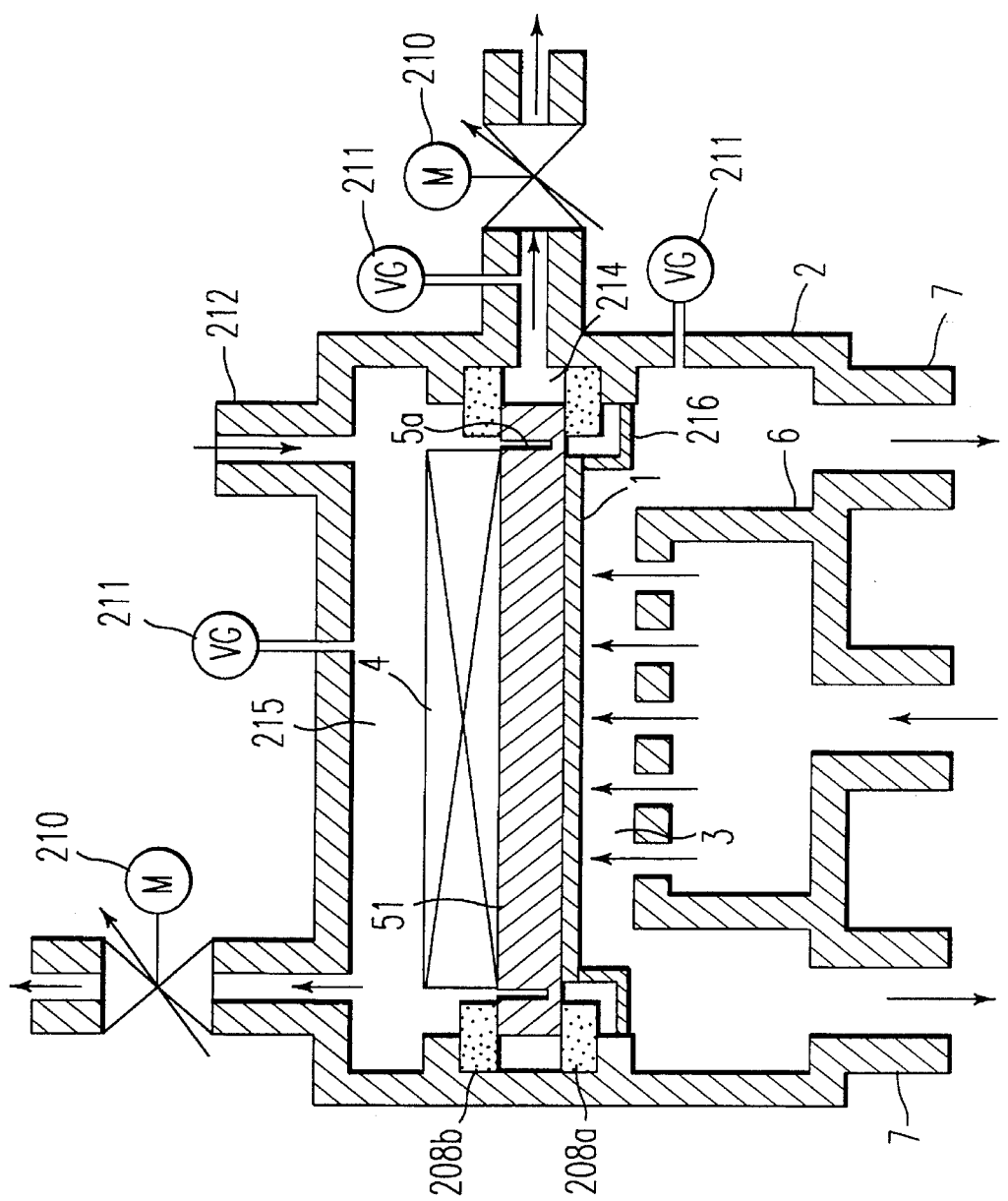
FIG. 24 is a sectional view showing a seventeenth preferred embodiment according to the present invention.

FIG. 24 is a sectional view of a semiconductor producing apparatus of this preferred embodiment, where 51 denotes a partition member having a ring-like concave shaped groove 5a formed on its heat receiving surface side. The wafer 1 is held by a mechanical holding member 216, for example, in contact with the partition member 51.

In this semiconductor producing apparatus, since the thermal resistance in the surface of the partition member 51 can be adjusted, the uniformity of the temperature distribution of the partition member 51 is improved to improve the uniformity of the temperature distribution in the surface of the wafer 1.

Eighteenth Preferred Embodiment

Figure 25:
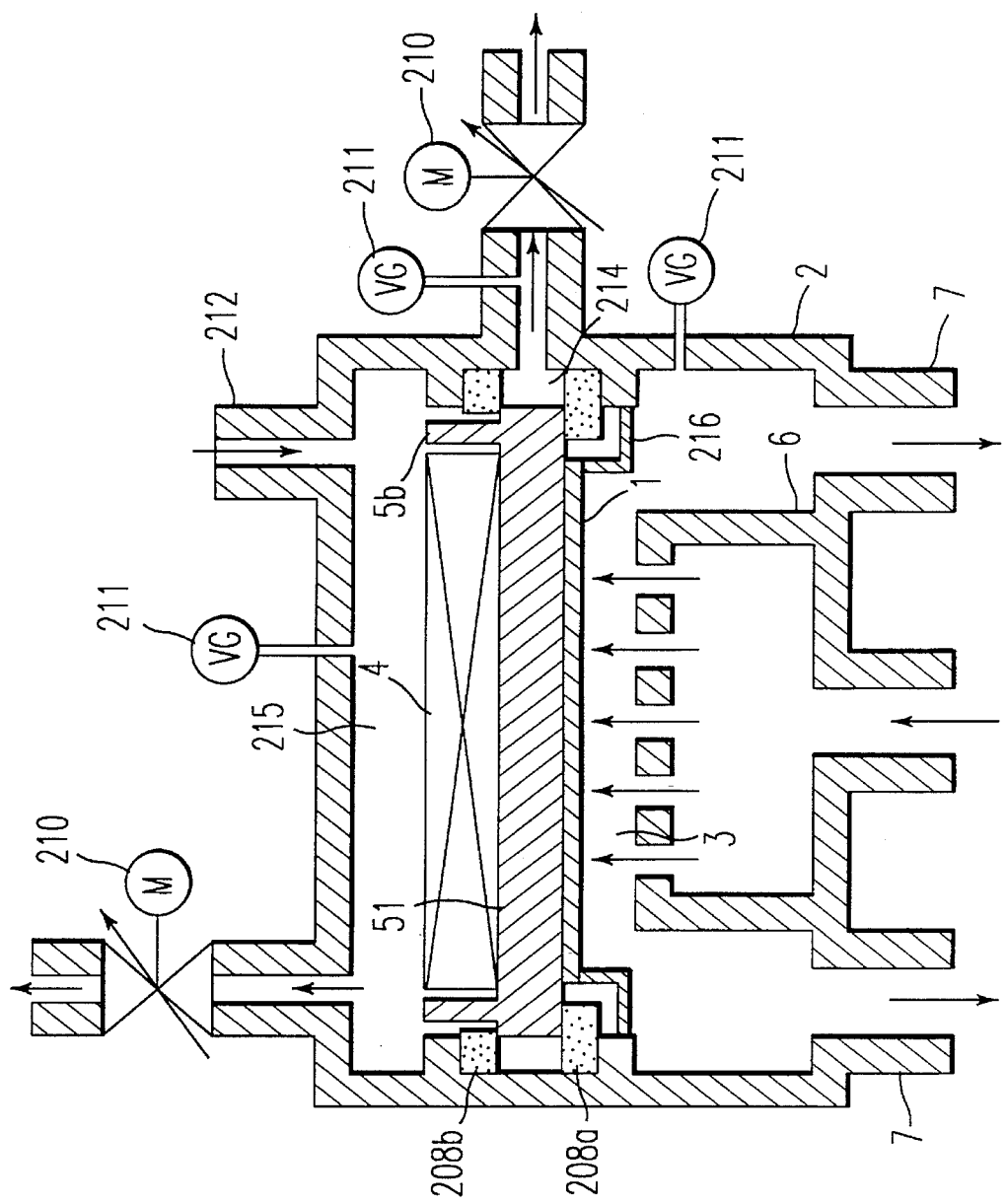
FIG. 25 is a sectional view showing an eighteenth preferred embodiment according to the present invention.

FIG. 25 is a sectional view of a semiconductor producing apparatus of this preferred embodiment, where the wafer heating source 4 is a heater. A convex portion 5b is provided on the heater side of the partition member 51, for example, and the distance between the partition member 51 and the heater 4 is adjusted in the heater surface. Also, the wafer 1 is held by a mechanical holding member 216, for example, in contact with the partition member 51.

In this semiconductor producing apparatus, the thermal resistance in the plane between the partition member 51 and the heater 4 can be adjusted and the uniformity of the temperature distribution of the partition member 51 can be improved by capturing the infrared ray emitted from the side of the heater 4 to improve the uniformity in the temperature distribution in the surface of wafer 1.

Nineteenth Preferred Embodiment

Figure 26:
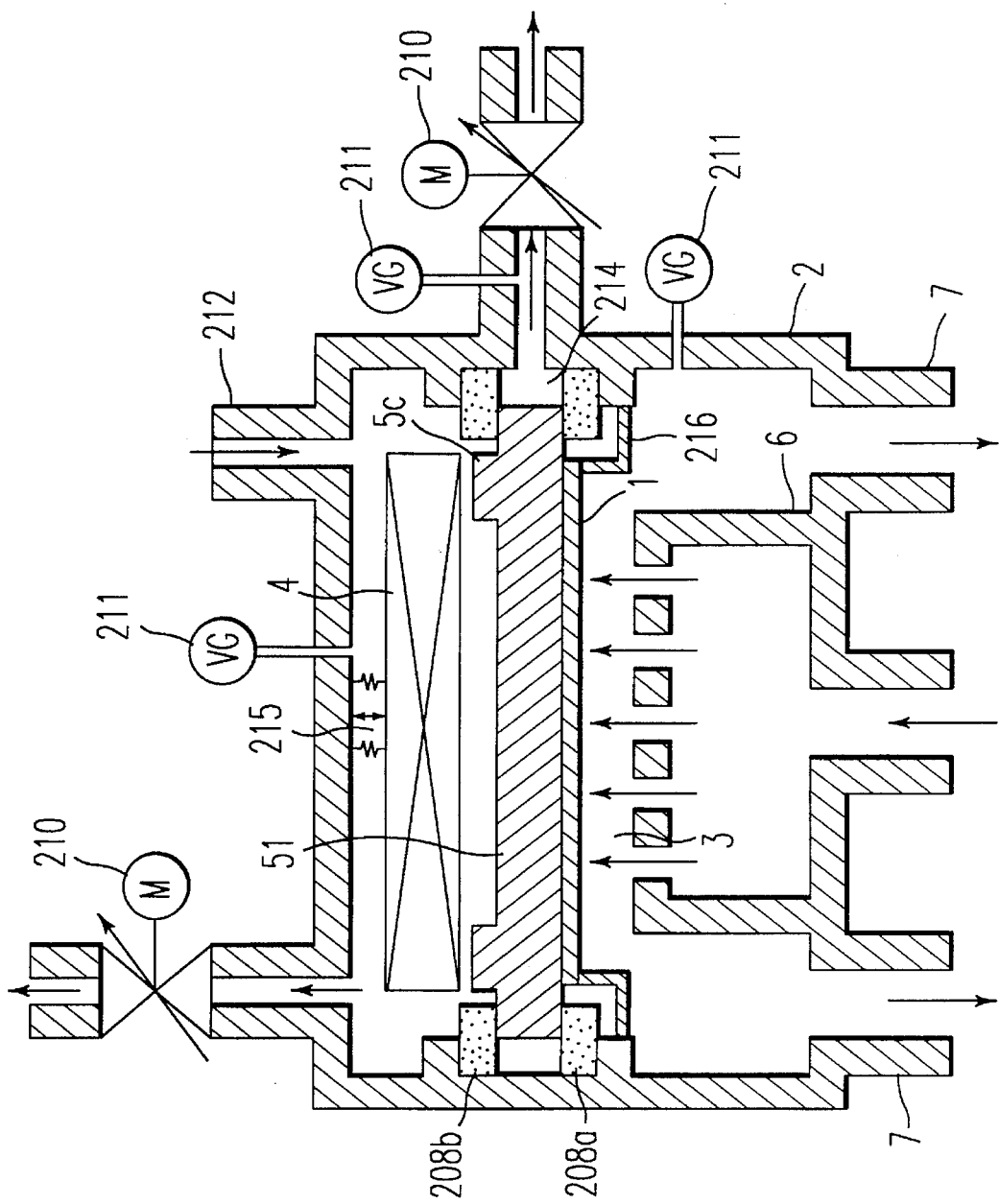
FIG. 26 is a sectional view showing a nineteenth preferred embodiment according to the present invention.

FIG. 26 is a sectional view of a semiconductor producing apparatus of this preferred embodiment, where a heater is used as a wafer heating source 4. A convex portion 5c is formed on the partition member 51 on the heater side, for example, to receive the infrared ray emitted from the side of the heater 4. As a wafer holding mechanism, a mechanical holding member 216 is used, for example, to set the wafer 1 in contact with the partition member 51.

Also in this semiconductor producing apparatus, the heat resistance in the plane between the partition member 51 and the heater 4 can be adjusted, and the temperature distribution uniformity of the partition member 51 is improved by capturing the infrared ray emitted from the side of heater 4 to improve the uniformity of the temperature distribution in the surface of the wafer 1.

Twentieth Preferred Embodiment

Figure 27:
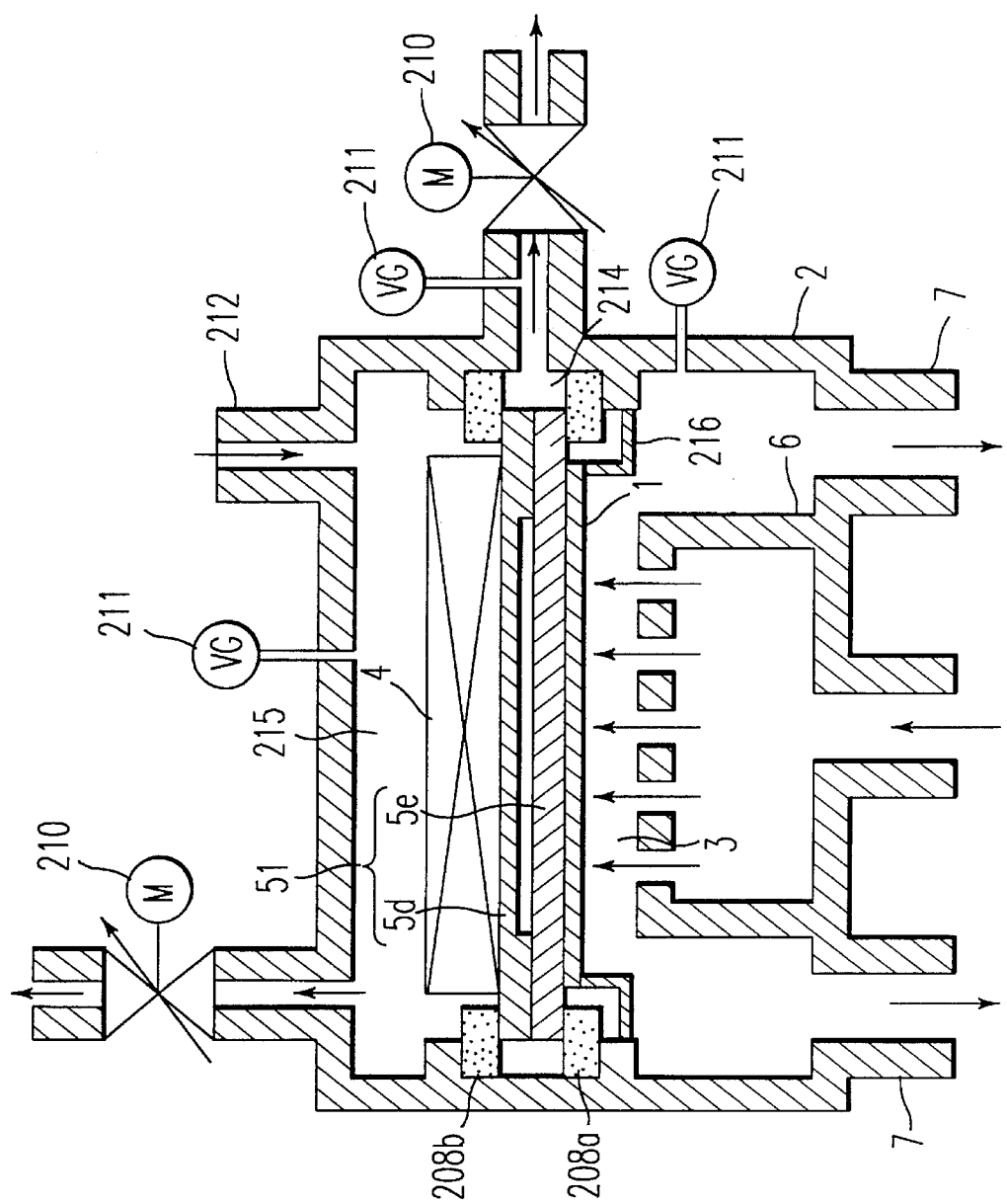
FIG. 27 is a sectional view showing a twentieth preferred embodiment according to the present invention.

FIG. 27 is a sectional view of a semiconductor producing apparatus of this preferred embodiment, where 5d and 5e denote partition members which construct the partition member 51 and a heater is used as a wafer heating source 4. The wafer 1 is held by using a mechanical holding member 216, for example.

In the semiconductor producing apparatus of this preferred embodiment, since the partition member 51 includes at least two members 5d and 5e, the uniformity in the temperature distribution in the partition member surface is improved to improve the uniformity in the temperature distribution in the surface of wafer 1.

Twenty-First Preferred Embodiment

Figure 28:
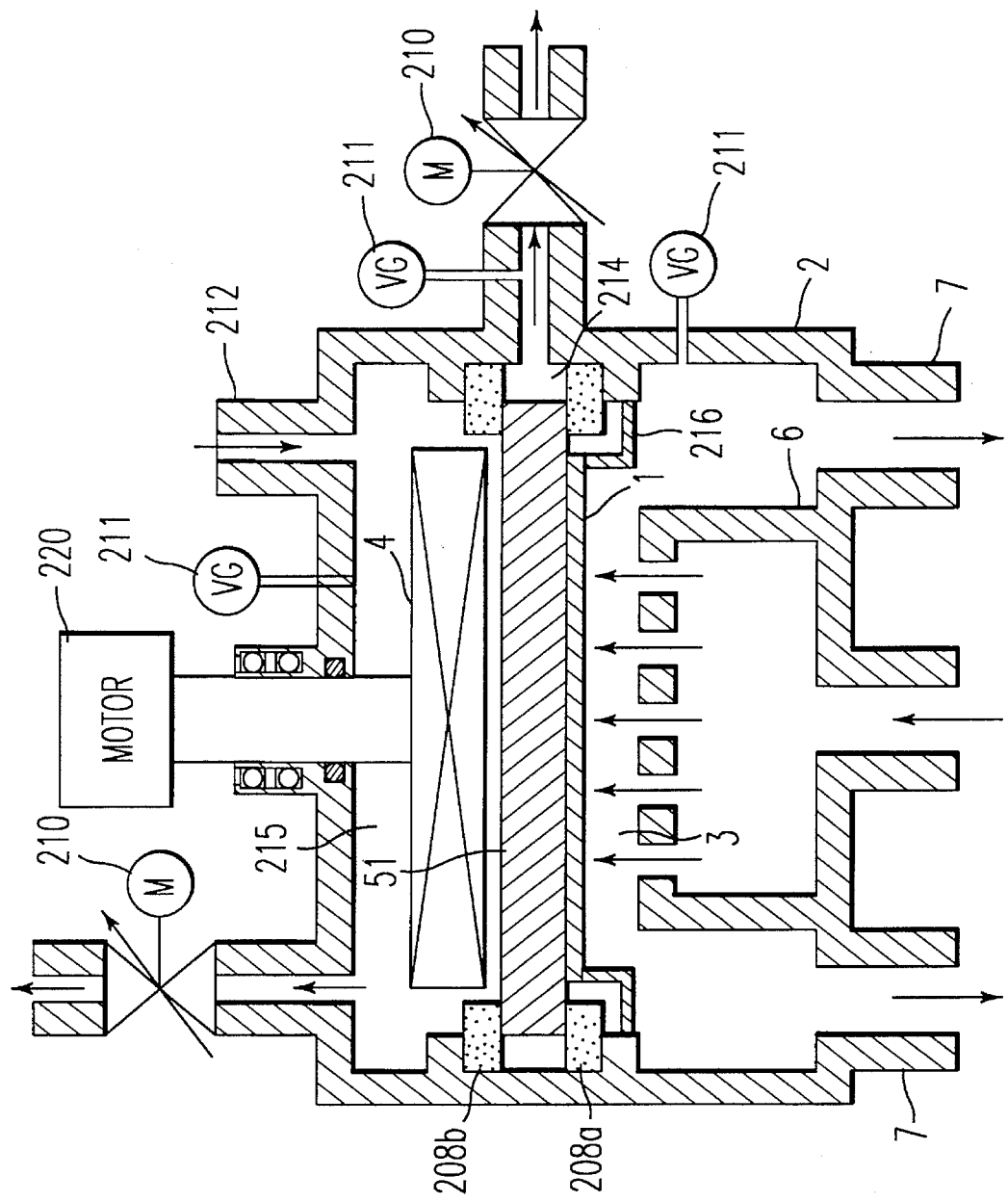
FIG. 28 is a sectional view showing a twenty-first preferred embodiment according to the present invention.

FIG. 28 is a sectional view of a semiconductor producing apparatus of this preferred embodiment, where 220 denotes a heater rotation mechanism part. The heater 4 can be rotated relatively to the partition member 51 by the heater rotation mechanism part 220. The wafer 1 is held with a mechanical holding member 216, for example.

In this semiconductor producing apparatus, the unevenness of the heat generation distribution in the circumference direction of the wafer heating source 4 is corrected by rotating the wafer heating source 4, and the uniformity in the temperature distribution of the partition member 51 is improved to improve the uniformity in the temperature distribution in the surface of the wafer 1.

Twenty-Second Preferred Embodiment

Figure 29:
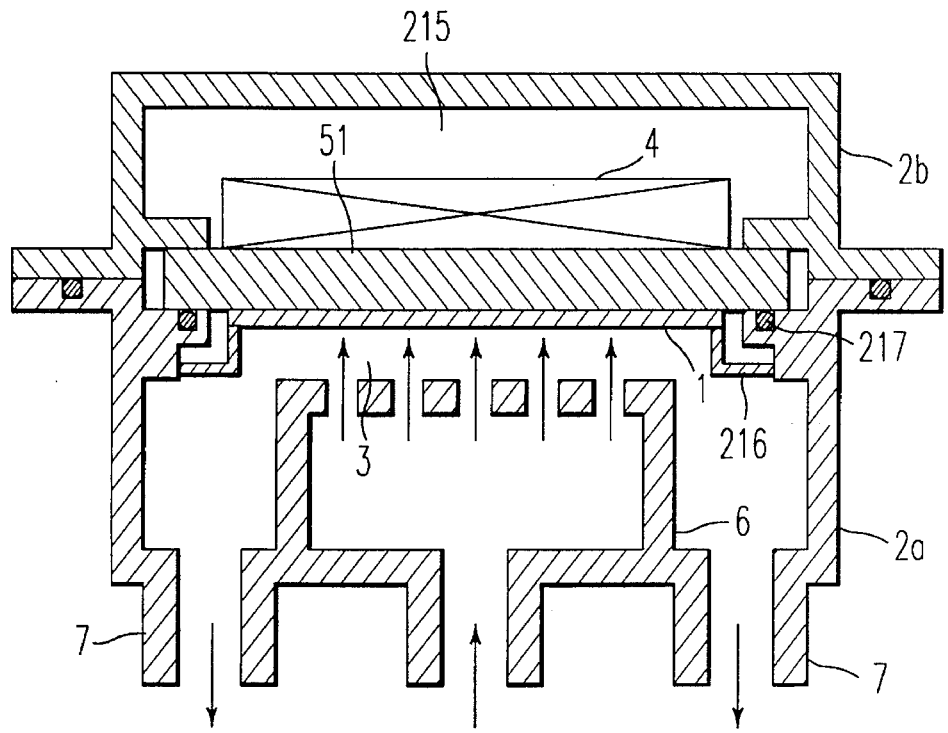
FIG. 29 is a sectional view showing a twenty-second preferred embodiment according to the present invention.

FIG. 29 is a sectional view of a semiconductor producing apparatus of this preferred embodiment, where the partition member 51 separates the heat source chamber 215 and the reaction space 3 to prevent contamination of wafer 1 caused by gas coming in and out and impurity. In this preferred embodiment a seal of the partition member 51 and the reaction chamber 2a is accomplished using an o-ring 217 or a gasket.

Twentieth-Third Preferred Embodiment

Figure 30:
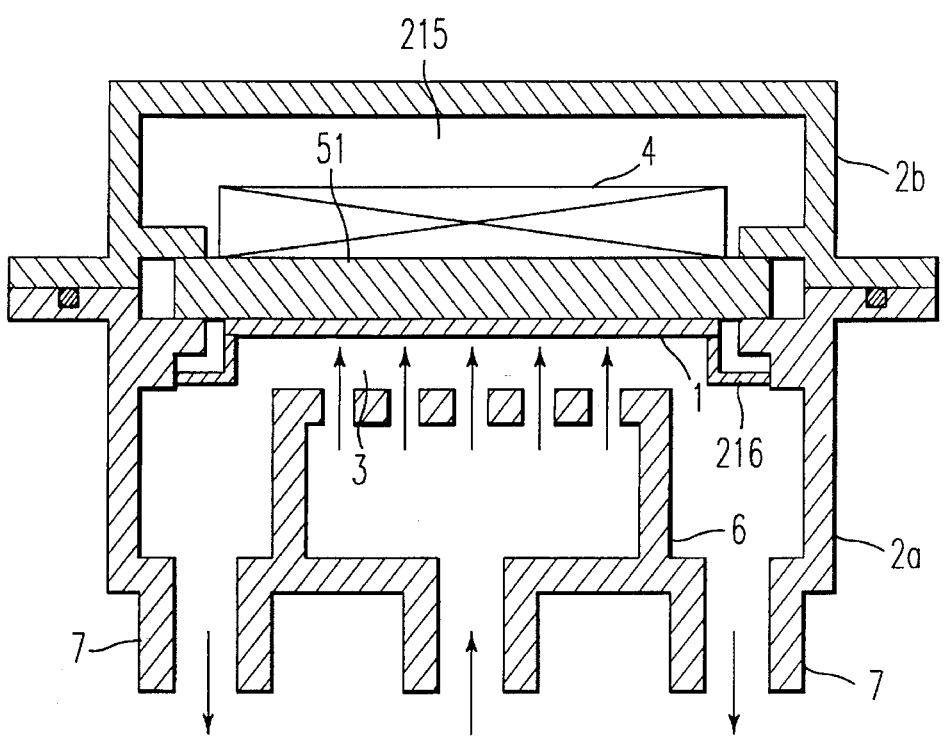
FIG. 30 is a sectional view showing a twenty-third preferred embodiment according to the present invention.

FIG. 30 is a sectional view of a semiconductor producing apparatus of this preferred embodiment. In this preferred embodiment, a seal of the partition member 51 and the reaction chambers 2a and 2b is accomplished by surface seal. Other sealing method for separating the heat source chamber 215 and the reaction space 3 using the partition member 51 can also be used.

Twenty-Fourth Preferred Embodiment

Figure 31:
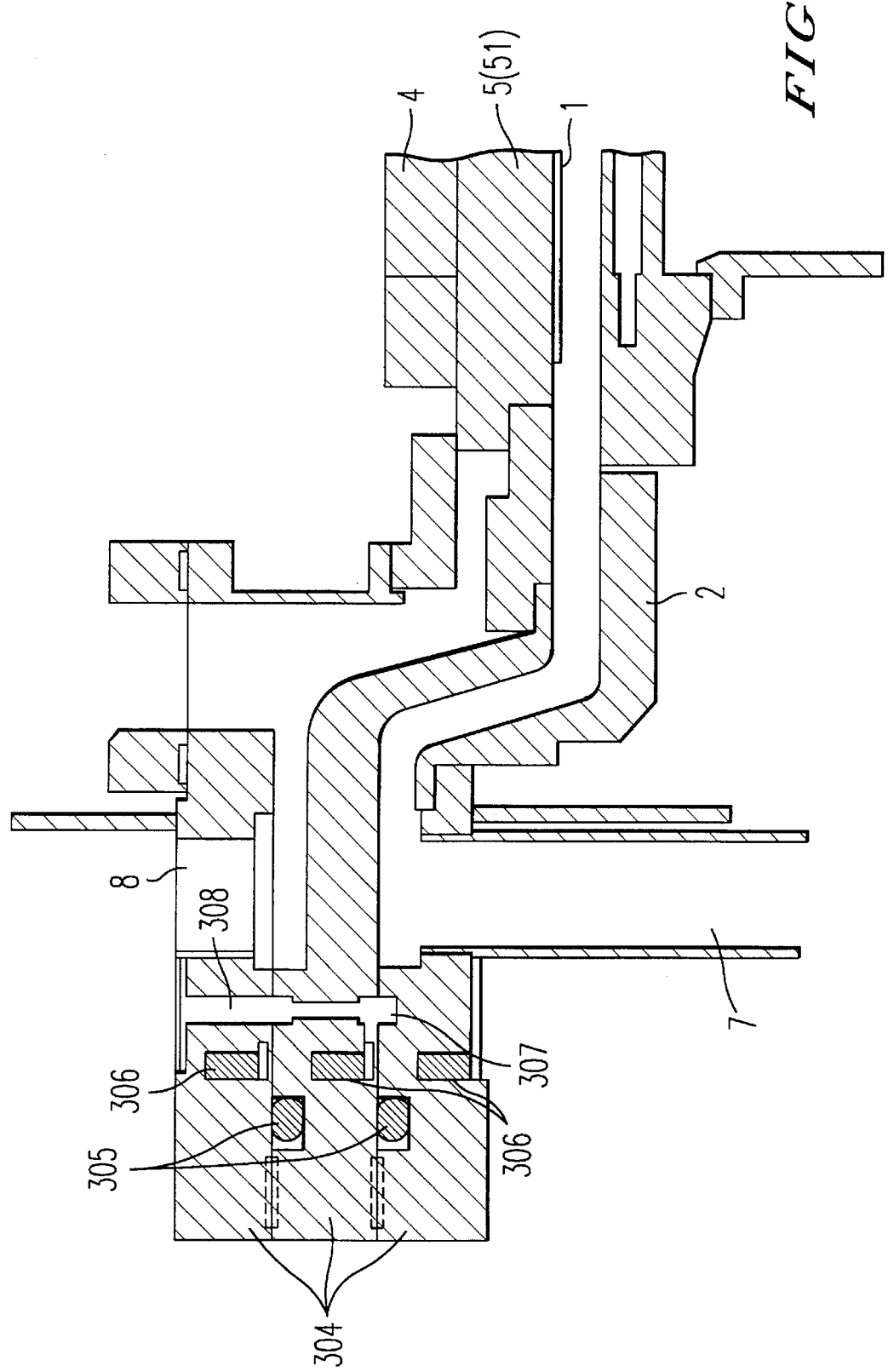
FIG. 31 is a sectional view showing a twenty-fourth preferred embodiment according to the present invention.

FIG. 31 is a sectional view showing a gas seal portion of a semiconductor producing apparatus of this preferred embodiment. In FIG. 31, a vacuum chuck 5 also serves as a partition member. 304 denotes a flange, 305 denotes an o-ring serving as gas seal, 306 denotes a water cooling portion for cooling the o-ring, 307 denotes a vacuum exhaust groove provided over the entire inner periphery of the gas seal, 308 denotes a gas flow path for vacuum exhausting the vacuum exhaust groove 307, 7 denotes a reaction gas exhaust path and 8 denotes a vacuum chuck exhaust path.

Next, its operation will be described. When forming a thin film on the wafer 1, the wafer 1 is conveyed into the reaction chamber 2, the reaction chamber 2 is held at a low pressure about several tens Torr, and the wafer 1 is heated by the wafer heating source 4. While heating the wafer 1, the temperature of the side wall is controlled to approximately 200° C. by a side wall heating heater (not shown). On the other hand, the gap portion of the upper and lower surface of the flange 304 from the gas seal portion to the reaction chamber 2 is vacuum evacuated by a vacuum pump (not shown) through the vacuum exhaust groove 307 and the gas flow path 308 to implement a predetermined pressure or lower. Subsequently, reaction gas is introduced into the reaction chamber 2 to cause thermal chemical reaction on the wafer 1 to form a thin film.

At this time if the inner wall of the reaction chamber 2 is controlled at a predetermined temperature $T_\chi$ or higher, ammonium chloride dose not attach on the inner wall as solid but can be discharged out of the reaction chamber 2 through the reaction gas exhaust path 7 in the form of gas. As described above, FIG. 58 is a graph showing relation between saturated vapor pressure and temperature of ammonium chloride ($NH_4Cl$) which is by-product in reaction between dichlorosilane ($SiH_2Cl_2$) gas and ammonia ($NH_3$) in forming a silicon nitride ($Si_3N_4$). It is shown that the temperature is about 211° C. when the saturated vapor pressure equal to 10 Torr which is the pressure of the reaction chamber 2. So, it is preferable to set the temperature $T_\chi$ to 211° C.

Also by controlling the water pass amount of the water cooling portion 306, the temperature in the vicinity of the o-ring 305 can be decreased approximately to 100° C. which is in the o-ring using range. Furthermore, even when it is cooled to about 100° C. as mentioned above, if the gap portion between the surfaces of the flange 304 from the gas seal portion to the reaction chamber 2 is vacuum exhausted to bring the pressure therein to 0.02 Torr or lower, ammonium chloride can be discharged without attaching as solid on the seal portion as seen from the saturated vapor pressure characteristics of ammonium chloride described above.

Now, if the gap portion surfaces of the flange 304 from the gas seal portion to the reaction chamber 2 is vacuum exhausted, depending on the degree of flow amount of reaction gas from the reaction chamber 2, effects on the reaction pressure may be concerned. However, in the reaction chamber 2 for accommodating a wafer of 8-inch size, for example, the average gap is about 5 μm at facing metal surfaces of the flange 304. Accordingly, with conductance thereof calculated, and with the pressure in the reaction chamber 2 being 10 Torr and the pressure in the vacuum exhaust groove 307 being 0.02 Torr, when the reaction gas flow rate from the reaction chamber 2 is calculated according to the expression (1) below, a value 1.54 SCCM is obtained, which is a very small value.

$$Q=C(P1-P2) \tag{1}$$

In the expression (1), $P_1$ represents pressure in the reaction chamber 2, $P_2$ represents pressure of the vacuum exhaust groove 307, and C represents conductance in the gap portion from the reaction chamber 2 to the vacuum exhaust groove 307.

Now, since the value 1.54 SCCM is 1/100 or smaller as compared to the gas flow rate of the reaction gas introduced into the reaction chamber 2, the effects on the reaction pressure and the reaction process can be neglected. When a thin film was actually formed using this apparatus, no undesirable effect was produced on the reaction chamber pressure and the reaction process and no attachment of ammonium chloride, which is a by-product, was recognized in the gap portion of the surfaces of the flange 304 from the gas seal portion to the reaction chamber 2.

Twenty-Fifth Preferred Embodiment

Figure 32:
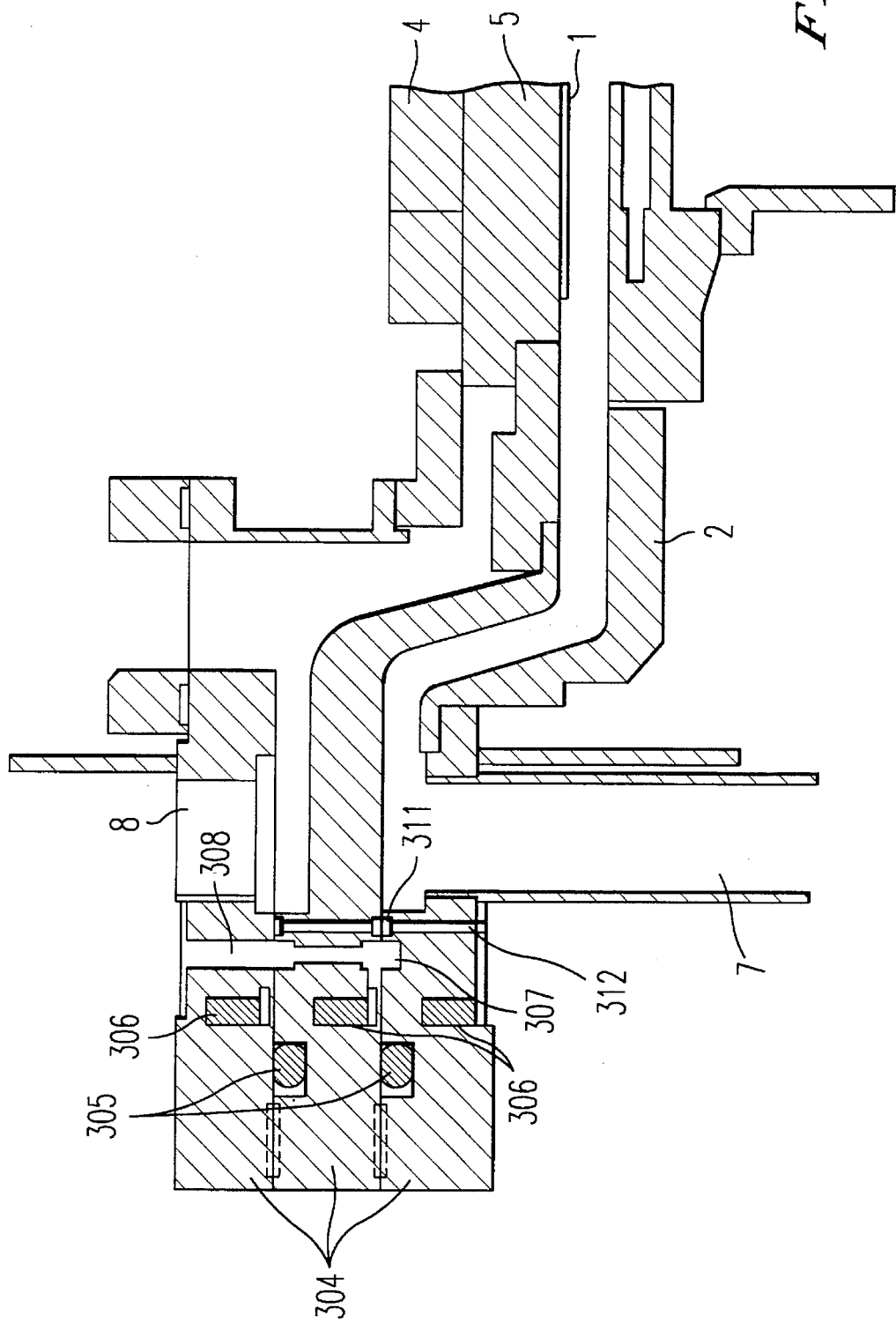
FIG. 32 is a sectional view showing a twenty-fifth preferred embodiment according to the present invention.

FIG. 32 is a sectional view showing a gas seal portion of a semiconductor producing apparatus of this preferred embodiment. 311 denotes an inactive gas introducing groove provided on the entirety of periphery further inner than the vacuum exhaust groove 307, and 312 denotes an inactive gas introducing path. By supplementing part of gas exhausted from the vacuum exhaust groove 307 with inactive gas introduced into the inactive gas introducing groove 311, the amount of reaction gas flowing from the reaction chamber 2 can be suppressed. Accordingly, it works effectively when the pressure in the reaction chamber 2 is relatively high or when the total flow amount of reaction gas used is small.

Twenty-Sixth Preferred Embodiment

Figure 33:
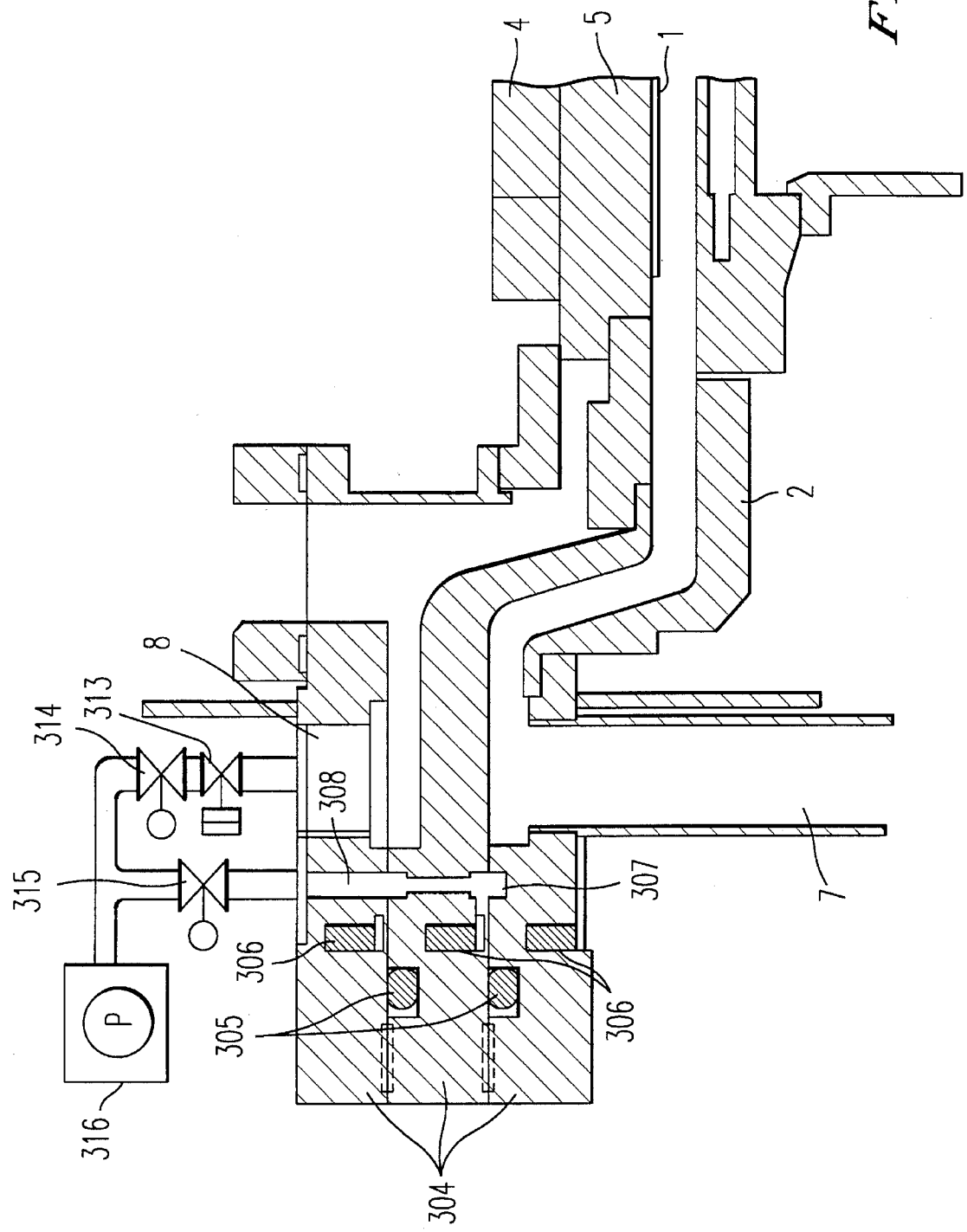
FIG. 33 is a sectional view showing a twenty-sixth preferred embodiment according to the present invention.

FIG. 33 is a sectional view showing a gas seal portion of a semiconductor producing apparatus of this preferred embodiment. In FIG. 33, 313 denotes an air operating valve for opening and closing the vacuum chuck exhaust path 8, 314 and 315 denote manually operated valves, and 316 denotes a vacuum pump for vacuum exhaust of the vacuum chuck 5 and also of the vacuum exhaust groove 307. In this way, the vacuum pump 316 also serves as a vacuum chuck exhaust pump, another pump dose not have to be provided, with the result that the vacuum exhaust system is not complicated, and the cost can be low.

Twenty-Seventh Preferred Embodiment

FIG. 34 is a sectional view of a semiconductor producing apparatus used in this preferred embodiment. In FIG. 34, 401 denotes a main body of the apparatus, and 402 denotes a heater for heating the wafer 1 through a susceptor 51 (a wafer holding mechanism). 404 denotes a ring-like adiabatic member for adiabatically holding the susceptor 52, 6 denotes a gas nozzle for supplying reacting gas which is material of thin films in a shower manner, and 406 denotes a bar-shaped supporting pin for supporting the wafer 1, in which there are other three pins (not shown) pressing the outer peripheral part of the wafer 1. The upper end of bellows 407a is connected with the lower part of the gas nozzle 6 by means of welding, the lower end of the bellows 407a is welded with a flange 427a, which is fixed at a lower part of the main body 401 with a gasket not shown interposed therebetween with a bolt.

408a denotes a support having a male screw at its upper part which is screwed with a flange 427a having a female screw. The support 408a has a lower end which fixes a housing 417 with a nut not shown. 409 denotes a rod of a cylinder 410, of which collar at the center is welded with the upper end of a bellows 407b, and the lower end of the bellows 407b is welded with the flange 427b and fixed to the lower part of the apparatus main body 401 with a bolt with a gasket not shown interposed therebetween. The support pin 406 is fixed to the upper end of the rod 409.

411 denotes a switch for detecting an original position of the gas nozzle 6, which is fixed to the housing 417 with a switch provision plate 412. 413 denotes a pulse motor which is fixed to the housing 417 with a support 408b, and a gear 414b of a driving shaft of the pulse motor 413 meshes with a gear 414a tightened with a screw shaft 415. The screw shaft 415 is supported by a bearing 416 fixed at the center of the housing 417, and the screw portion of the screw shaft 415 meshes with a nut 428. The nut 428 has a collar, which serves as a dog which abuts on a contact of the switch 411. The nut 428 is fixed to the lower portion of the gas nozzle 6.

418 denotes a cleaning gas introduction flange for introducing cleaning gas into the apparatus, which is fixed to the lower part of the main body of the apparatus 401 with a bolt with a gasket interposed therebetween. A coupling 419a is connected to the cleaning gas introducing flange 418 in the inner side of the apparatus, and a flexible tube 420 connected to the coupling 419a is connected to the lower part of the gas nozzle 6 through a coupling 419b. A cleaning gas ring nozzle 421 which is a ring-like groove is provided on the top of the gas nozzle 6, where a cleaning gas jet hole is opened facing upwards. 426 denotes a reaction gas introducing piping connected to the lower part of the gas nozzle 6 and 425 denotes an exhaust hole for exhausting reaction gas.

In such a semiconductor producing apparatus configured as described above, if the wafer contact surface of the susceptor 51 on which surplus deposition is not attached is covered with the wafer 1 when the cleaning gas is caused to flow, the cleaning gas is prevented from contacting the wafer contact surface. Accordingly, the disadvantage that the wafer contact surface of the susceptor 52 on which surplus deposition is not attached is etched in cleaning can be avoided. The wafer 1 can be a silicon wafer or a quartz wafer.

Twenty-Eighth Preferred Embodiment

FIG. 35 is a sectional view showing another operating condition of the semiconductor producing apparatus shown in FIG. 34 described in the twenty-seventh preferred embodiment. In this preferred embodiment, in cleaning, the wafer 1 is removed, and the pulse motor 413 is driven to lift the gas nozzle 6 to make the top surface of the gas nozzle 6 abut on the bottom surface of the susceptor 51.

With such operation, the top surface of the gas nozzle 6 covers the wafer contact surface of the susceptor 51 on which surplus deposition is not attached when the cleaning gas is flowed to prevent the cleaning gas from contacting therewith as possible, so that the same effects can be obtained as the twenty-seventh preferred embodiment.

Twenty-Ninth Preferred Embodiment

FIG. 36 is a sectional view of a semiconductor producing apparatus used in this preferred embodiment. 429a denotes an inactive gas introducing piping connected to the lower part of the gas nozzle 6 and 429b denotes an inactive gas introducing tube connected to the upper wall, which is one of the upper and lower parts of the main body 401 separated with the susceptor 51 and the adiabatic member 404. 430 denotes an inactive gas introducing path for flowing inactive gas which is opened in the susceptor 51. Other structure is the same as the twenty-seventh preferred embodiment.

In the semiconductor producing apparatus configured as described above, when cleaning gas is flowed, if inactive gas is supplied into the inactive gas introducing tube 429b, the inactive gas can be supplied into the vicinity of the wafer contact surface of the susceptor 51 on which no surplus deposition is attached through the inactive gas introducing path 430, to decrease the cleaning gas concentration on the wafer contact surface of the susceptor 51. Accordingly, possibility or degree of contact of the cleaning gas onto the wafer contact surface of the susceptor 51 can be further decreased.

Thirtieth Preferred Embodiment

Figure 59:
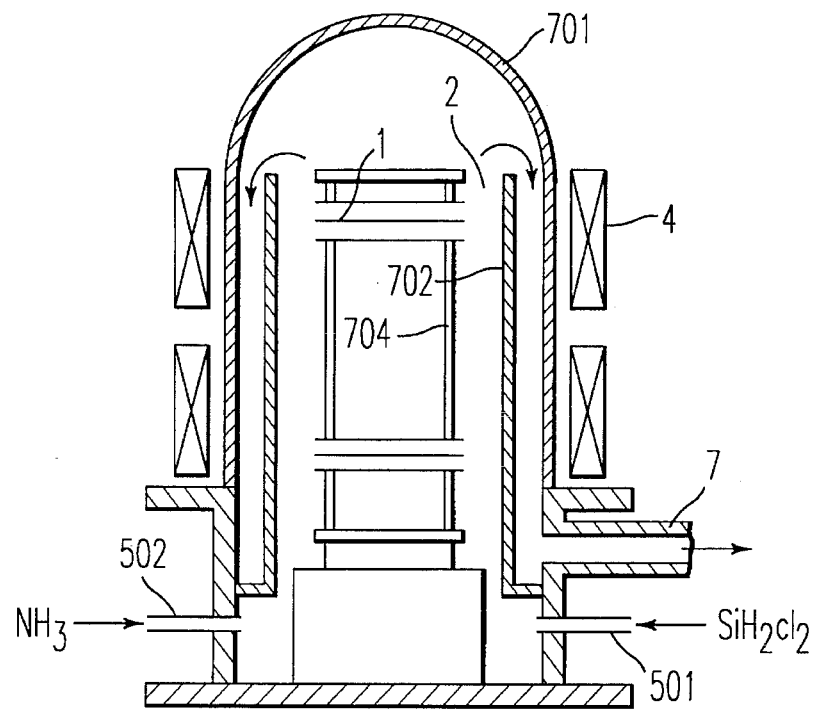
FIG. 59 is a diagram showing another prior art.
Figure 60:
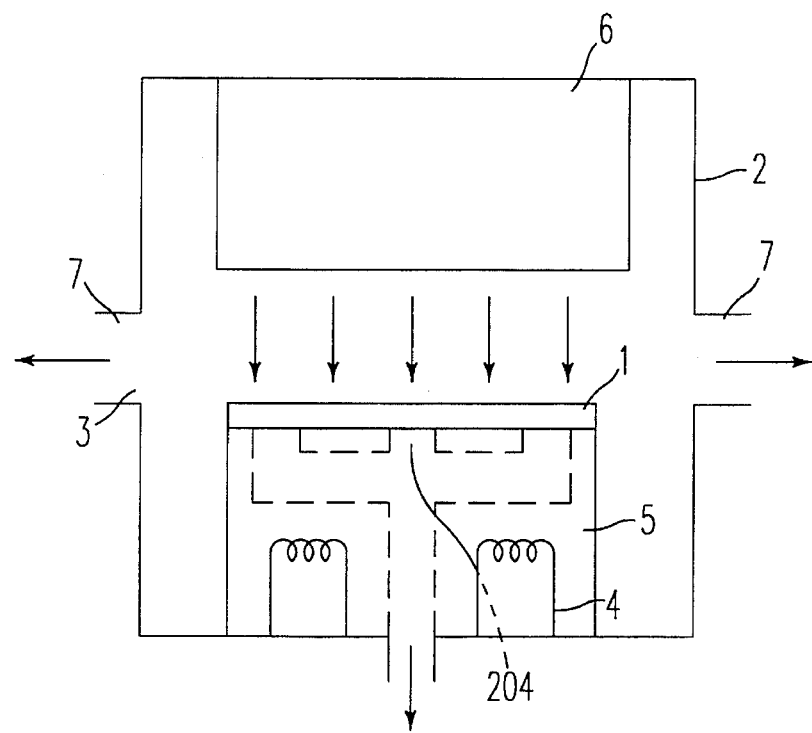
FIG. 60 is a diagram showing another prior art.
Figure 61:
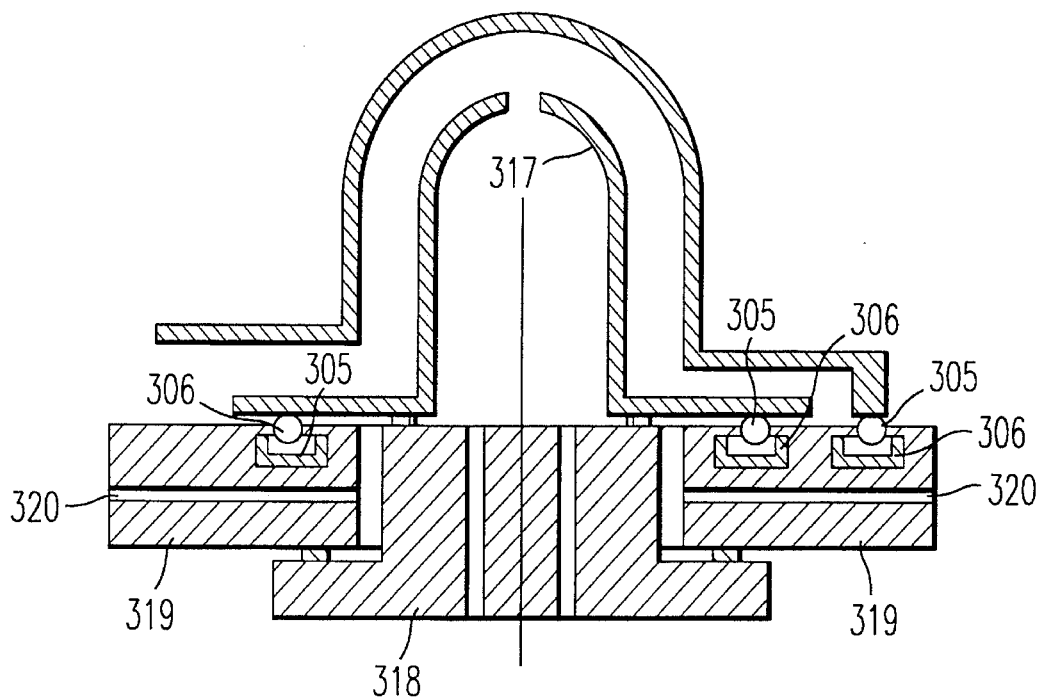
FIG. 61 is a diagram showing another prior art.
Figure 62:
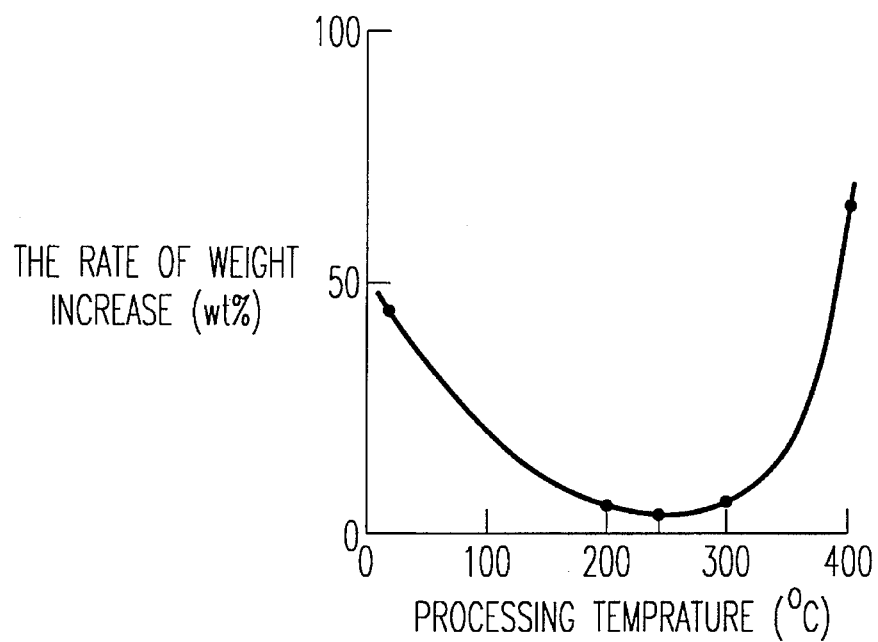
FIG. 62 is a diagram showing a relation between processing temperature and weight increase percentage in a prior art.
Figure 63:
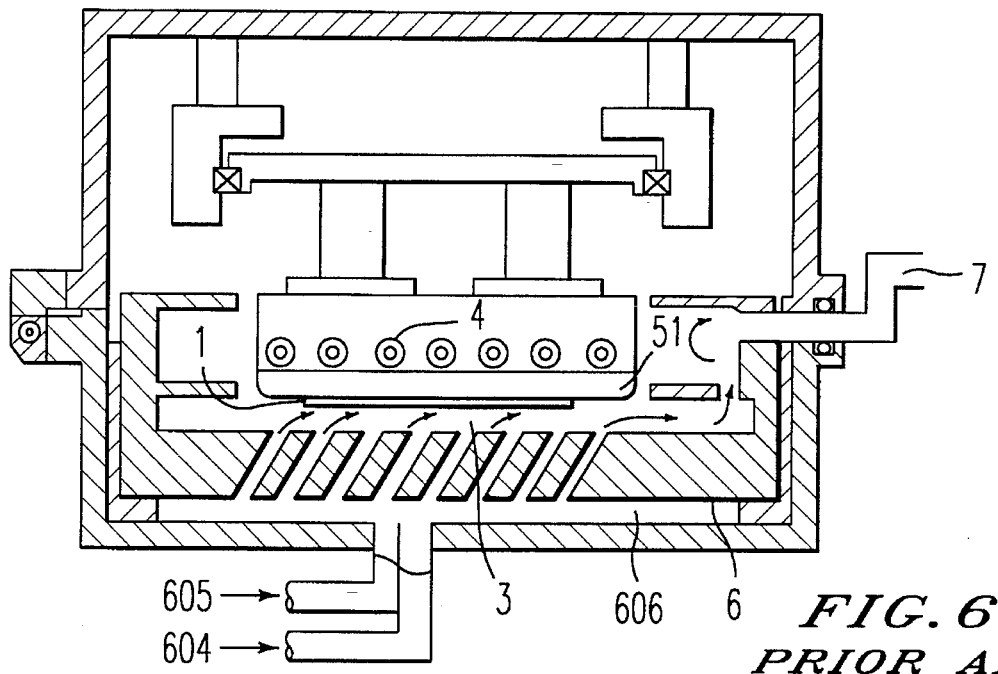
FIG. 63 is a diagram showing another prior art.

FIG. 37 is a sectional view of a semiconductor producing apparatus of this preferred embodiment. The same (or corresponding) parts are indicated with the same reference characters as in the conventional apparatus shown in FIG. 59 and description thereof is not repeated. A mixing chamber 503, a mixing chamber heater 507 covering and heating the mixing chamber 503 to a reaction temperature, a pressure gage 715 for monitoring pressure in the mixing chamber 503 and the like.

716 denotes a mixture gas supplying tube for introducing mixture gas from the mixing chamber 503 to the reaction space 3, in which a pressure adjusting valve 511 is provided. That is, the mixing chamber 503 of the communicates with the reaction space 3 in the reaction container 2 through the mixture gas supplying tube 716 and the pressure adjusting valve 511. Reaction gas supplying tubes 501 and 502 are connected to the mixing chamber 503. Gas introducing holes of these reaction gas supplying tubes 501 and 502 are opened to the lower part of the mixing chamber 503, respectively.

A reversing type passage going from the lower part to the upper part in the mixing chamber 503 with a plurality of collision walls 512 arranged at intervals in the mixing chamber 503.

First, temperature and pressure required to form films are set in the reaction space 3 in which a semiconductor wafer 1 is provided and the temperature in the mixing chamber 503 is increased to the temperature at which reaction gases react with each other. Then, dichlorosilane and ammonia which are reaction gases are introduced into the mixing chamber 503 through the reaction gas supplying tubes 501 and 502.

This causes a gas flow going upwards through the reversing type passage from the lower part of the mixing chamber 503. Then, the reaction gases are mixed in the mixing chamber 503 to react, and ammonium chloride is produced which causes dusts. The ammonium chloride is solidified in the mixing camber 503 and also passed through the reversing type passage in the mixing chamber 503 on the above-described gas flow to adhere on the collision walls 512. That is to say, only the mixture gas in which the ammonium chloride is omitted by the collision walls 512 is supplied into the reaction space 3 through the mixture gas supplying tube 716 and the pressure adjusting valve 511 from the mixing chamber 503.

Then, the mixture gas is introduced into the reaction space 3 from the mixture chamber 503 to form a silicon nitride film on the semiconductor wafer 1. Now, the mixture gas is changed in quality mainly to ammonia and sililamino ($SiN_xH_y$) as described above, which decreases the amount of dust in the reaction space 3 as compared to the conventional case, and furthermore, process conditions can be optimized, e.g., the temperature of the reaction chamber wall (the wall of the reaction container 2) can be set lower than the conventional apparatus, and also the pressure in the reaction space 3 can be increased than conventional apparatus.

Thirty-First Preferred Embodiment

Figure 38:
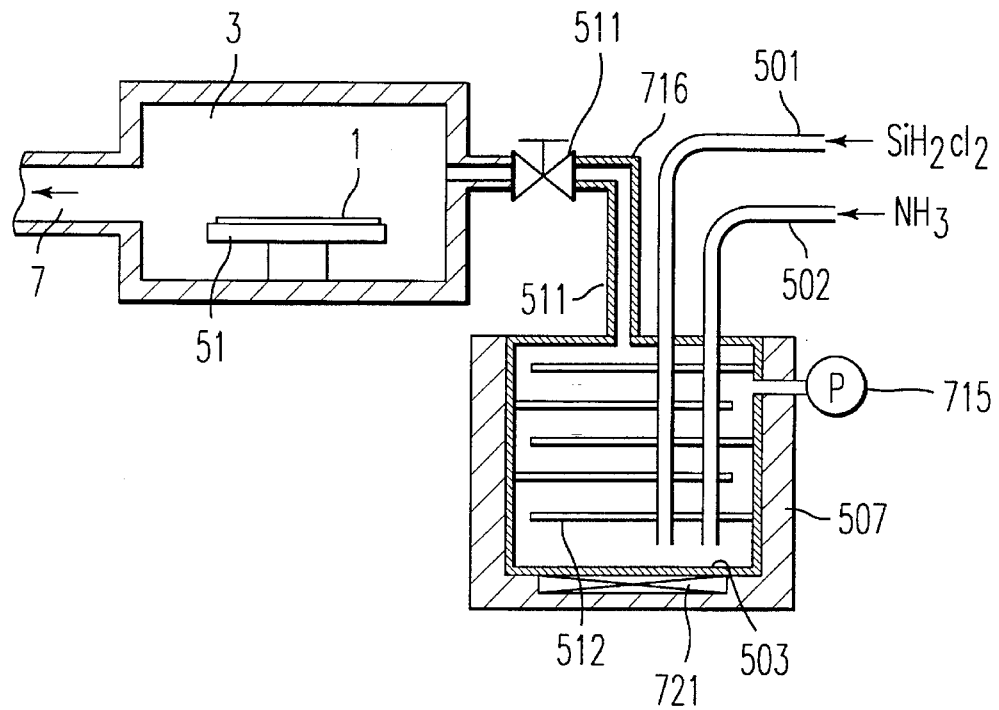
FIG. 38 is a sectional view showing a thirty-first preferred embodiment according to the present invention.

FIG. 38 is a sectional view of a semiconductor producing apparatus of this preferred embodiment. In FIG. 38, 721 denotes a cohering device for causing the by-product (ammonium chloride) produced in the mixing chamber 503 to cohere. The cohering device 721 includes an ultrasonic wave generator in this case, which is fixed in contact with the bottom portion of the mixing chamber 503.

In this preferred embodiment in which the cohering device 721 is provided in the mixing chamber 503, the ammonium chloride particles produced in the mixing chamber 503 cohere with each other to increase its particle size, so that the ammonium chloride can be efficiently collected.

Thirty-Second Preferred Embodiment

Figure 39:
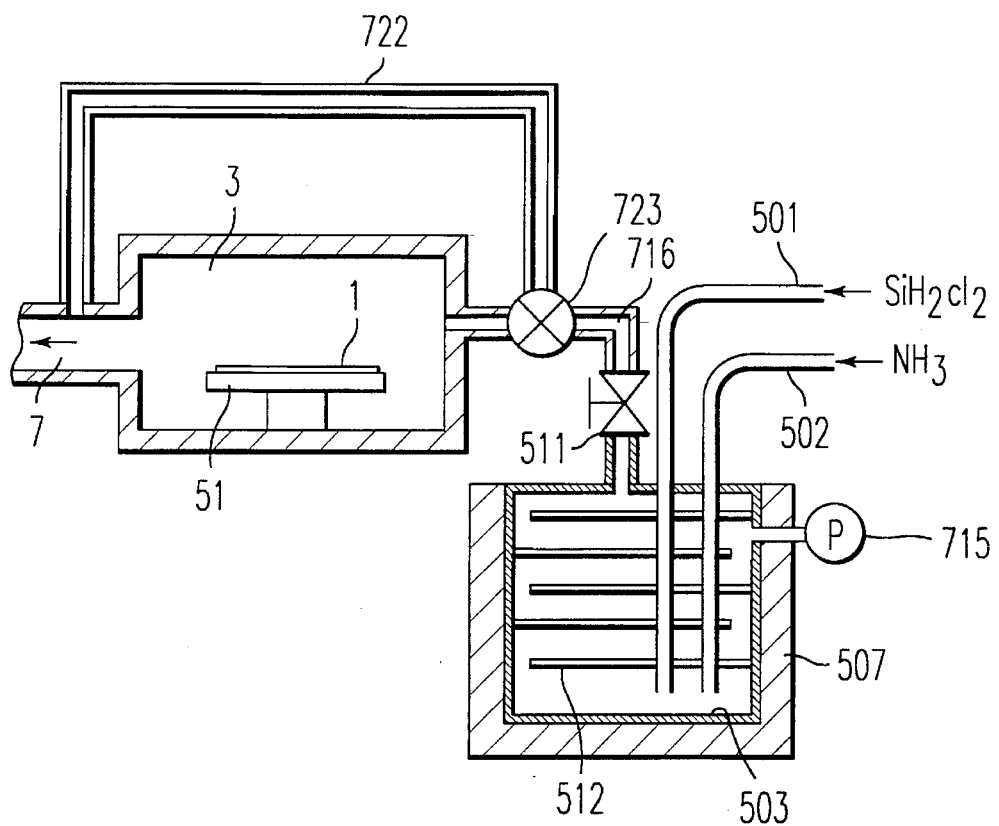
FIG. 39 is a sectional view showing a thirty-second preferred embodiment according to the present invention.

FIG. 39 is a sectional view of a semiconductor producing apparatus of this preferred embodiment. In FIG. 39, 722 denotes a by-pass tube for communicating the mixture gas supplying tube 716 and the reaction gas exhaust pass 7 bypassing the reaction space 3. This by-pass tube 722 has its one end connected to the mixture gas supplying tube 716 through the three-way valve 723 and the other end connected to the reaction gas exhaust pass 7. The three-way valve 723 is of the conventional structure for selectively flowing the mixture gas flowing out from the mixing chamber 503 to the reaction space 3 side and the by-pass tube 722.

With such structure, the ammonium chloride deposited in the mixing chamber 503 can be discharged to the exhaust system through the three-way valve 723 and the by-pass tube 722 to recover the function of the collecting. That is to say, when the flow rate of the mixture gas is decreased due to deposition of ammonium chloride, the path of the three-way valve 723 is switched to the by-pass tube 722 side, and the mixing chamber 503 is heated by the mixing chamber heater 507 to 200° C. or higher. This sublimates the ammonium chloride, which is discharged out of the apparatus by the exhaust device (an exhaust pump). Accordingly, the by-product collecting function can be maintained in a long time with the mixing chamber 503.

Thirty-Third Preferred Embodiment

Figure 40:
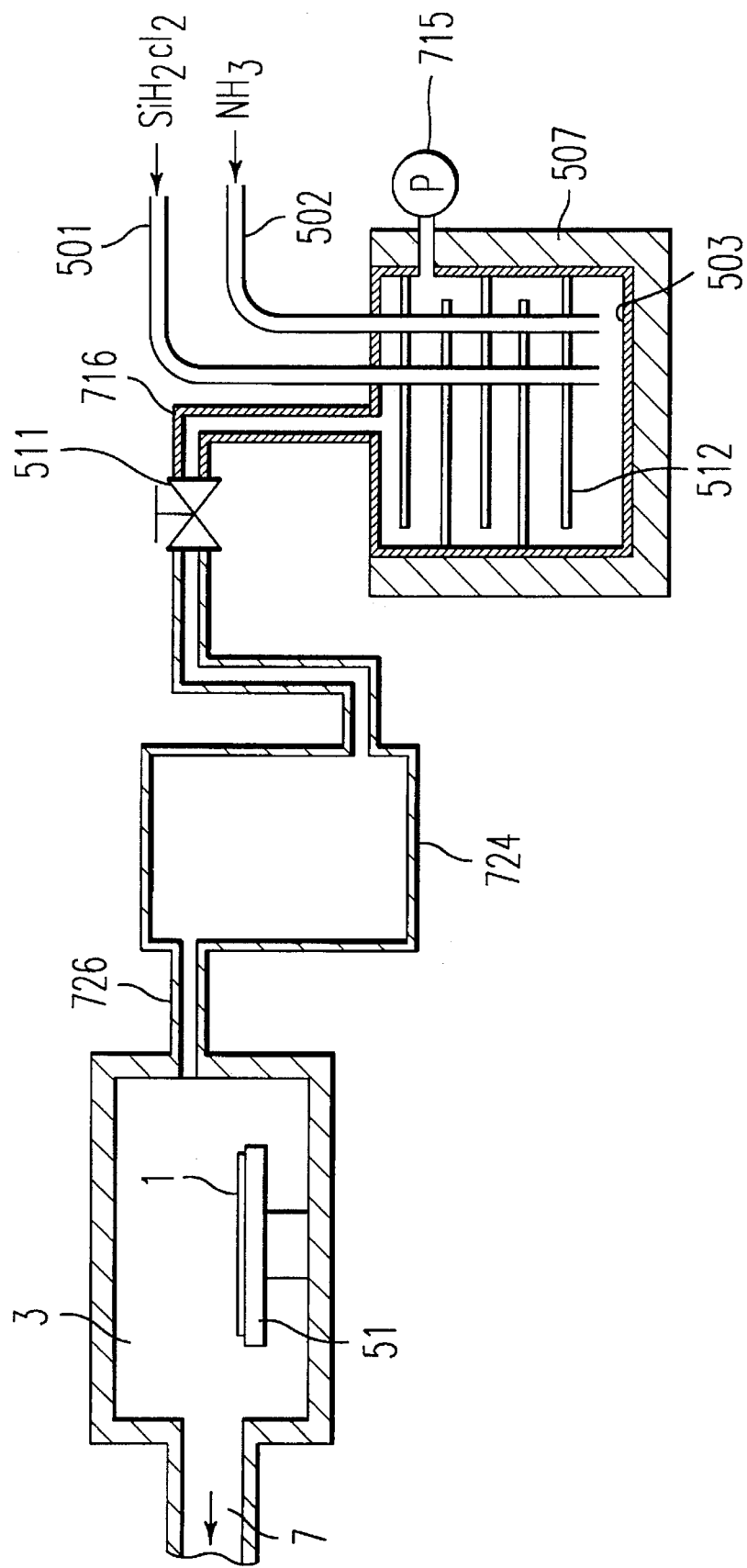
FIG. 40 is a sectional view showing a thirty-third preferred embodiment according to the present invention.

FIG. 40 is a sectional view of a semiconductor producing apparatus of this preferred embodiment. In FIG. 40, 724 denotes a gas stay bath. The downstream end of the mixture gas supplying tube 716 is opened to the lower part of the gas stay bath 724. The upper part of the gas stay bath 724 communicates with the reaction space 3 through a communication tube 726.

With such a gas stay bath 724 being interposed between the reaction space 3 and the mixing chamber 503, ammonium chloride in the form of fine particles which was not collected is precipitated and removed in the gas stay bath 724. Accordingly, the ammonium chloride does not flow into the reaction space 3 almost at all, and excellent reaction atmosphere with smaller amount of dust can be obtained.

Thirty-Fourth Preferred Embodiment

Figure 41:
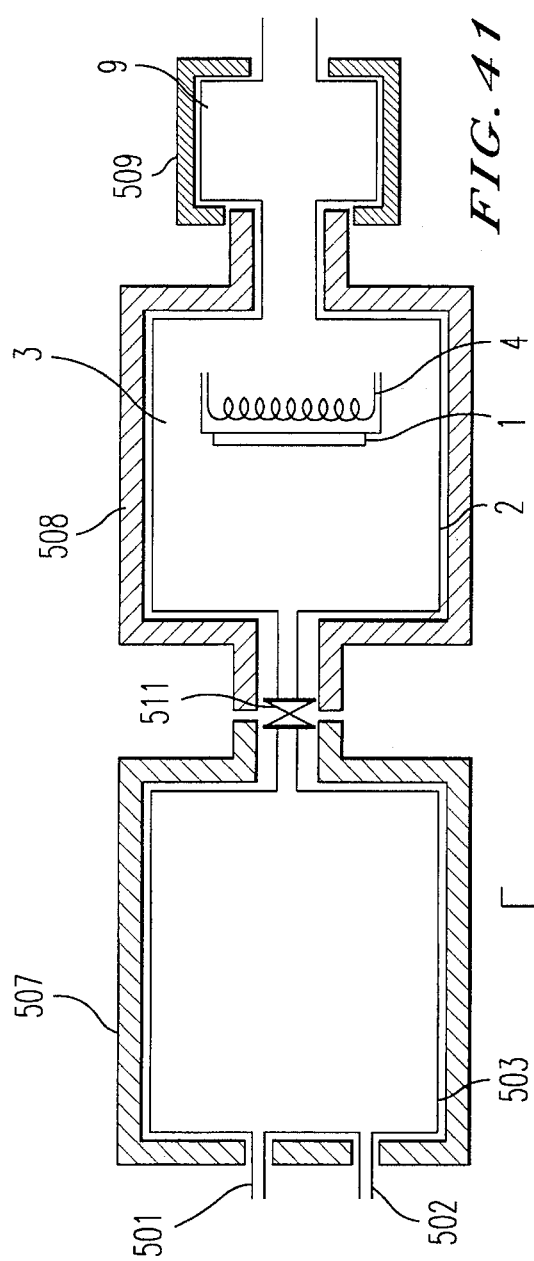
FIG. 41 is a sectional view showing a thirty-fourth preferred embodiment according to the present invention.

FIG. 41 shows a semiconductor producing apparatus used in a nitride film forming method of this preferred embodiment. In FIG. 41, 501 and 502 denote reaction gas supply tubes, 503 denotes a mixing chamber provided prior to the reaction chamber 2, 507 denotes a heater for mixing chamber, 508 denotes a reaction chamber wall heater, 509 denotes a water cooling mechanism and 511 denotes a pressure adjusting valve provided in the piping path connecting the reaction chamber 2 and the mixing chamber 503.

According to the nitride film forming method of this example, in the apparatus described above, first, while holding the temperature in the mixing camber 503 at a low temperature of approximately 20° C. and maintaining the pressure in the reaction chamber 2 at a predetermined processing pressure (usually, 1–100 Torr), reaction gases, e.g., dichlorosilane ($SiH_2Cl_2$) and ammonia ($NH_3$), are flowed from the reaction gas supplying tubes 501 and 502.

Then, these gases react in the mixing chamber 503 to produce ammonium chloride ($NH_4Cl$) and Si—N—H compound. Almost all the ammonium chloride solidifies in the mixing chamber 503, and only gas mainly containing the Si—N—H compound is transferred into the reaction chamber 2 to be decomposed over the wafer 1 heated by the wafer heating source 4 or in the reaction space 3 to form a SiN film with high purity. Accordingly, no ammonium chloride attaches in the reaction chamber 2 even if the wall of the reaction chamber 2 is not heated to high temperature, so that the reaction chamber 2 does not have to be made of expensive material which dose not corrode with chlorine.

Figure 58:
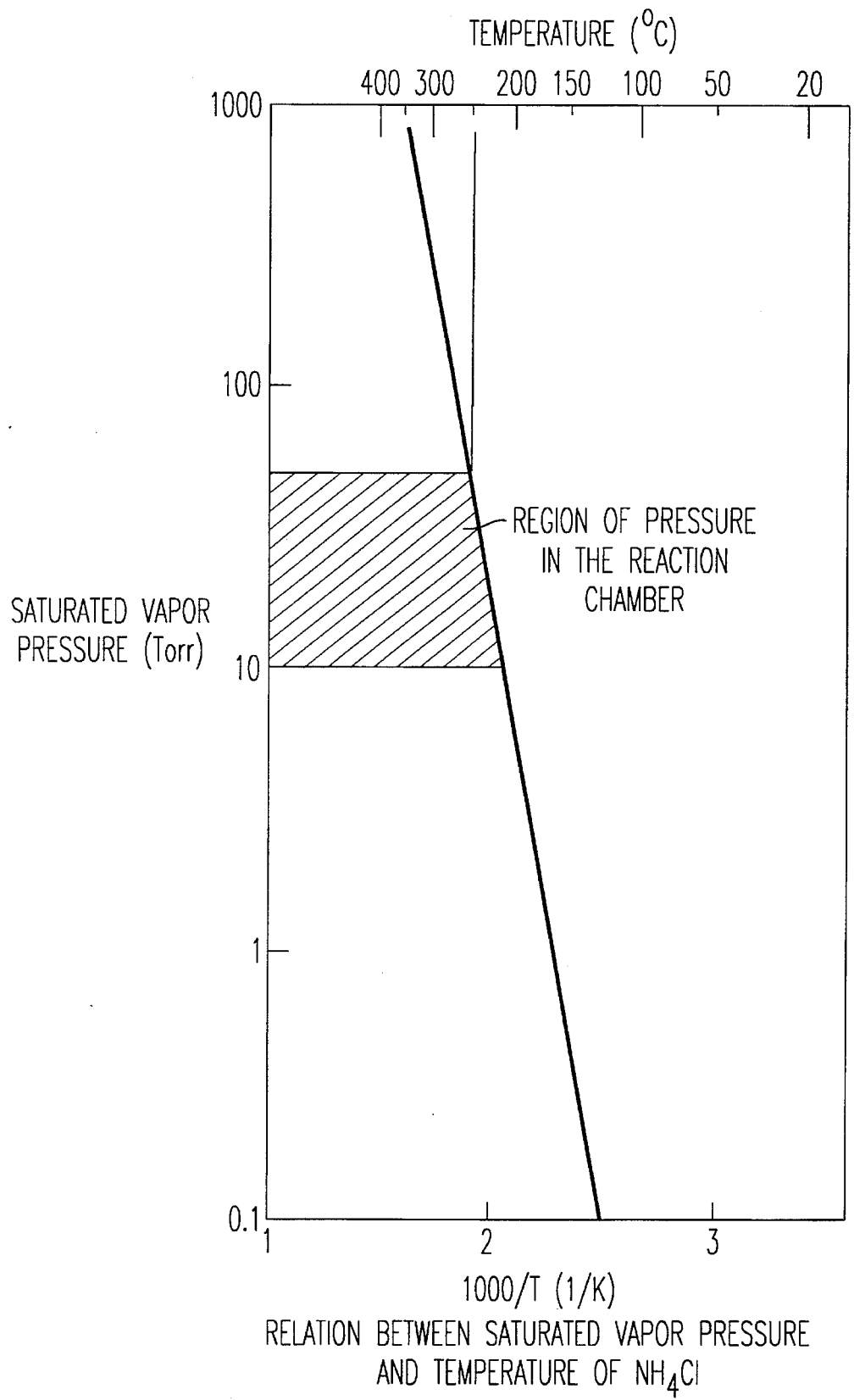
FIG. 58 is a diagram showing saturated vapor pressure of ammonium chloride ($NH_4Cl$).

That is, as seen from the above-described FIG. 58 which is a saturated vapor pressure diagram, ammonium chloride exists in the form of gas only with pressure of about $1\times10^{-4}$ Torr at a low temperature of about 20° C. Namely, it can not exist in the form of gas with the reaction chamber pressure 1–100 Torr generally used in the single wafer processing system and solidifies in the mixing chamber 503. Most of the Si—N—H compounds, however, exist in the form of gas under these conditions to be transferred into the reaction chamber 2.

Figure 42:
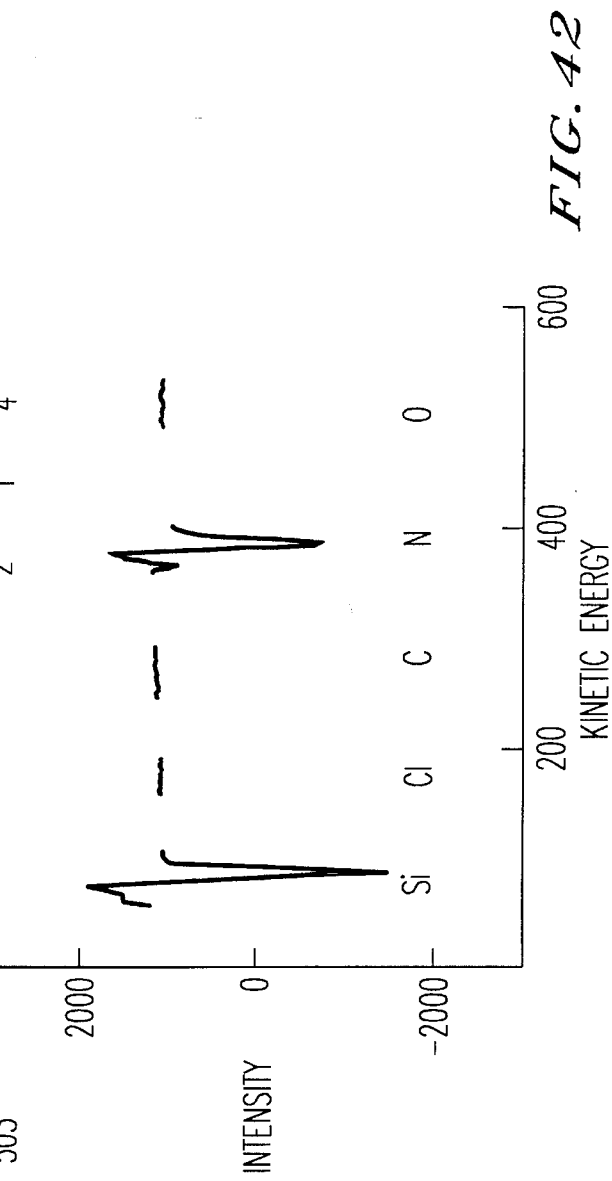
FIG. 42 is a diagram showing results of composition analysis of a silicon nitride film formed by the thirty-fourth preferred embodiment according to the present invention.
Figure 43:
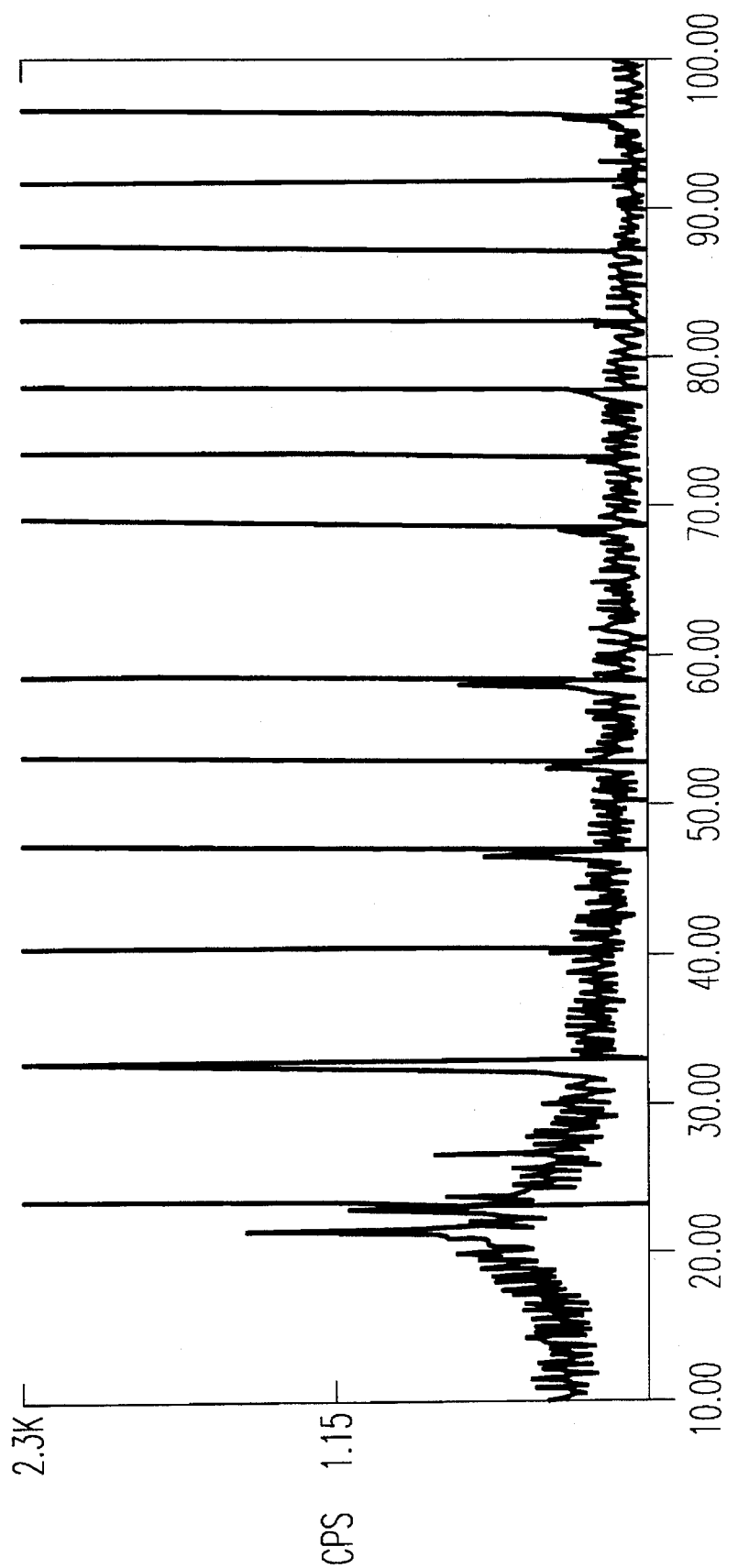
FIG. 43 is a diagram showing results of x-ray diffraction of a solid substance deposited in a mixing chamber when forming a silicon nitride film by the thirty-fourth preferred embodiment according to the present invention.

FIG. 42 shows the results of analysis according to the Auger electron spectroscopy analysis method for composition of a SiN film produced under the reaction space pressure of 30 Torr by the above-described method. As can be seen from FIG. 42, an excellent SiN film with high quality which contains no impurity such as chlorine was formed. The result of evaluation of refractive index of this film by the ellipsometry was 1.98, which is similar to a $Si_3N_4$ film with stoichiometric composition. FIG. 43 shows the results of X-ray diffraction of white solid which is deposited in the mixing chamber 503, where it is recognized that the larger part was ammonium chloride ($NH_4Cl$).

The Si—N—H compounds produced here are simple substances or mixture of $SiNH_5$, $SiN_2H_6$, $SiN_3H_7$, and $SiN_4H_8$, where these products can be separately produced and stored to be used as materials. If the purification is not enough, $SiNH_4Cl$, $SiNH_6Cl$, $SiN_2H_7Cl_2$ and the like may be contained, for example.

Thirty-Fifth Preferred Embodiment

In the nitride film forming method of this preferred embodiment, thin films are formed with the temperature in the mixing chamber 503 being maintained at a predetermined temperature ranging from 30° to 180° C., e.g., about 100° C. (T1) in the method of the thirty-fourth preferred embodiment using the apparatus shown in FIG. 41. In this method, stable Si—N—H compounds in the form of gas are produced in the mixing chamber 503 to improve the film thickness reproducibility of the formed films.

Figure 44:
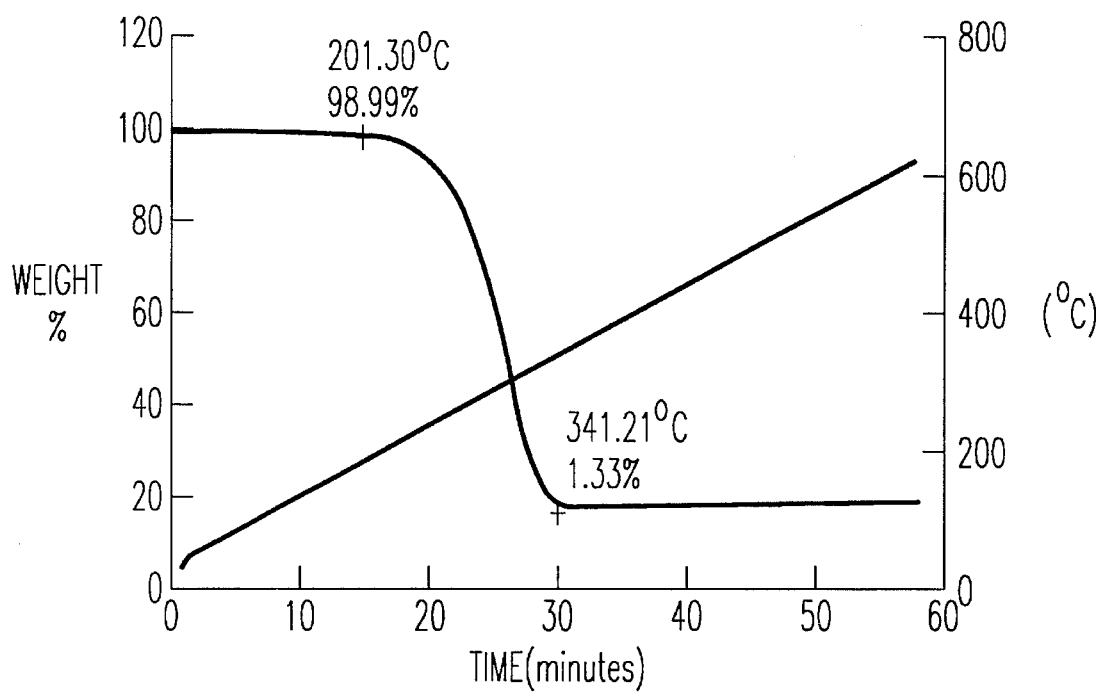
FIGS. 44–45 are diagrams showing results of thermogravimetric analysis of the solid substance deposited in the mixing chamber when forming a silicon nitride film by the thirty-fourth preferred embodiment according to the present invention.
Figure 45:
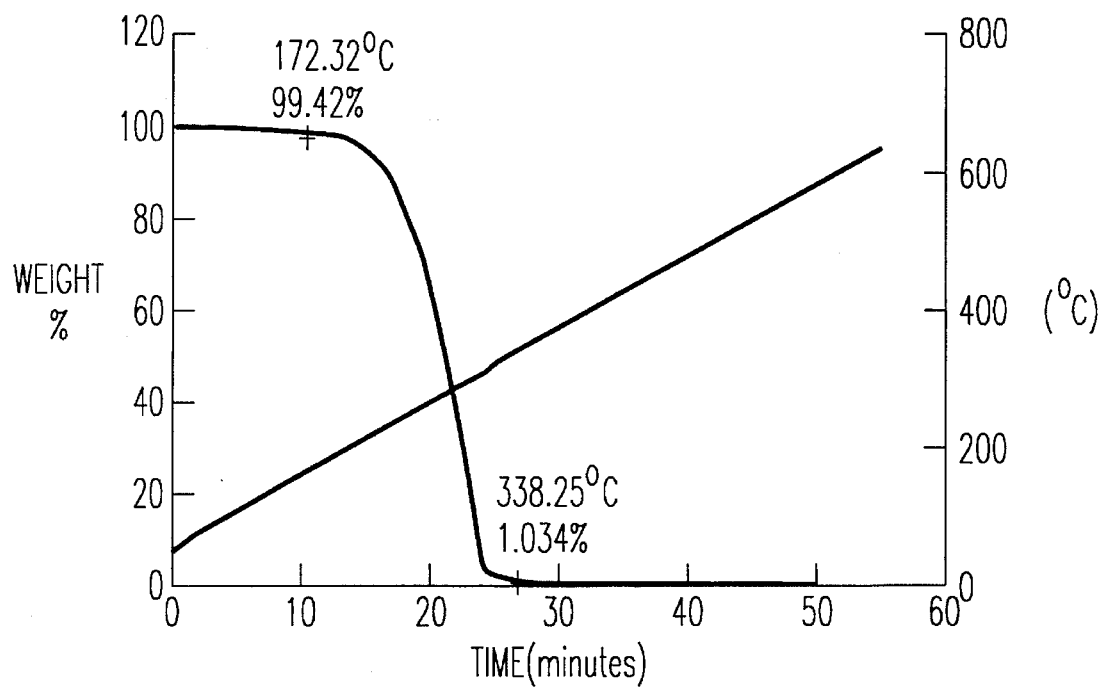

As can be seen from the results of thermogravimetric analysis shown in FIG. 44, in the white solid produced in the mixing chamber 503 by the method of the thirty-fourth embodiment, there exists about 20% of solid which does not evaporate even when heated to 300° C. Inspection by the infrared spectroscopy analysis showed that the remaining solid was Si compound. However, as can be seen from the measuring results of thermogravimetric analysis shown in FIG. 45, the white solid produced in the mixing chamber 503 in the method according to this preferred embodiment all became gas when heated to 300° C. and no solid remained.

That is to say, if it is mixed while being heated gradually, the reaction of $SiH_2Cl_2$ and $NH_3$ is facilitated and stable Si—N—H compound in the form of gas is produced. The characteristics of the SiN film formed under these conditions were the same as those in the thirty-fourth preferred embodiment. However, while the film thickness reproducibility of the films formed in the thirty-fourth preferred embodiment was not so good, it could be suppressed to variation of ±1% or lower in this preferred embodiment.

Thirty-Sixth Preferred Embodiment

If the temperature in the mixing chamber 503 is increased as in the thirty-fifth preferred embodiment, the pressure of $NH_4Cl$ which can exist in the form of gas increases and a larger amount of $NH_4Cl$ flows into the reaction chamber in the form of $NH_3+HCl$ as compared to that at the temperature of 20° C. in the mixing chamber to cause attachment of $NH_4Cl$ on the reaction chamber wall. Accordingly, in this preferred embodiment, while the temperature of the wall in the reaction chamber is held at the above-mentioned temperature T1 using the heater 508 in the apparatus shown in FIG. 41, the processing is done with the temperature of the inner wall of a rear stage trap 9 provided on the exhaust side of the reaction chamber 2 being held at 30° C. or lower using a water cooling mechanism 509.

Then, the $NH_4Cl$ flowed from the mixing chamber 503 is transferred to the rear stage trap 9 without solidifying in the reaction chamber 2, and solidifies in this rear stage trap 9. That is to say, since adhesion of $NH_4Cl$ in the reaction chamber 2 can be prevented almost perfectly with the temperature in the mixing chamber 503 being increased to some extent, it has an effect of improvement of the reproducibility of film thickness, and also an effect that $NH_4Cl$ is prevented from scattering on the wafers to undesirably affect the film quality even if films are continuously formed on the wafers. Now, since the temperature T1 is not higher than 180° C., this heating allows use of the o-ring member as a vacuum seal as in the conventional cases, and also the reaction chamber 2 dose not have to be made of expensive material which may not suffer corrosion with chlorine.

Thirty-Seventh Preferred Embodiment

In the thirty-fourth preferred embodiment if the processing pressure P2 in the reaction chamber 2 is relatively low, e.g., 3 Torr, holding the pressure in the mixing chamber 503 at the similar pressure in the reaction chamber 2 decreases possibility of collision of gases in the mixing chamber 503, where Si—N—H compounds can not be produced satisfactorily. Therefore, in this preferred embodiment, the pressure adjusting valve 511 in the apparatus shown in FIG. 41 is operated in the method of the thirty-fourth preferred embodiment, and thin film forming process is performed holding the pressure P1 in the mixing chamber 503 at 20 Torr or higher, e.g., 30 Torr.

In this method, even if the processing pressure P2 in the reaction chamber 2 is low, a large amount of gas collision can be caused in the mixing chamber 503 to produce Si—N—H compounds satisfactorily. Accordingly, even with relatively low pressure in the reaction chamber, SiN films with stable thickness and the like can be formed.

Thirty-Eighth Preferred Embodiment

In the thirty-fourth preferred embodiment, the Si—Cl bonding must be removed enough in order to improve purity of produced SiN films, for example. Also in order to improve the coverage of produced films for stereoscopic shape, film formation precursor which is very reactive and adhesive must be removed.

Figure 46:
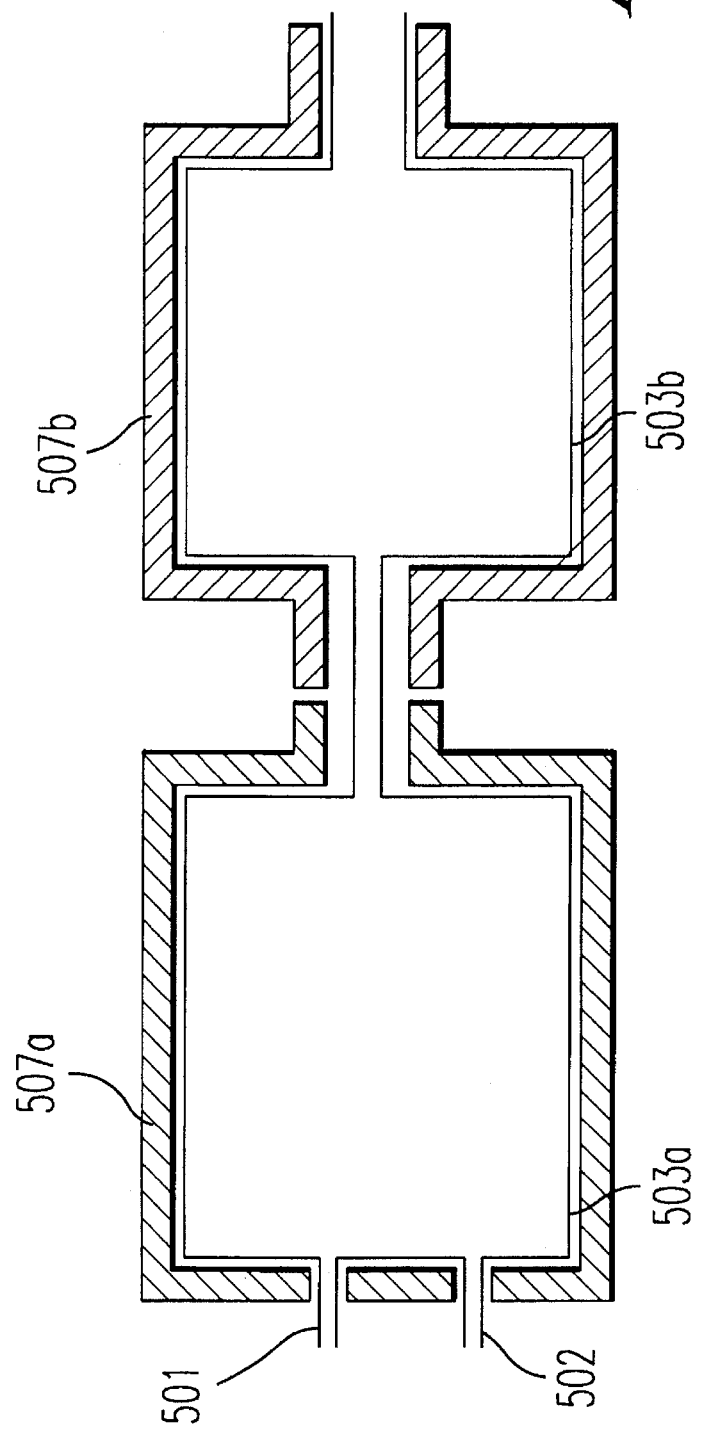
FIG. 46 is a sectional view showing a thirty-eighth preferred embodiment according to the present invention.

Accordingly, in this preferred embodiment, as shown in FIG. 46, the mixing chamber in the apparatus of FIG. 41 now has two chambers, a high temperature chamber 503a and a low temperature chamber 503b, where the temperature in the high temperature chamber 503a is set to 200° C. or higher by a high temperature mixture chamber heater 507a and the temperature in the low temperature chamber 503b is set to temperature of 180° C. or lower with a low temperature heater 507b in processings.

This causes the reaction gas and ammonia to be mixed enough in the high temperature chamber 503a and rapidly react, and Si—N—H compounds almost close to 100% is produced. On the other hand, in the low temperature chamber 503b, the slightly remaining very reactive substances and the like are removed in a trap manner. Accordingly, thin films with extremely high purity which is very adhesive can be produced by the reaction in the reaction chamber 2, and also the effects in the thirty-fourth and thirty-fifth preferred embodiments described above are maintained.

Figure 47:
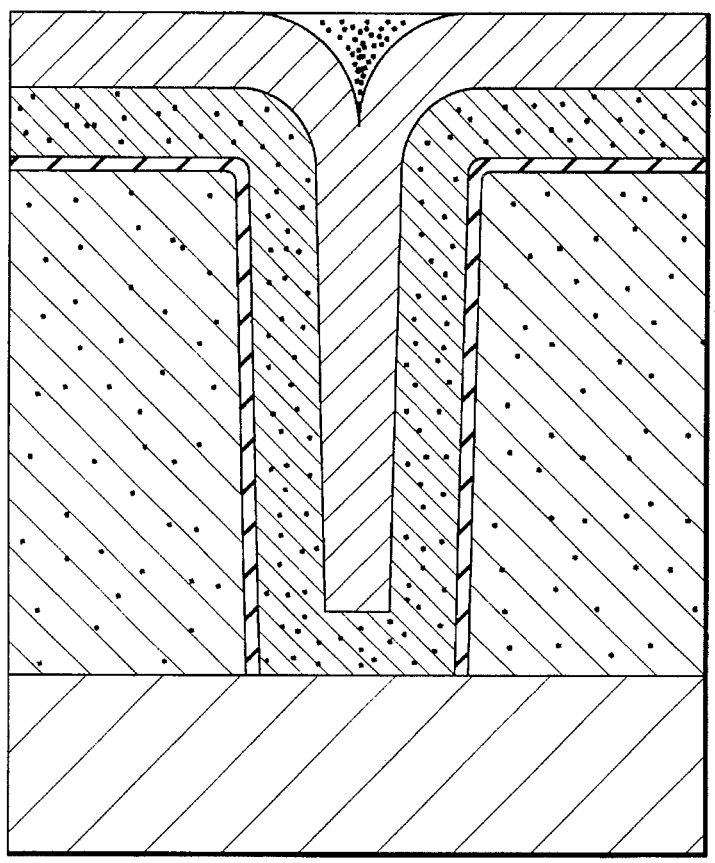
FIG. 47 is a diagram showing the thirty-eighth preferred embodiment according to the present invention.

FIG. 47 is a diagram drawn on the basis of a sectional picture showing results of the SiN film deposition to a fine hole of a SiN film produced with temperature in the high temperature chamber 503a at 250° C., temperature in the low temperature chamber 503b at 150° C., and pressure of the reaction chamber at 3 Torr. Deposition amount of 97% or more on the surface can be secured at the bottom of the fine hole. Also, inspection of impurity in this film showed that no chlorine (Cl) and the like are contained even using extremely sensitive SIMS (Secondary Ion Mass Spectrometry) analysis.

Thirty-Ninth Preferred Embodiment

Figure 48:
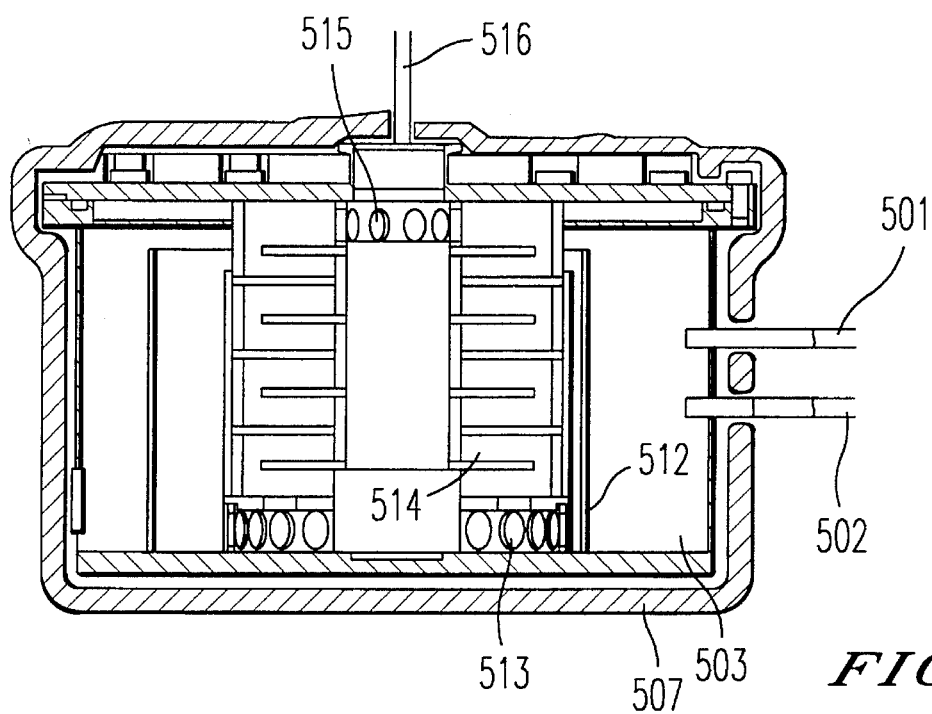
FIG. 48 is a structural view showing a thirty-ninth preferred embodiment according to the present invention.

FIG. 48 is a structural view showing one example of inner structure of the mixing chamber 503 used in the thirty-fourth to thirty-seventh preferred embodiments. In FIG. 48, 512 denotes an impact plate with large interval, 513 and 515 denote an porous plate, 514 denotes a trap portion and 516 denotes a gas jetting hole.

In this mixing chamber, the reaction gas introduced from the reaction gas supply tubes 501 and 502 diffuses while impacting against the impact plate 512 at large intervals and comes into the trap portion 514 having a large number of crowded impact plates through the porous plate 513. In the trap portion 514, the gas hits against the impact plate 512 in a zigzag manner, in which ammonium chloride solidifies, goes to the porous plate 515, arrives at the gas jetting hole 516 with ammonium chloride removed, and is transferred to the reaction chamber 2. The temperature of the mixing chamber 503 is controlled by a mantle heater 507 (a heater for heating mixing chamber) heating from an outer periphery.

Fortieth Preferred Embodiment

Figure 49:
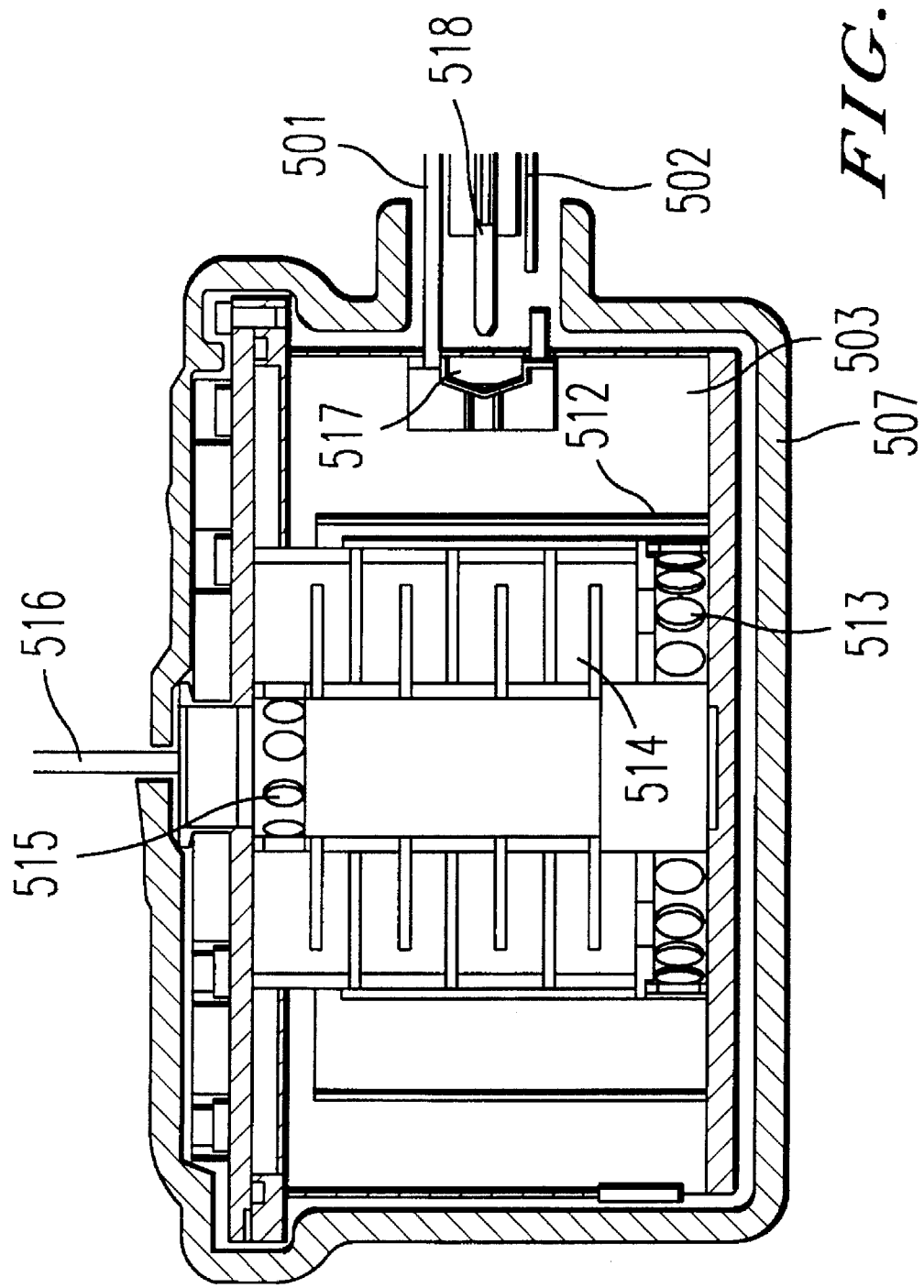
FIG. 49 is a structural diagram showing a fortieth preferred embodiment according to the present invention.

FIG. 49 is a structural diagram showing one example of inner structure of the mixing chamber 503 used in the thirty-eighth preferred embodiment. The gas introducing portion differs from the mixing chamber shown in FIG. 48. That is, in FIG. 49, 517 denotes a mixing portion (a chamber constituting a mixing chamber) provided in the gas introducing portion and 518 denotes a heater for heating the mixing portion.

In this mixing chamber, reaction gas introduced from the reaction gas supply tubes 501 and 502 are first mixed enough in the mixing portion 517. At this time, the mixing portion 517 can be heated to 200° C. or higher by the heater 518 independently of the mixing chamber heater 507, so that the effects described in the thirty-eighth preferred embodiment can also be produced.

Forty-First Preferred Embodiment

Figure 50:
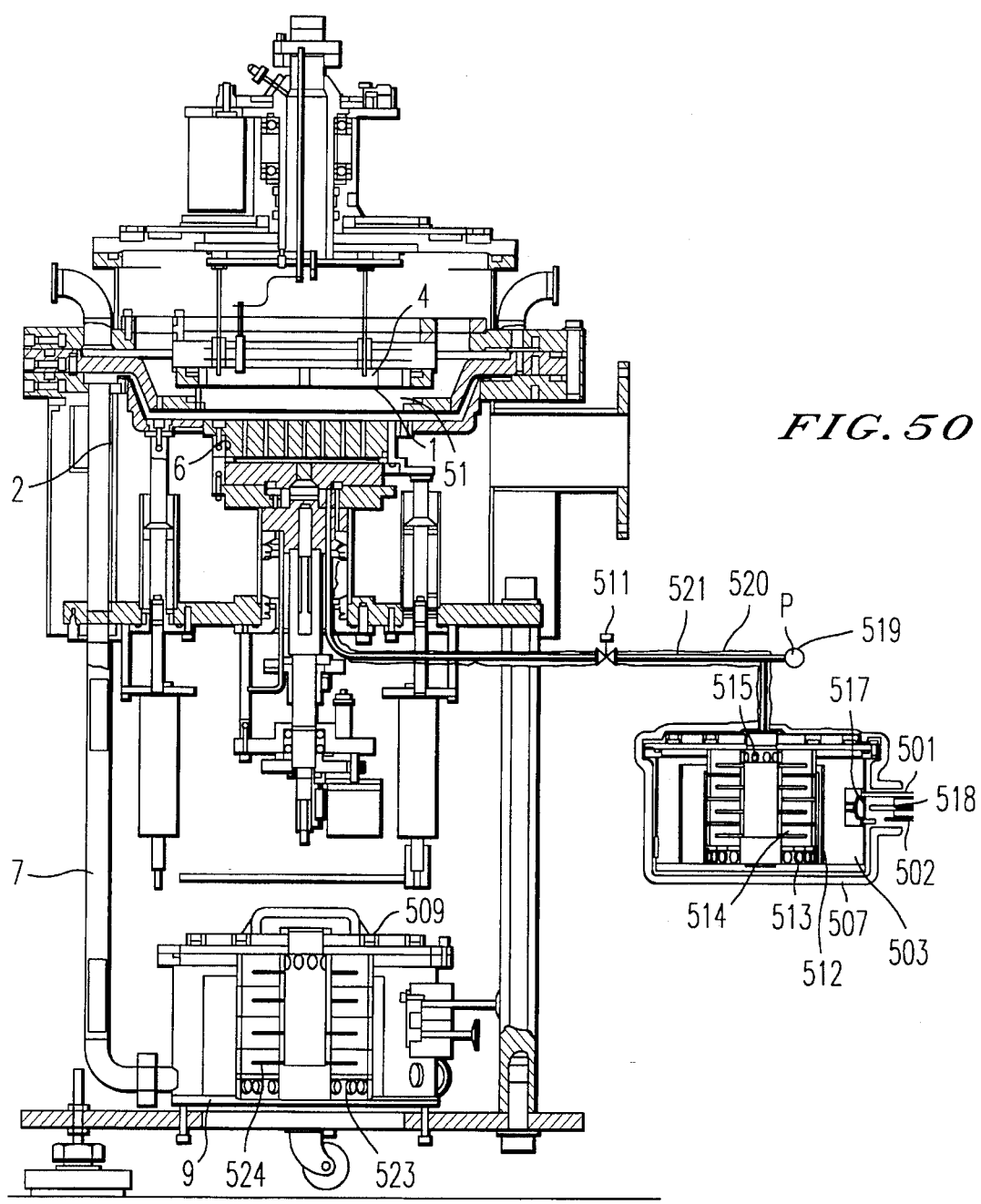
FIG. 50 is a diagram showing a forty-first preferred embodiment according to the present invention.

FIG. 50 shows one example of the inner structure of the entirety with respect to the system shown in the thirty-fourth to fortieth preferred embodiments. In FIG. 50, 503 denotes the mixing chamber shown in FIG. 49 described in the fortieth preferred embodiment, 521 denotes a transfer piping connecting the gas jetting hole of the mixing chamber 503 to the gas nozzle 6, 519 denotes a mixing chamber pressure gage for measuring pressure in the mixing chamber 503, and 520 denotes a piping heater for heating the transfer piping 521. 523 denotes a cooled porous plate, and 524 denotes a cooled impact plate.

In this apparatus, pressure in the mixing chamber 503 can be controlled to a desirable value independently of the reaction chamber 2 using the pressure adjusting valve 511 and the pressure gage 519. Also, the transfer piping 521 can be controlled to a temperature higher by several degrees or more than the mixing chamber 503 using the piping heater 520 so that ammonium chloride dose not deposit.

Then, the transferred gas is sprayed uniformly to the wafer 1 located on the susceptor 52 heated by the wafer heating source 4 through the gas nozzle 6 to deposit a nitride film. The gas after the reaction and the gas which did not react come into the rear stage trap 9 through the reaction gas exhaust path 7. In the rear stage trap 9, the gas is passed through the cooled porous plate 523 cooled by the water cooling mechanism and the cooled impact plate 524 to solidify and remove remaining ammonium chloride. This trap mechanism is the same as the trap for ammonium chloride shown in FIG. 48, but since the cooled porous plate 523 and the cooled impact plate 524 held at low temperature not higher than 30° C. by means of water cooling are used, the exhaust gas which has passed through the rear stage trap 9 contains almost no ammonium chloride as seen from FIG. 58. Although the structure shown in FIG. 49 is used for the mixing chamber 503, the structure shown in FIG. 48 can also be used.

Forty-Second Preferred Embodiment

In the thirty-fourth to fortieth preferred embodiments, SiN film formation using dichlorosilane ($SiH_2Cl_2$) and ammonia ($NH_3$) has been described. However, in this preferred embodiment, titanium tetrachloride ($TiCl_4$) and ammonia ($NH_3$) are used as reaction gases to form titanium nitride (TiN) film.

Also in this case, excellent titanium nitride (TiN) films can be formed by the method according to the thirty-fourth to fortieth preferred embodiments described above. However, it is different form the SiN film starting from $SiH_2Cl_2$ in that $TiCl_4$ contains no hydrogen (H), so that hydrogen gas must be newly added as hydrogen (H) donor to form stable Ti—N—H compounds.

Forty-Third Preferred Embodiment

Figure 51:
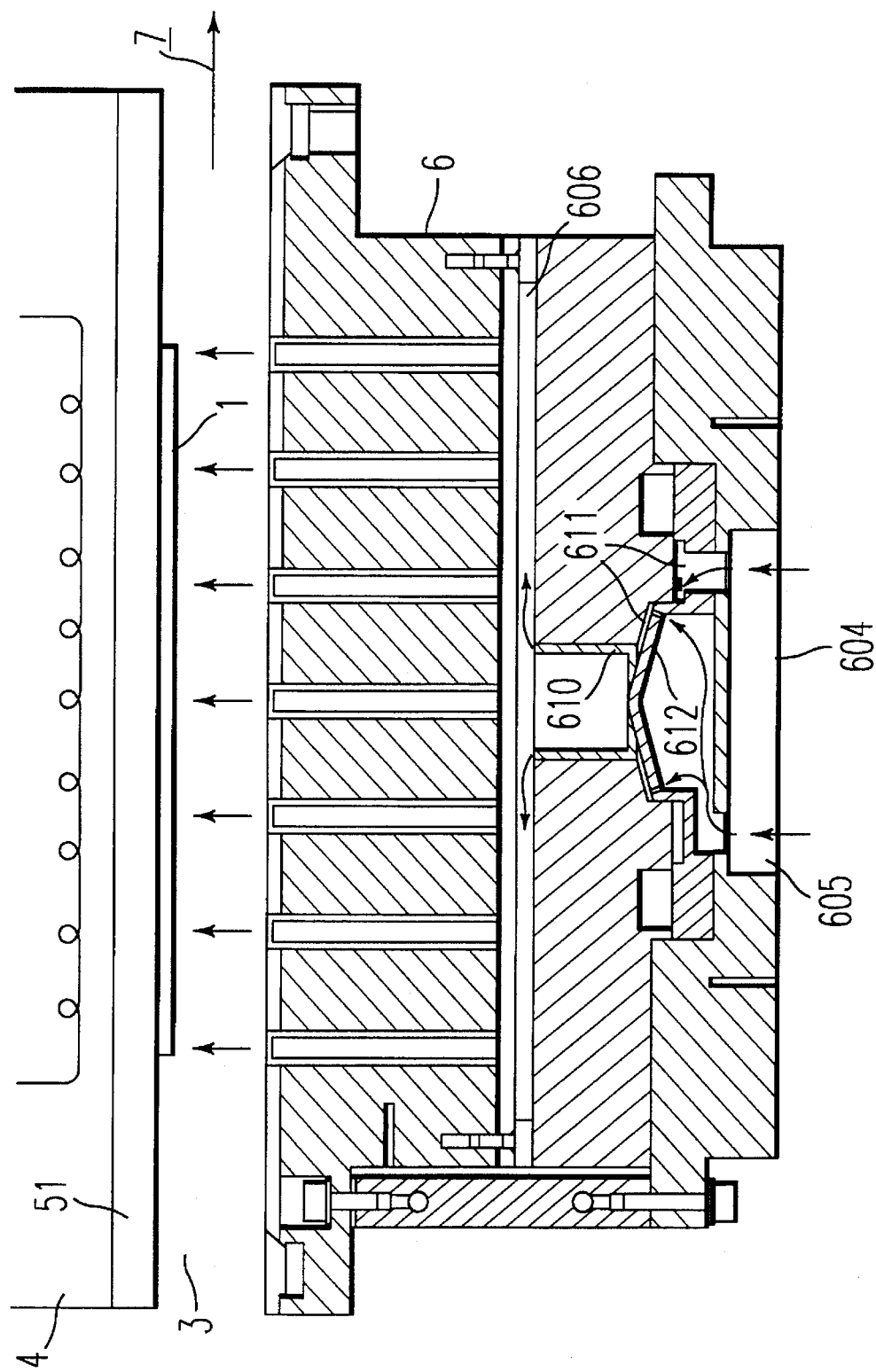
FIG. 51 is a sectional view showing a forty-third preferred embodiment according to the present invention.
Figure 52:
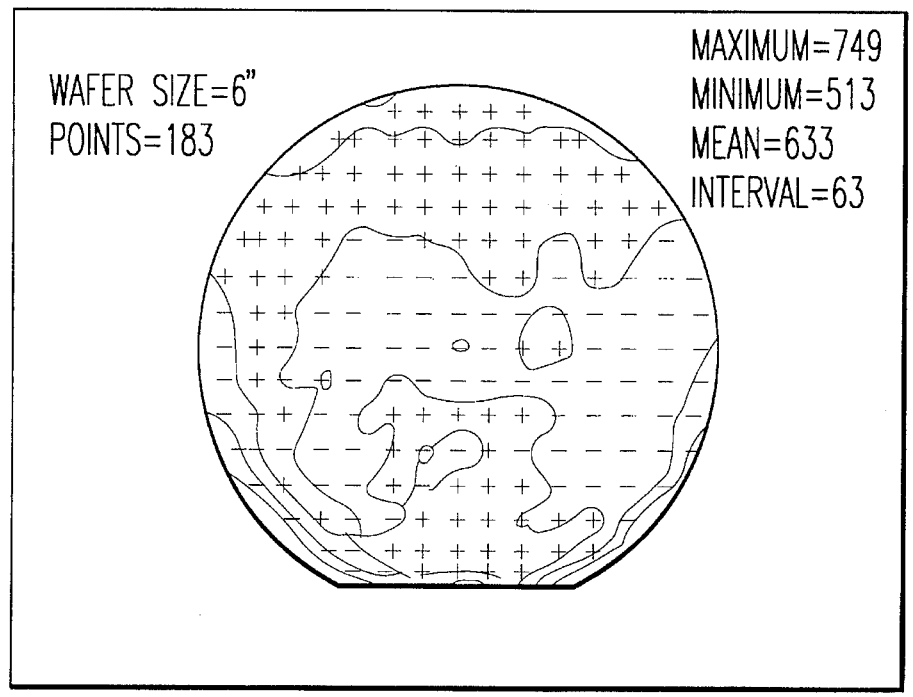
FIG. 52 is a diagram showing the fourth-third preferred embodiment according to the present invention.

FIG. 51 is a sectional view for illustrating structure of a gas nozzle 6 in this preferred embodiment, and FIG. 52 shows distribution of film thickness of a thin film formed using the gas nozzle 6 shown in FIG. 51. In FIG. 51, 52 denotes a susceptor, 604 denotes a first reaction gas flow inlet, 605 denotes a second reaction gas flow inlet, 606 denotes a mixture gas transfer path, 610 denotes a twist-like reaction gas mixing portion, 611 denotes a first reaction gas flow path having enlarged and narrow portions with reduced thickness and 612 denotes a second reaction gas spray hole.

In the single wafer processing low pressure CVD apparatus for forming silicon nitride film formed as described above, $NH_3$ gas diluted with $N_2$ gas is used as the first reaction gas, for example, and flow rates such as 40 sccm, 550 sccm are respectively supplied, for example. The first reaction gas is introduced into the first reaction gas flow path 611.

As the second reaction gas, $SiH_2Cl_2$ gas is used, where a flow rate (e.g., 10 sccm) smaller than that of the first reaction gas is supplied. The second reaction gas is supplied to the first reaction gas path 611 through the second reaction gas spray hole 612 to be mixed with the first reaction gas. The mixed reaction gas is introduced to the twist-like reaction gas mixing portion 610 to be further mixed, and then supplied toward the wafer 1 in the spray manner through the mixture gas transfer path 606 and the gas nozzle 6. The wafer 1 is provided on the susceptor 51 heated to about 700° C. by the wafer heating source 4, and decomposition reaction is caused in the supplied gas on the wafer 1, and then the gas is discharged from the reaction gas exhaust path 7 to be processed.

According to the apparatus, a shearing force can be exerted by rapidly changing flow vector and liner flow velocity of reaction gases to produce turbulence to facilitate mixing of reaction gases, and the flow path can be accommodated in a compact container. This can realize satisfactory mixing of a plurality of reaction gases in a small space prior to the gas nozzle 6 to form a thin film having uniform thickness distribution.

Figure 64:
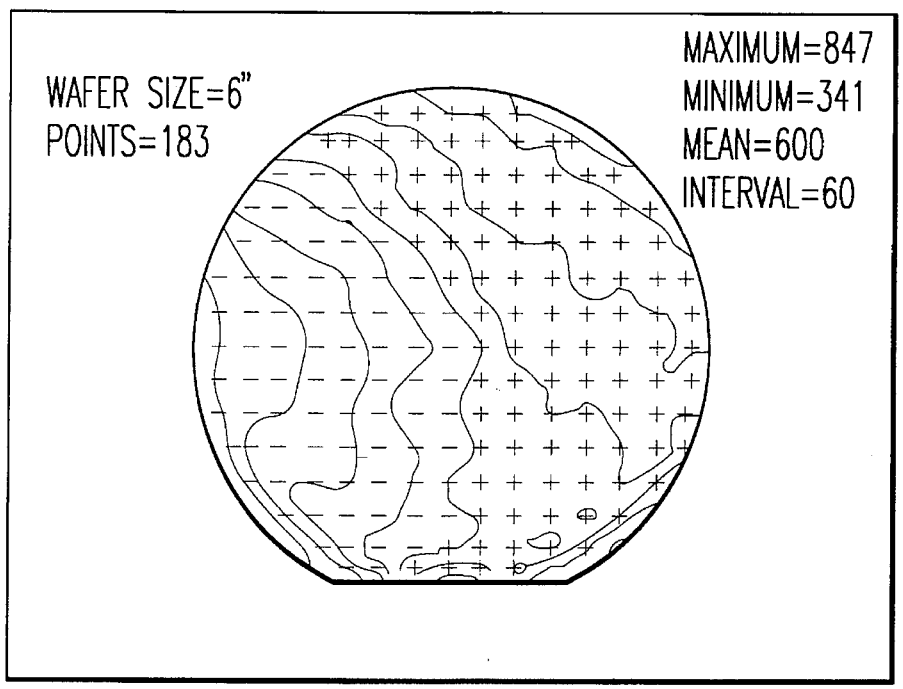
FIG. 64 is a diagram showing another prior art.

FIG. 52 shows film thickness distribution in a surface of a 6-inch wafer formed with the above-described apparatus with the reaction pressure of 30 Torr. It can be recognized that it has been improved as compared to that shown in FIG. 64 which shows film thickness distribution at the time of forming a film with the conventional nozzle.

Although the mixing portion includes the nozzle system having the first reaction gas flow path 611 with enlarged and narrow parts and the spray hole for second reaction gas 612 in the direction perpendicular thereto, and the nozzle system having the twist-like reaction gas mixing portion 610 in this preferred embodiment, only one of them can be used. Also these nozzle systems are provided facing the wafer 1 together with the gas nozzle 6, but they can be provided in parallel with the wafer 1 and reaction gas can be flowed toward the wafer 1 in the transverse direction.

It is preferable to heat the nozzle system described above to a temperature in the range of 100° C.–600° C. so that by-product $NH_4Cl$ dose not solidify in the nozzle system and the main reaction product SiN is not produced in the nozzle system.

Forty-Fourth Preferred Embodiment

Figure 53:
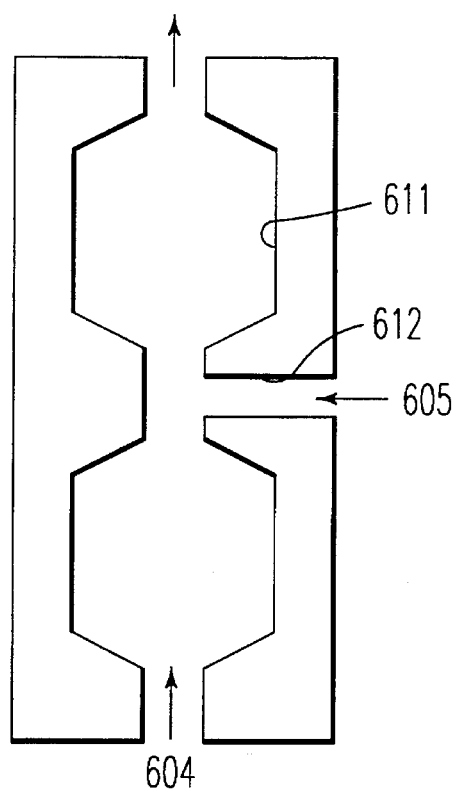
FIG. 53 is a diagram showing a fourth—fourth preferred embodiment according to the present invention.
Figure 54:
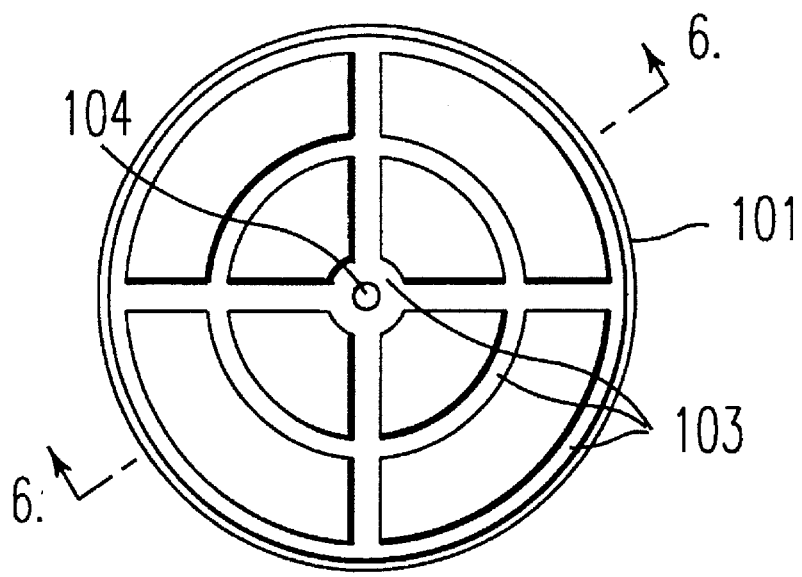
FIG. 54 is a top view of a prior art.
Figure 55:
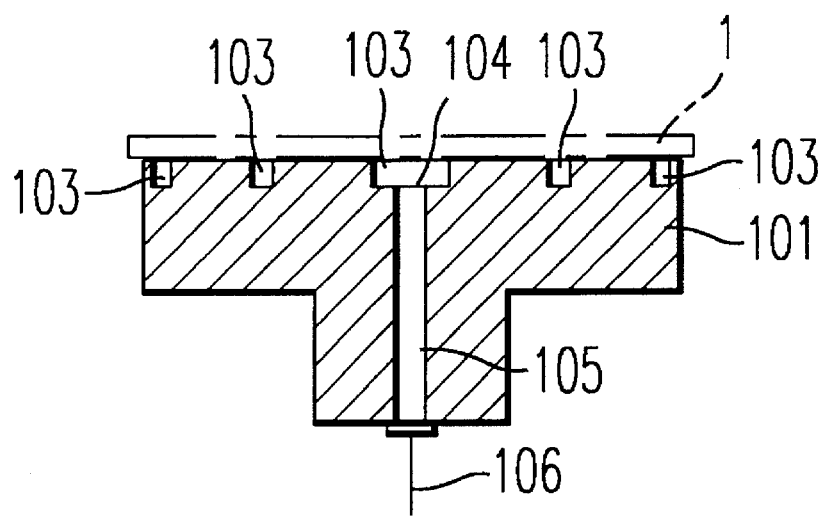
FIG. 55 is a bottom view of the prior art.
Figure 56:
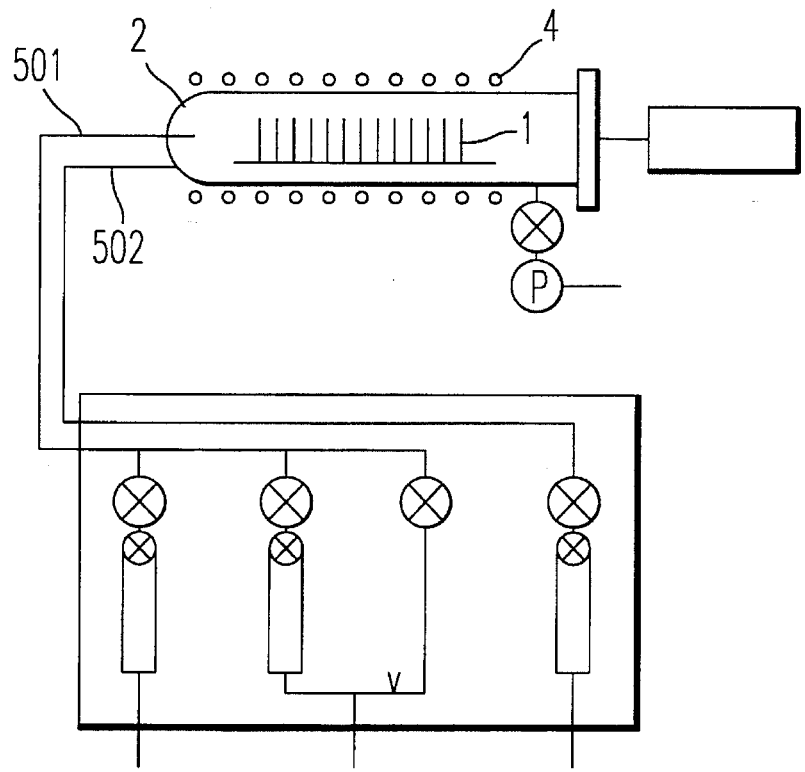
FIG. 56 is a diagram showing another prior art.
Figure 57:
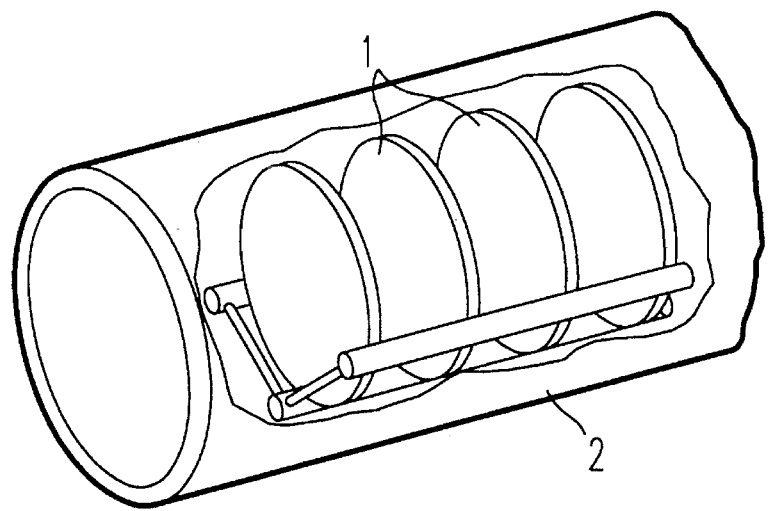
FIG. 57 is a diagram showing another prior art.

In this preferred embodiment, the nozzle having the structure shown in FIG. 53 is used as the nozzle system including the first reaction gas flow path 611 having the enlarged and narrow parts and the spray hole 612 for the second reaction gas in the direction intersecting therewith. The same function and effects are also realized as the above-described preferred embodiment 43 in this case.

While the invention has been shown and described in detail, the foregoing description is in all aspects illustrative and not restrictive. It is therefore understood that numerous modifications and variations can be devised without departing from the scope of the invention.

We claim:

1. A vacuum chucking device in a semiconductor producing apparatus, comprising:

a vacuum chuck main body having a major surface for supporting a semiconductor;

separated grooves formed in the major surface of said vacuum chuck main body;

vacuum evacuation holes spaced in an area of each of the separated grooves of the vacuum chuck main body and leading to the separate grooves;

a vacuum means connected to the vacuum evacuation holes for providing a vacuum to said each of the separated grooves when the semiconductor is to be supported by the vacuum chuck main body; and wherein, said vacuum means provides said vacuum in said each of the separated grooves at all times when the semiconductor is to be supported and each of at least two of said separated grooves is independently exhausted by a respective separated pump.

2. The vacuum chucking device in the semiconductor producing apparatus according to claim 1, wherein, said grooves are circular shaped and form concentric circles.

3. A vacuum chucking device in a semiconductor producing apparatus comprising:

a vacuum chuck having a vacuum evacuation hole and a gas nozzle having a hole;

wherein the vacuum evacuation hole of said vacuum chuck is provided corresponding to said hole of said gas nozzle provided facing said vacuum chuck.

4. A vacuum chucking device in a semiconductor producing apparatus, comprising inner and outer grooves for wafer vacuum suction provided on a surface on which a semiconductor wafer is sucked and fixed, wherein, an exhaust resistance of said outer groove is larger than an exhaust resistance of said inner groove.

5. A vacuum chucking device in a semiconductor producing apparatus, comprising:

grooves including an outer groove and an inner groove;

wherein, said outer groove for wafer outer portion vacuum suction and said inner groove for wafer inner portion vacuum suction are provided on a surface on which a semiconductor wafer is sucked and fixed;

a first vacuum evacuation path having a first set of dimensions for vacuum exhausting said outer groove;

a second vacuum evacuation path having a second set of dimensions for vacuum exhausting said inner groove;

a piping for exhausting said first and second vacuum evacuation paths; and an exhaust resistance determined by said second set of dimensions being different from an exhaust resistance determined by said first set of dimensions.

6. A vacuum chucking device in a semiconductor producing apparatus, comprising:

grooves for wafer vacuum suction provided on a surface of the vacuum chucking device on which a semiconductor wafer is sucked and fixed; and wherein, a different and constant magnitude of exhaust resistance is generated in at least two of said grooves when the semiconductor wafer is to be sucked.

7. A vacuum chucking device in a semiconductor device according to claim 6, wherein said grooves for said wafer vacuum suction have a hexagonal shape and are arranged in a honey-comb form.

8. The vacuum chucking device in the semiconductor producing apparatus according to any of claims 6, 4, 5 or 7, wherein each of said grooves are independently exhausted by a separated pump.

9. The vacuum chucking device in the semiconductor producing apparatus according to any of claims 4, 5, 6 or 7, wherein each of said grooves are exhausted in common by a single pump.

* * * * *